US012254316B2

(12) United States Patent
Langhammer et al.

(10) Patent No.: US 12,254,316 B2
(45) Date of Patent: Mar. 18, 2025

(54) VECTOR PROCESSOR ARCHITECTURES

(71) Applicant: Intel Corporation, Santa Clara, CA (US)

(72) Inventors: Martin Langhammer, Alderbury (GB); Eriko Nurvitadhi, Hillsboro, OR (US); Gregg William Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 476 days.

(21) Appl. No.: 17/214,646

(22) Filed: Mar. 26, 2021

(65) Prior Publication Data

US 2021/0216318 A1  Jul. 15, 2021

Related U.S. Application Data

(60) Provisional application No. 63/072,095, filed on Aug. 28, 2020.

(51) Int. Cl.
| | |
|---|---|
| *G06F 9/30* | (2018.01) |
| *G06F 9/38* | (2018.01) |
| *G06F 9/445* | (2018.01) |
| *G06F 30/347* | (2020.01) |

(52) U.S. Cl.
CPC ...... *G06F 9/30036* (2013.01); *G06F 9/30038* (2023.08); *G06F 9/30098* (2013.01); *G06F 9/3887* (2013.01); *G06F 9/38873* (2023.08); *G06F 9/3888* (2023.08); *G06F 9/44505* (2013.01); *G06F 30/347* (2020.01)

(58) Field of Classification Search
CPC .................................................. G06F 9/30036
See application file for complete search history.

(56) References Cited

U.S. PATENT DOCUMENTS

| | | | |
|---|---|---|---|
| 9,384,168 B2 | 7/2016 | Mortensen | |
| 2006/0227966 A1* | 10/2006 | Knowles | ............. G06F 9/30032 |
| | | | 712/E9.034 |
| 2011/0258361 A1* | 10/2011 | Baker | ............... G06F 15/17343 |
| | | | 710/317 |
| 2012/0278591 A1* | 11/2012 | Hilker | ................. G06F 9/30109 |
| | | | 712/E9.028 |

(Continued)

OTHER PUBLICATIONS

R. M. Russell, "The CRAY-1 Computer System," Commun. ACM, vol. 21, No. 1, pp. 63-72, Jan. 1978.

(Continued)

*Primary Examiner* — Michael J Metzger
(74) *Attorney, Agent, or Firm* — Fletcher Yoder, P.C.

(57) ABSTRACT

The present disclosure relates to an integrated circuit device that includes a plurality of vector registers configurable to store a plurality of vectors and switch circuitry communicatively coupled to the plurality of vector registers. The switch circuitry is configurable to route a portion of the plurality of vectors. Additionally, the integrated circuit device includes a plurality of vector processing units communicatively coupled to the switch circuitry. The plurality of vector processing units is configurable to receive the portion of the plurality of vectors, perform one or more operations involving the portion of the plurality of vector inputs, and output a second plurality of vectors generated by performing the one or more operations.

20 Claims, 66 Drawing Sheets

(56) References Cited

U.S. PATENT DOCUMENTS

| | | | |
|---|---|---|---|
| 2017/0329741 A1* | 11/2017 | Kim | ............... G06F 1/3243 |
| 2018/0329868 A1 | 11/2018 | Chen et al. | |
| 2018/0341483 A1 | 11/2018 | Fowers et al. | |
| 2019/0318225 A1 | 10/2019 | Heinecke et al. | |
| 2019/0369994 A1 | 12/2019 | Afshar et al. | |
| 2019/0384606 A1* | 12/2019 | Panda | ............... G06F 8/4441 |
| 2021/0216318 A1 | 7/2021 | Langhammer et al. | |

OTHER PUBLICATIONS

N. Stephens, et al., "The ARM Scalable Vector Extension," MICRO, 2017.

T. Yoshida, "Fujitsu High Performance CPU for the Post-K computer," in Hot Chips: A Symposium on High Performance Chips, ser. HC30, Cupertino, CA, USA, Aug. 2018.

M. Cavalcante, et al., "Ara: A 1 GHz+ Scalable and Energy-Efficient RISC-V Vector Processor with Multi-Precision Floating Point Support in 22 nm FD-SOI," IEEE Transaction on VLSI, 2020.

K. Asanović, "Vector Microprocessors," PhD Thesis, UC Berkeley, 1998.

P. Yiannacouras, et al., "VESPA: Portable, Scalable, and Flexible FPGA-Based Vector Processors," CASES 2008.

International Search Report and Written Opinion dated Dec. 1, 2021 for PCT application No. PCT/US2021/047028, filed Aug. 20, 2021.

* cited by examiner $$120 \rightarrow \quad y = \frac{x - E[x]}{\sqrt{Var[x] + \epsilon}} * \gamma + \beta$$

$$122 \rightarrow \quad \text{Softmax}(x_i) = \frac{\exp(x_i)}{\sum_j \exp(x_j)}$$

FIG. 12

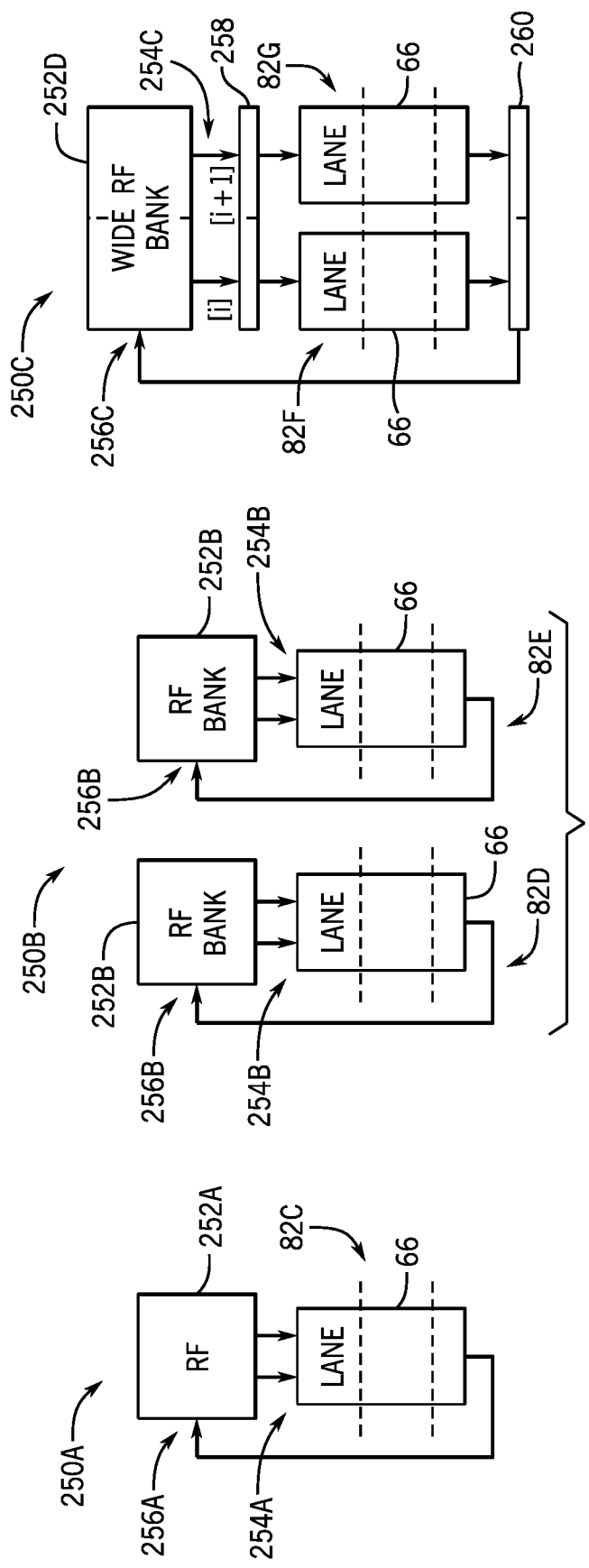

VECTOR IMMEDIATE CONDITIONAL

FLAG CONDITIONAL

```
//CONDITIONAL VECTOR MULTIPLY
FOR (idx=0; idx<32; idx++)
    IF (V1[idx]!=0)
        V4[IDX]=V3[idx] * V2[idx];
```
280

```
Ld_imm   VL, 32            # VECTOR LENGTH=32
Vec_ld   V1, a1            # LOAD V1 VECTOR (A1 IS ITS ADDR).
vecnez   F0, V1            # GENERATE FLAG. (V1[i]!=0)
Vec_ld   V2, a2, F0        # CONDITIONAL V2 VECTOR LOAD
Vec_ld   V3, a3, F0        # CONDITIONAL V3 VECTOR LOAD
vecmul   V4, V2, V3, F0    # CONDITIONAL VECTOR MULTIPLY
Vec_st   V4, a4, F0        # CONDITIONAL V4 VECTOR STORE
```
282

VECTOR PROCESSOR ARCHITECTURES

CROSS-REFERENCE TO RELATED APPLICATIONS

This application claims priority to U.S. Application No. 63/072,095, filed Aug. 28, 2020, entitled "Vector Processor Architectures," which is incorporated by reference in its entirety for all purposes.

BACKGROUND

This disclosure generally relates to integrated circuits, such as field-programmable gate arrays (FPGAs) that include circuitry to implement a vector processor architecture. More particularly, the present disclosure relates to processing circuitry that may implement the vector processor architecture on an integrated circuit device as well as applications that can be performed utilizing the processing circuitry.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices may be utilized for a variety of purposes or applications, such as digital signal processing and machine-learning. Indeed, machine-learning and artificial intelligence applications have become ever more prevalent. Integrated circuit devices, such as programmable logic devices, may be utilized to perform these functions, for example, using particular circuitry (e.g., processing blocks). For example, integrated circuit devices may utilize particular circuitry for artificial intelligence (AI) and/or machine-learning purposes.

BRIEF DESCRIPTION OF THE DRAWINGS

Various aspects of this disclosure may be better understood upon reading the following detailed description and upon reference to the drawings in which:

FIG. 12 illustrates a batch normalization function and a softmax operation, in accordance with an embodiment;

FIG. 21 is a block diagram of a first register file organization, in accordance with an embodiment;

FIG. 22 is a block diagram of a second register file organization, in accordance with an embodiment;

FIG. 23 is a block diagram of a third register file organization, in accordance with an embodiment;

FIG. 45 illustrates a code example of a conditional execution, in accordance with an embodiment;

FIG. 59 illustrates indicating data formats using addition fields within instruction words, in accordance with an embodiment;

DETAILED DESCRIPTION OF SPECIFIC EMBODIMENTS

Figure 1:
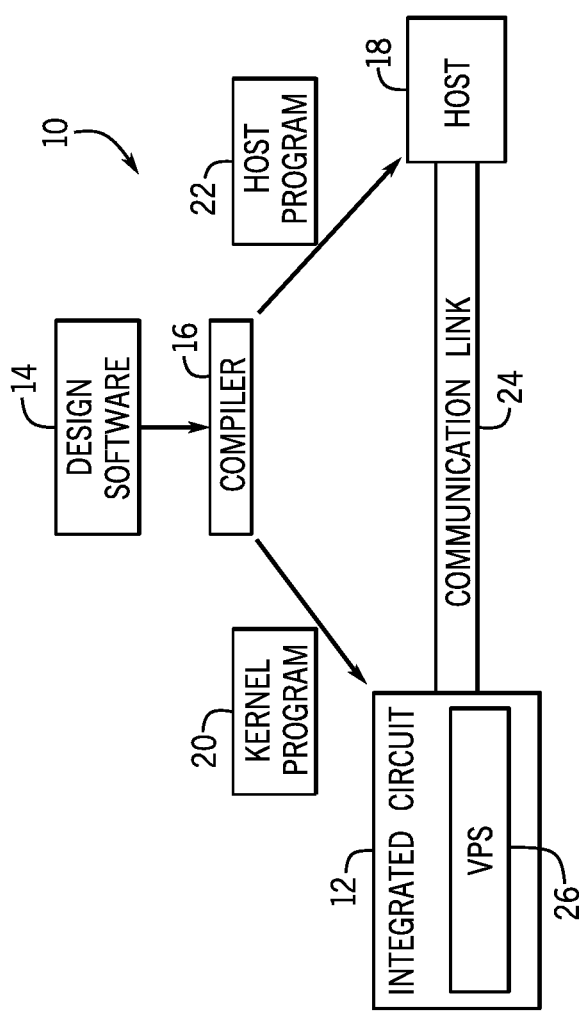
FIG. 1 is a block diagram of a system that may implement arithmetic operations using a vector processing system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

This disclosure describes vector processing systems that may be utilized in artificial intelligence and/or machine-learning applications. For instance, the vector processing systems described herein may be utilized to perform operations involving vectors and scalars such as multiplication, addition, subtraction, and division operations involving one or more vectors and/or scalars. As also described herein, vector processing systems may include vector processing units that can perform these operations.

More specifically, this disclosure discusses vector processing systems (e.g., vector processors) that can be implemented on integrated circuit devices, including programmable logic devices such as field-programmable gate arrays (FPGAs). As discussed herein, the vector processing systems may harness hard logic and soft logic of an FPGA to perform vector processing. As used herein, "hard logic" generally refers to portions of an integrated circuit device (e.g., a programmable logic device) that are not programmable by an end user, and the portions of the integrated circuit device that are programmable by the end user are considered "soft logic." For example, hard logic elements in an FPGA may include arithmetic units (e.g., digital signal processing (DSP) blocks) that are included in an FPGA and unchangeable by the end user. Vector processing units that perform operations (e.g., vector math operations) may be implemented as hard logic on an FPGA that is able to perform the specific operations at a relatively higher efficiency (e.g., compared to performing the operations using soft logic). Values to be processed, such as vectors or scalars, may be read from and stored in memory that is included in the FPGA. That is, an integrated circuit device may include memory that is a "hard" feature, meaning the memory is included on the integrated circuit device (e.g., when provided to an end user). As also discussed below, routing between the vector processing units and memory may be implemented using a combination of hard logic and soft logic. Accordingly, the techniques described below harness the flexibility of soft logic and hard features (e.g., hard logic and memory blocks) of FPGAs to provide customizable and efficient vector processing architectures capabilities.

With this in mind, FIG. 1 illustrates a block diagram of a system 10 that may implement arithmetic operations using a vector processing system (VPS) 26. A designer may desire to implement functionality, such as the large precision arithmetic operations of this disclosure, on an integrated circuit device 12 (such as an FPGA or an application-specific integrated circuit (ASIC)). In some cases, the designer may specify a high-level program to be implemented, such as an OpenCL program, which may enable the designer to more efficiently and easily provide programming instructions to configure a set of programmable logic cells for the integrated circuit device 12 without specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that learn unfamiliar low-level hardware description languages to implement new functionalities in the integrated circuit device 12.

Designers may implement their high-level designs using design software 14, such as a version of Intel® Quartus® by INTEL CORPORATION. The design software 14 may use a compiler 16 to convert the high-level program into a lower-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of one or more vector processing systems 26 on the integrated circuit device 12. The vector processing system 26 may include circuitry (e.g., vector processing units) to implement, for example, operations to perform vector-vector or vector-scalar multiplication for AI or non-AI data processing. The integrated circuit device 12 may include many (e.g., tens, hundreds) of the vector processing systems 26. Additionally, vector processing systems 26 may be communicatively coupled to one another such that data output from one vector processing systems may be provided to other vector processing systems.

While the above discussion describes the application of a high-level program, in some embodiments, the designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
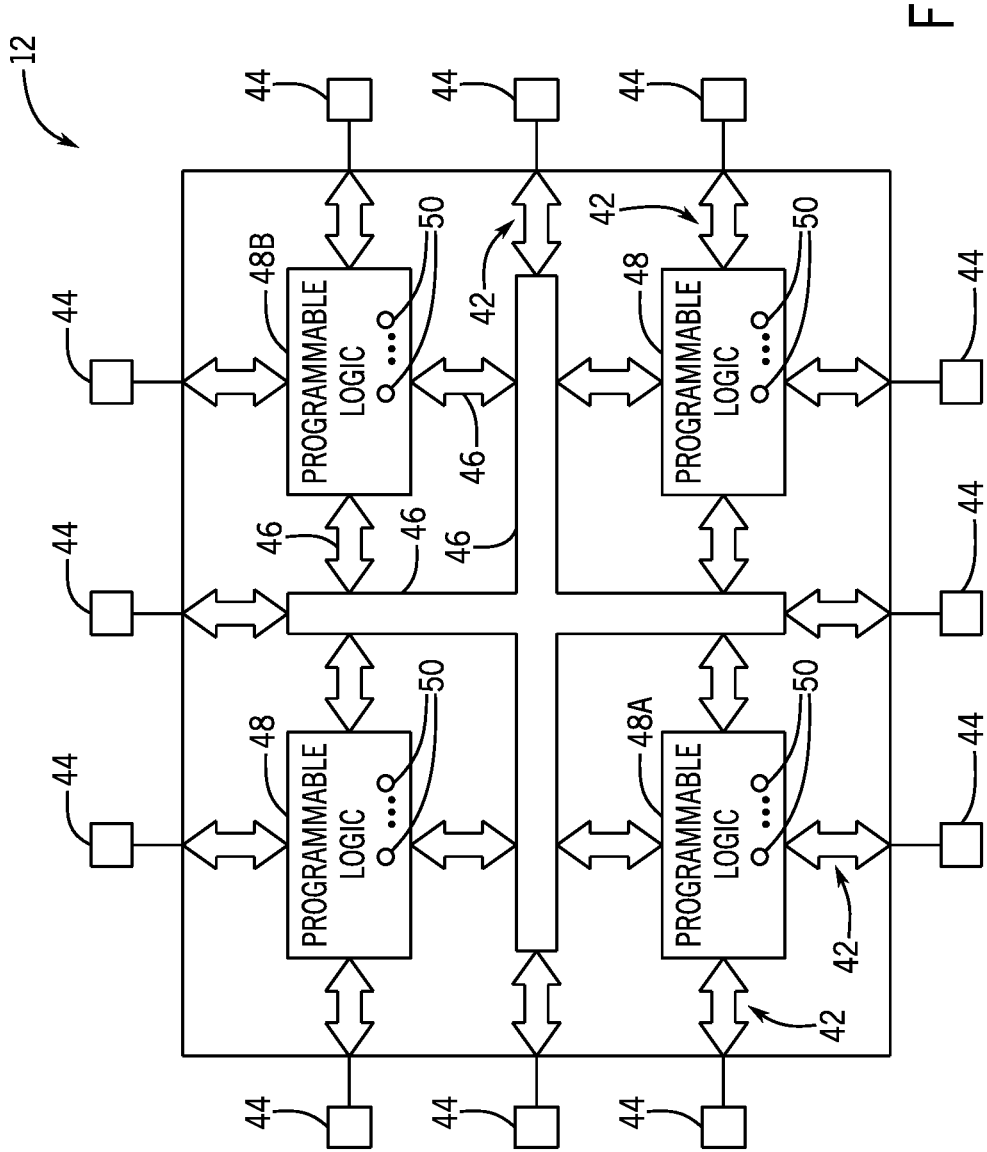
FIG. 2 is a block diagram of illustrating circuitry that may be included in the integrated circuit device of FIG. 1, in accordance with an embodiment.

Turning now to a more detailed discussion of the integrated circuit device 12, FIG. 2 illustrates an example of the integrated circuit device 12 as a programmable logic device, such as a field-programmable gate array (FPGA). Further, it should be understood that the integrated circuit device 12 may be any other suitable type of integrated circuit device (e.g., an application-specific integrated circuit and/or application-specific standard product). As shown, the integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (e.g., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of the programmable logic 48.

Programmable logic devices, such as the integrated circuit device 12, may contain programmable elements 50 within the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Vector Processing Systems

Figure 3:
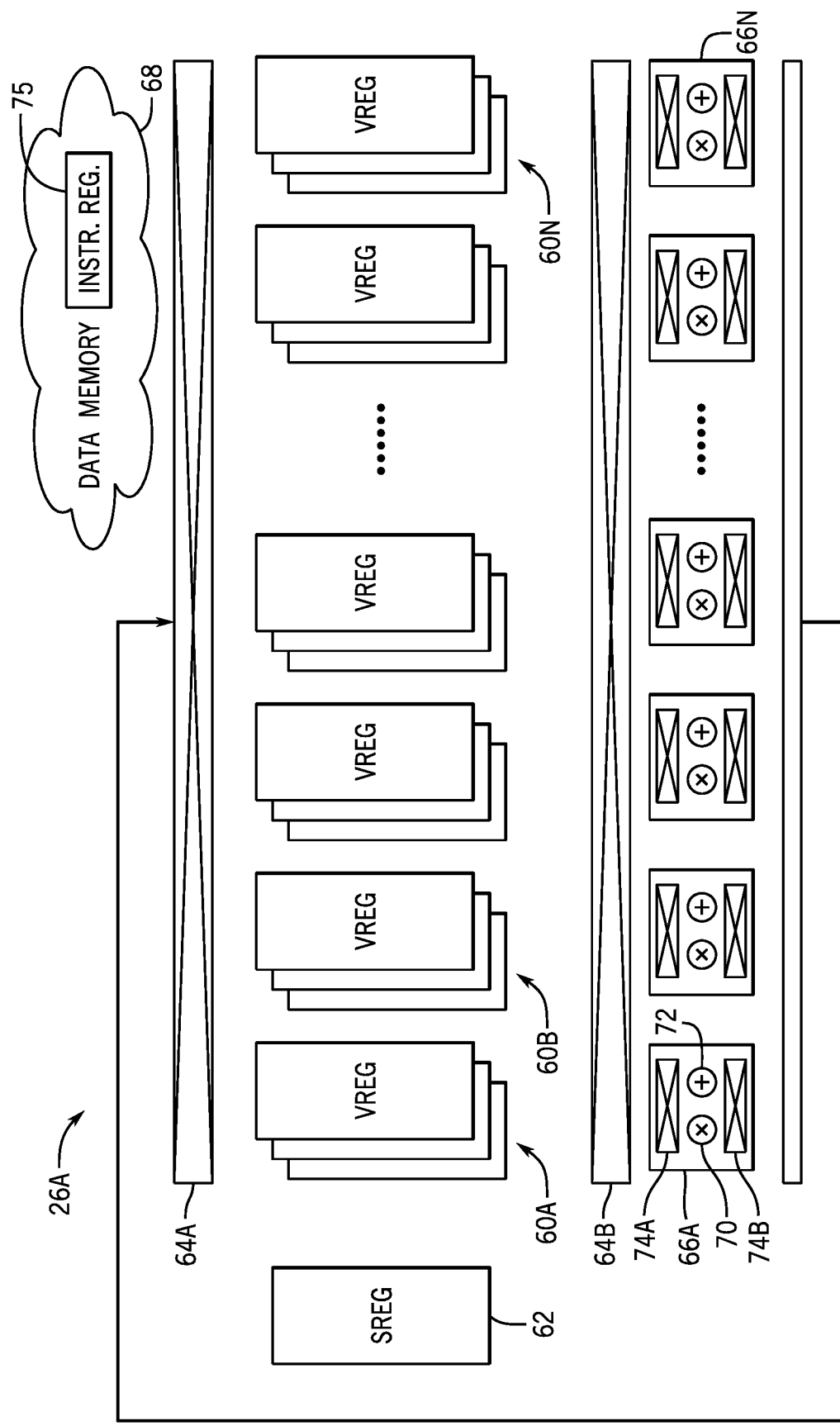
FIG. 3 is a block diagram of a vector processing system, in accordance with an embodiment.

Continuing with the drawings, FIG. 3 illustrates a vector processing system 26A that may be implemented on the integrated circuit device 12. The vector processing system 26A may be communicatively coupled to input/output circuitry 42 of the integrated circuit device 12 and send and receive data via the input/output circuitry. The vector processing system 26A includes vector registers 60 (e.g., vectors registers 60A, 60B, . . . , 60N), one or more scalar registers 62, crossbar switches 64 (e.g., crossbar switches 64A, 64B), vector processing units 66 (e.g., vector processing units 66A, . . . , 66N), and memory 68.

The vector registers 60 may store data, such as vectors. Each vector register 60 may include several copies of the same vector data. For example, vector register 60A may include three copies of a vector. In some cases, values in copies of a vector may share the same format, whereas in other cases, the values may have multiple formats. For example, values of vectors may be stored as single-precision floating point values (e.g., FP32) as provided by IEEE Standard 754, bfloat16 values, INT8 values, as values in other numerical formats, or a combination thereof. In other words, different precisions may be utilized for different vectors, and different precisions may be utilized for different copies of the same vector. The vector registers 60 may include several read ports, thereby enabling simultaneous access to more than one copy of a particular vector. Additionally, the vector processing system 26A may include any suitable number of vector registers 60. As discussed below in more detail, the vector registers 60 (e.g., vector registers 60A, 60B, . . . 60N) may be implemented using one or more memory blocks that are subdivided. Accordingly, a single vector register may be physically subdivided into multiple vector registers (e.g., one or more of vector registers 60A, 60B, . . . , 60N).

The scalar registers 62 may be data registers that are utilized to store scalars. Similar to the vector registers 60, the scalar registers 62 may store values included in scalars in a variety of formats, such as, but not limited to FP32, bfloat16, and INT8 formats. Additionally, the vector processing system 26A may include any suitable number of scalar registers 62.

The crossbar switches 64 (e.g., crossbar switches 64A, 64B) are communicatively coupled to the vector registers 60, scalar registers 62, vector processing units 66, and memory 68. The crossbar switches 64A, 64B route data in the vector processing system 26A. For example, the crossbar switch 64A routes data to be stored in the vector registers 60 and scalar registers 62. The crossbar switch 64B may receive data (e.g., vectors or scalars) from the vector registers 60 and scalar registers 62 and route the data to particular vector processing units 66.

The vector processing units 66 (e.g., vector processing units 66A, 66N) may include functional units (e.g., function blocks, digital signal processing (DSP) blocks, or circuitry within DSP blocks that perform particular functions such as addition or multiplication) that receive data and perform operations on the data, for instance, in accordance with instructions to perform the operations. For example, data from the vector registers 60 and/or scalar registers 62 may be routed to a particular vector processing units 66 (e.g., vector processing unit 66A) via the crossbar switch 64B, and the vector processing unit 66A may perform a particular operation on the received data. For instance, the vector processing units 66 may include multiplier circuitry 70 that can perform various forms of multiplication (e.g., vector-vector multiplication, vector-scalar multiplication) and adding circuitry 72 that can perform various forms of addition and subtraction (e.g., vector-vector addition/subtraction, vector-scalar addition/subtraction). The vector processing units 66 may output data (e.g., values determined by performing operations on received data), which may be provided to the crossbar switch 64A to be stored in the vector registers 60 and/or scalar registers 62. The vector processing system 26A may include any suitable number of vector processing units 66.

Furthermore, the vector processing units 66 may include one or more crossbar switches 74 (e.g., crossbar switches 74A, 74B) that may route data within the vector processing units 66. For example, the crossbar switch 74A may route received data to circuitry within the vector processing units 66 (e.g., multiplier circuitry 70, adding circuitry 72). The crossbar switch 74B may route data to be output by the vector processing units 66. The crossbar switches 74 may also be utilized to truncate and aggregate integer (e.g., fixed-point) and floating-point data within the vector processing units 66. For example, the crossbar switch 74A may truncate an FP32 input to a bfloat16 value. The vector processing units 66 may perform an operation involving the bfloat16 value, and the crossbar switch 74B may aggregate received data (e.g., a product, sum, or difference generated by performing the operation involving the bfloat16 value and another value) to output an FP32 value.

The vector processing system 26A also includes the memory 68, which is memory included in, or accessible to, the integrated circuit device 12. For instance, the memory 68 may include a memory included within the integrated circuit device 12 (e.g., cache memory) or memory that is external to the integrated circuit device 12. The memory 68 may include an instruction register 75 that enables the crossbar switches 64A, 64B to route data within the vector processing system 26A. For example, the instruction register 75 may be utilized (e.g., by the crossbar switches 64A, 64B or control circuitry included in the integrated circuit device 12) to interpret received instructions so that a particular (e.g., requested) operation can be performed. Accordingly, the vector processing system 26A enables a parameterizable number of read ports with parameterizable instruction operands.

Figure 4:
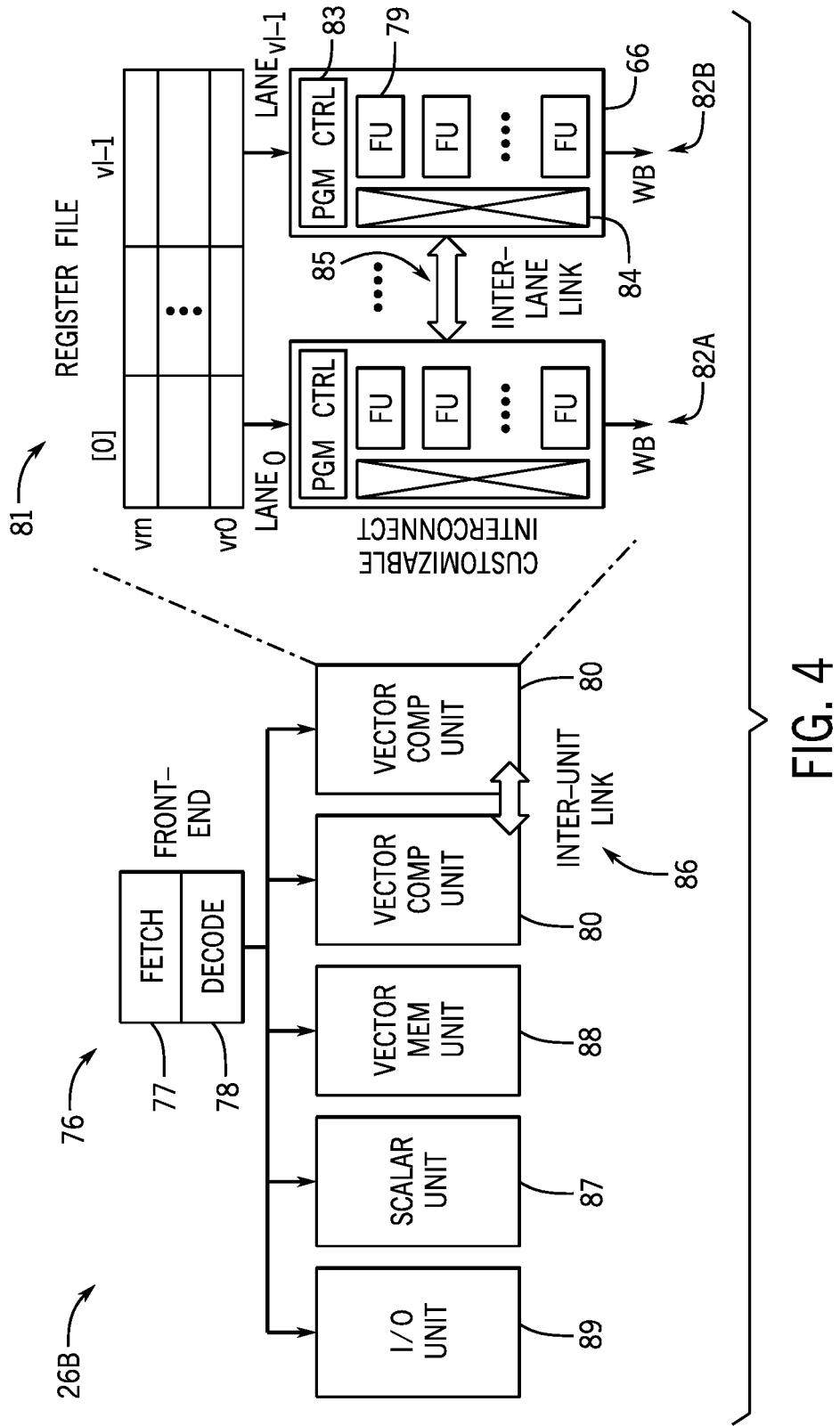
FIG. 4 is a block diagram of another vector processing system, in accordance with an embodiment.

Keeping the discussion of the vector processing system 26A in mind, FIG. 4 is a block diagram of a vector processing system 26B, which is an example implementation of a vector processor micro-architecture for a programmable logic device, such as an FPGA. The vector processing system 26B includes a front-end subsystem 76 that fetches, decodes, and issues instructions to one or more functional units that perform operations involving vectors or scalars. For example, as illustrated, the front-end subsystem 76 includes a fetch unit 77 that fetches instructions that may be included as part of an instruction set architecture (ISA) implemented in the vector processing system 26B or any other embodiment of a vector processing system discussed herein. The front-end subsystem 76 also includes a decode unit 78 that decodes instructions, and the decode unit 78 (or an execution unit) may provide the decoded instructions to a functional unit to be performed. For example, as discussed below, the instructions may be sent to, and performed by, functional units 79 included in vector compute units 80 of the vector processing system 26B.

The vector compute units 80 perform vector processing operations. Each vector compute unit 80 may include a vector register file 81 and one or more lanes 82 (e.g., lanes 82A, 82B). The vector register file 81 includes values (e.g., vectors) that can be utilized in operations performed by the vector compute units 80. The vector register file 81 of FIG. 4 may be implemented using memory (e.g., vector registers 60 of FIG. 3), which may be included in the integrated circuit device 12 or communicatively coupled to the integrated circuit device 12. Control logic 83 of the lanes 82 may receive instructions to be performed and cause the operations to be performed. For example, the control logic 83 may receive a command that includes one or more values (e.g., in the form of one or more addresses in the vector register file 81), the operation(s) to be performed, and a location to store a result of the operation.

Each lane 82 includes vector processing units 66, which each include one or more of the functional units 79. The functional units 79 may include multiplier circuitry (e.g., multiplier circuitry 70), adding circuitry (e.g., adding circuitry 72), or other circuitry utilized to perform computations involving one or more vectors. For example, the functional units 79 may include the multiplier circuitry 70, adding circuitry 72, and other circuitry that performs operations involving one or more vectors. The functional units 79 may be implemented using soft logic, hard logic (e.g., one or more DPS blocks), or a combination thereof to perform a wide variety of operations or customizable functions, some of which are discussed below.

The vector processing units 66 may also include interconnect circuitry 84 that is utilized to establish an inter-lane link 85 between vector processing units 66. In this manner, data may be sent from one lane 82A to another lane 82B, thereby enabling greater customization for performing operations. For example, part of a process may be performed by one lane 82A, and an intermediary value may be provided to another lane 82B, and the functional units 79 of the other lane 82B may utilize the intermediary value as an input in another operation that results in a final value output by the other lane 82B. Furthermore, data may be shared between vector compute units 80 utilizing an inter-unit link 86. Accordingly, by utilizing the interconnect circuitry 84 and the inter-unit link 86, multiple processing paths may be available to perform the same operation. As such, utilizing the flexibility of the multiple processing paths may enable latency to be reduced. The interconnect circuitry 84 may be implemented using crossbar switches 74A, 74B.

Each of the lanes 82 included in a particular vector compute unit 80 is communicatively coupled to the vector register file 81, which supplies vector operands to the lanes 82. As such, each of the lanes 82 accepts one or more elements from each vector operand, performs computations using the input elements, and writes back a resulting output to the vector register file 81. As discussed in greater detail below, the number of lanes 82 included in vector compute units 80 may be customized (e.g., based on the end user's desired vector processing capabilities). The lanes 82 may include different numbers of the vector processing units 66, which may each include different numbers of functional units 79.

The vector processing system 26B includes a scalar unit 87 that performs scalar operations. That is, the scalar unit 87 may be utilized to execute instructions involving scalars, including operations involving a scalar and one or more vectors. The scalar unit 87 may be implemented utilizing a portion of the integrated circuit device 12 (e.g., hard logic or soft logic of a programmable logic device). In other embodiments, the scalar unit 87 may be included in a device separate from, but communicatively coupled to, the integrated circuit device 12. For example, circuitry of a processor may be utilized to implement the scalar unit 87, while the integrated circuit device 12 may perform vector operations utilizing the vector compute units 80.

The vector processing system 26B also includes a vector memory unit 88, which is memory that may handle the data movements between external memory (e.g., memory included on the integrated circuit device 12 that is not included in the vector processing system 26B) and the vector register files 81 of the integrated circuit device 12. For instance, vector memory instructions may cause data to be loaded from external memory into a register file (e.g., register file 81) as well as store data from the register file 81 into the external memory. Various types of loading and storing are available, such as sequential accesses to contiguous memory blocks as well as stride, gather, and scatter accesses.

Furthermore, the vector processing system 26B includes an input/output (I/O) unit 89 that may be utilized to communicatively couple the vector processing system 26B to other circuitry as well as to allow direct communication within the vector processing system 26B. For example, the I/O unit 89 may directly communicate with the vector compute units 80 and cause data to be read and written directly to external inputs and outputs.

Bearing the foregoing discussion of the vector processing system 26B in mind, an example implementation of the vector processing system 26B will now be discussed. In this example, the vector processing system 26B, or portions thereof, may be implemented on the integrated circuit device 12, and the integrated circuit device 12 may be a programmable logic device such as an FPGA. In such an example, hard on-chip memory of the integrated circuit device 12 may be utilized to implement the vector register files 81. On-chip memories may also be utilized to implement a register file utilized by the scalar unit 87 as well as instruction memory included in the front-end system 76.

DSP blocks included as hard logic blocks on the integrated circuit device 12 may be utilized as arithmetic units, such as functional units 79 of the vector processing units 66. DSP blocks of the integrated circuit device 12 may also be included in the scalar unit 87 and perform operations involving scalars.

External memory devices that are accessible to the integrated circuit device 12 may also be utilized to implement a portion of the vector processing system 26B. For example, off-chip memory such as one or more high-bandwidth memory (HBM) dies that are communicatively coupled to the integrated circuit device 12 may be utilized, and the vector memory unit 88 of the vector processing system 26B may implement the interfaces to such memories. In other embodiments, other forms of memory may be used alone or in combination with HBM memory.

Furthermore, as noted above, in some embodiments, processing circuitry that is included in an integrated circuit device other than the integrated circuit device 12 may be utilized. For instance, the scalar unit 87 may be implemented using a central processing unit (CPU) or another type of integrated circuit device, and such integrated circuit device may be a different type of device than the integrated circuit device 12. For example, in cases in which the integrated circuit device 12 is an FPGA, the scalar unit 87 may be implemented using circuitry of a processor (e.g., a hardware component of the processor or as instructions or software executed by the processor) that is communicatively coupled to the FPGA.

The I/O unit 89 may be implemented using I/O circuitry included on the integrated circuit device 12 such as, but not limited to, ethernet circuitry, PCIe circuitry, Compute Express Link (CXL) circuitry, transceiver circuitry, and other forms of I/O circuitry. In the case in which the vector processing system 26B is implemented using more than one integrated circuit device (e.g., two integrated circuit devices disposed on a single substrate), the I/O unit 89 may be utilized to communicatively couple devices to one another. For example, PCIe circuitry or CXL circuitry may be utilized to communicatively couple the integrated circuit device 12 and another integrated circuit device that is utilized to provide the scalar unit 87. In such an example, the integrated circuit device 12 may be a programmable logic device such as an FPGA, and the other integrated circuit device may be another type of integrated circuit device, such as a processor (e.g., CPU).

Before proceeding to discuss the vector processing units 66 of FIG. 3 and FIG. 4 in more detail, it should be noted that the vector processing system 26B may include any desired number of the elements illustrated in FIG. 4. For example, while a single scalar unit 87 and single vector memory unit 88 are shown, in other embodiments, more than one scalar unit 87 and vector memory unit 88 may be included. Furthermore, one or more than two vector compute units 80 may be included in the vector processing system 26B, each of which may include any suitable number of lanes 82 and functional units 79.

Vector Processing Units, Functional Units, Reduction Operations, and Special Functions Keeping the discussion of FIG. 3 in mind, several embodiments of the vector processing units 66 and operations performed by the vector processing units 66 will be discussed. However, before proceeding to discuss the embodiments of the vector processing units 66, it should be noted that each of the embodiments that will be discussed below with reference to FIGS. 5-11 may include the crossbar switches 74 (e.g., crossbar switches 74A, 74B) regardless of whether either of the crossbar switches 74 (e.g., crossbar switches 74A, 74B) is illustrated. However, this is meant to be non-limiting, and it should be understood that the vector processing units 66 may have more or fewer (e.g., three or more, one, or none) of the crossbar switches 74. Furthermore, it should also be noted that the vector processing units 66 described below may utilized as scalar processing units (e.g., in the scalar unit 87) that perform operations on scalar and that registers included in such scalar processing units may store scalars instead of vectors.

Figure 5:
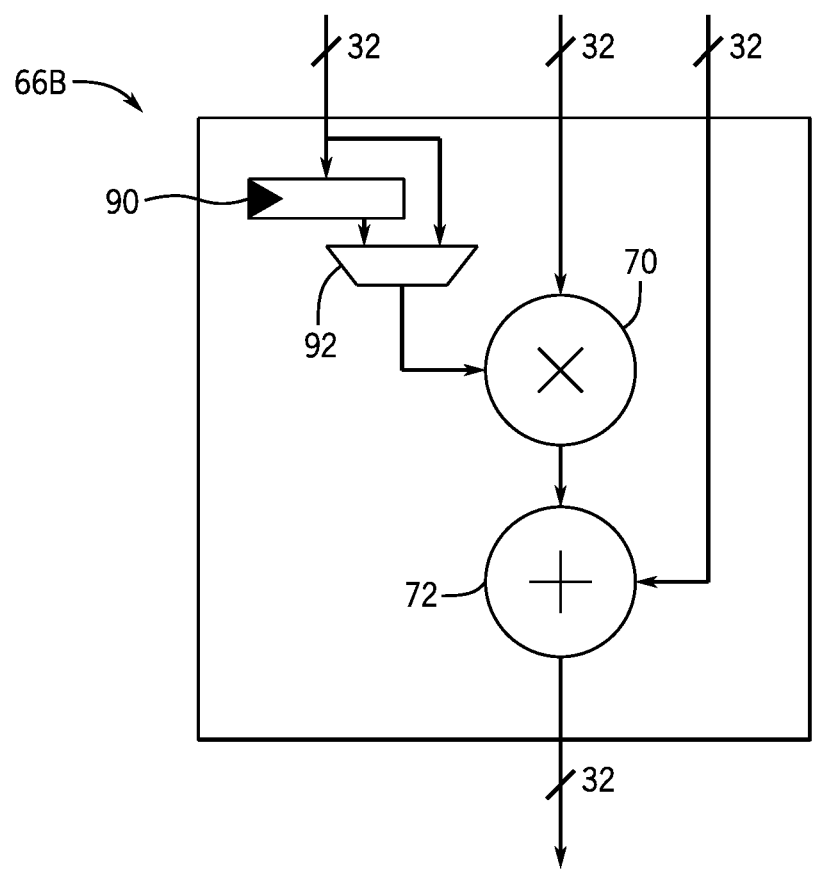
FIG. 5 is a block diagram of a first vector processing unit, in accordance with an embodiment.

FIG. 5 is a block diagram of a vector processing unit 66B that may perform operations on FP32 values (e.g., up to three FP32 values) and output an FP32 value. The vector processing unit 66B includes a register 90 that may be used to store a vector. The vector processing unit 66B also includes a multiplexer 92, which may select a value to provide to the multiplier circuitry 70. For example, the multiplexer 92 may select whether to provide a currently received value (or values) or a value (or values) stored in the register 90 to be multiplied (e.g., by another value or values received by the vector processing unit 66B). In this manner, the vector processing unit 66B (and each embodiment of the vector processing unit 66 discussed herein) may provide tensor support (e.g., function as a tensor processor or tensor processing unit (TPU)). For example, a vector stored in the register 90 may be multiplied by data that is streamed into the vector processing unit 66B. The vector in the register 90 may be utilized over and over again for each other input, thereby enabling the vector stored in the register 90 to be multiplied by several other values (e.g., vectors or scalars). The register 90 may also be utilized to store scalars. Furthermore, it should be noted that the vector processing unit 66B may be utilized as a scalar functional unit that performs operations involving one or more scalars.

The vector processing unit 66B may perform a variety of operations. These operations are described below in Table 1. Inputs including "Vs" (source vector) are indicative of a vector stored in the vector registers 60 (e.g., a register or register address for a particular vector), inputs including "Ss" (source scalar) are indicative of a scalar stored in the scalar registers 62 (e.g., a register or register address for a particular scalar), and outputs including "Vd" (destination vector) or "Sd" (destination scalar) are indicative of where an output should be stored (e.g., a particular register or address within the vector registers 60 or scalar register 62). An input including a number (e.g., Vs1, Vs2, Vs3) is used to indicate a number of inputs involved in a particular operation. For instance, an operation that includes "Vs1" and "Vs2" would have two inputs. It should be noted that the inputs included in the table below may be a vector or scalar that is stored in the register 90.

TABLE 1

| Operation | Description of Operation | Inputs | Output |
| --- | --- | --- | --- |
| VVFP32MUL | vector-vector multiplication involving FP32 values | Vs1, Vs2 | Vd |
| VSFP32MUL | vector-scalar multiplication involving FP32 values | Ss1, Vs2 | Vd |
| VVFP32MULADD | vector-vector multiplication and addition involving FP32 values | Vs1, Vs2, Vs3 | Vd |
| VSFP32MULADD | vector-scalar multiplication and addition involving FP32 values | Ss1, Vs2, Vs3 | Vd |
| VVFP32ADD | vector-vector addition involving FP32 values | Vs1, Vs2 | Vd |
| VSFP32ADD | vector-scalar addition involving FP32 values | Ss1, Vs2 | Vd |
| VVFP32SUB | vector-vector subtraction involving FP32 values | Ss1, Vs2 | Vd |
| VSFP32ADD | vector-scalar addition involving FP32 values | Ss1, Vs2 Or Vs2, Ss1 | Vd |
| VSFP32SUB | vector-scalar subtraction involving FP32 values | Ss1, Vs2 Or Vs2, Ss1 | Vd |

Figure 6:
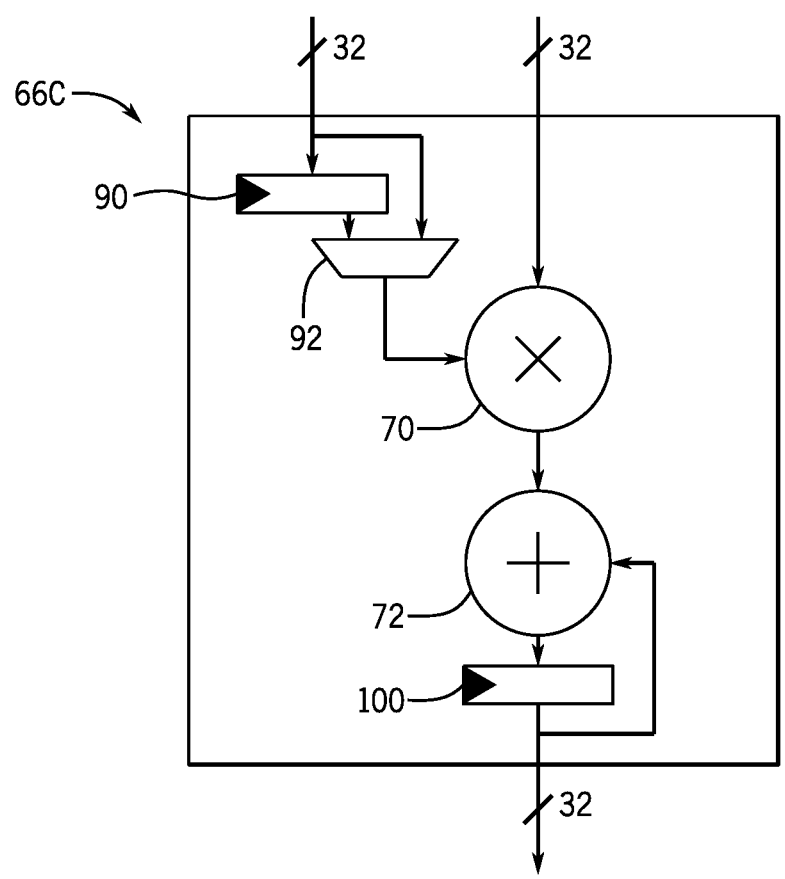
FIG. 6 is a block diagram of a second vector processing unit, in accordance with an embodiment.

FIG. 6 illustrates vector processing unit 66C, which receives two FP32 inputs and generates one FP32 output. The vector processing unit 66C includes a register 100 that can store sums generated by the adding circuitry 72 and enable the vector processing unit 66C to function as an accumulator. For example, as the vector processing unit 66C determines products, they may be added to a vector stored in the register 100. Accordingly, the vector processing unit 66C may operate as an accumulator with the result of the accumulation being stored in the register 100. In addition to the operations provided in Table 1 that involve two inputs, the vector processing unit 66C may also perform the operations described below in Table 2.

TABLE 2

| Operation | Description of Operation | Inputs | Output |
| --- | --- | --- | --- |
| VVFP32MULACC | vector-vector multiplication and accumulation | Vs1, Vs2 | n/a |
| VSFP32MULACC | vector-scalar multiplication and accumulation | Ss1, Vs2 | n/a |
| VWFP32 ("vector write") | causes value stored in register 100 to be output | n/a | Vd |

By utilizing vector processing units 66 that provide accumulator functionality (e.g., vector processing units 66C, 66F) chaining (also known as "forwarding") can be avoided. Rather, accumulation is performed, and when a value from a register used in conjunction with accumulation (e.g., register 100) is requested (e.g., as an input or to be stored elsewhere), the vector processing unit 66 may receive a request for the value (e.g., a request to perform a VWFP32 operation) and provide the value in response to such a request.

Figure 7:
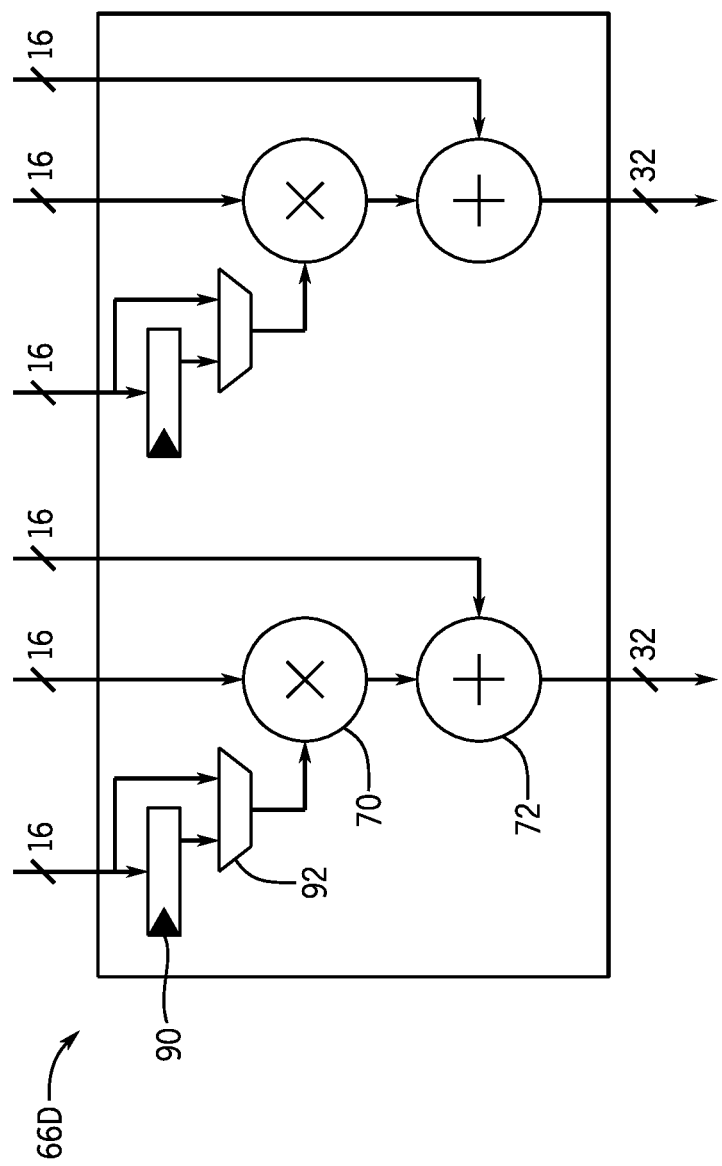
FIG. 7 is a block diagram of a third vector processing unit, in accordance with an embodiment.

Continuing with the drawings, FIG. 7 illustrates a vector processing unit 66D that may be utilized to perform operations involving bfloat16 values. In some embodiments, the bfloat16 values may be generated by crossbar switches 74A that truncate other values (e.g., FP32 values). The vector processing unit 66D may receive 6 bfloat16 inputs (96 total bits) and output 2 FP32 values (64 total bits). Operations performed by the vector processing unit 66D are provided in Table 3. More specifically, the vector processing unit 66D may perform two of the operations of Table 3 in parallel. For example, the vector processing unit 66D may perform two VVPF16MULADD operations, two VSFP16MULADD operations, or a VVPF16MULADD operation and a VSFP16MULADD in parallel.

TABLE 3

| Operation | Description of Operation | Inputs | Output |
| --- | --- | --- | --- |
| VVFP16MULADD | vector-vector multiplication and addition involving bfloat16 values | Vs1, Vs2, Vs3 | Vd |
| VSFP16MULADD | vector-scalar multiplication and addition involving bfloat16 values | Ss1, Vs2, Vs3 | Vd |

Figure 8:
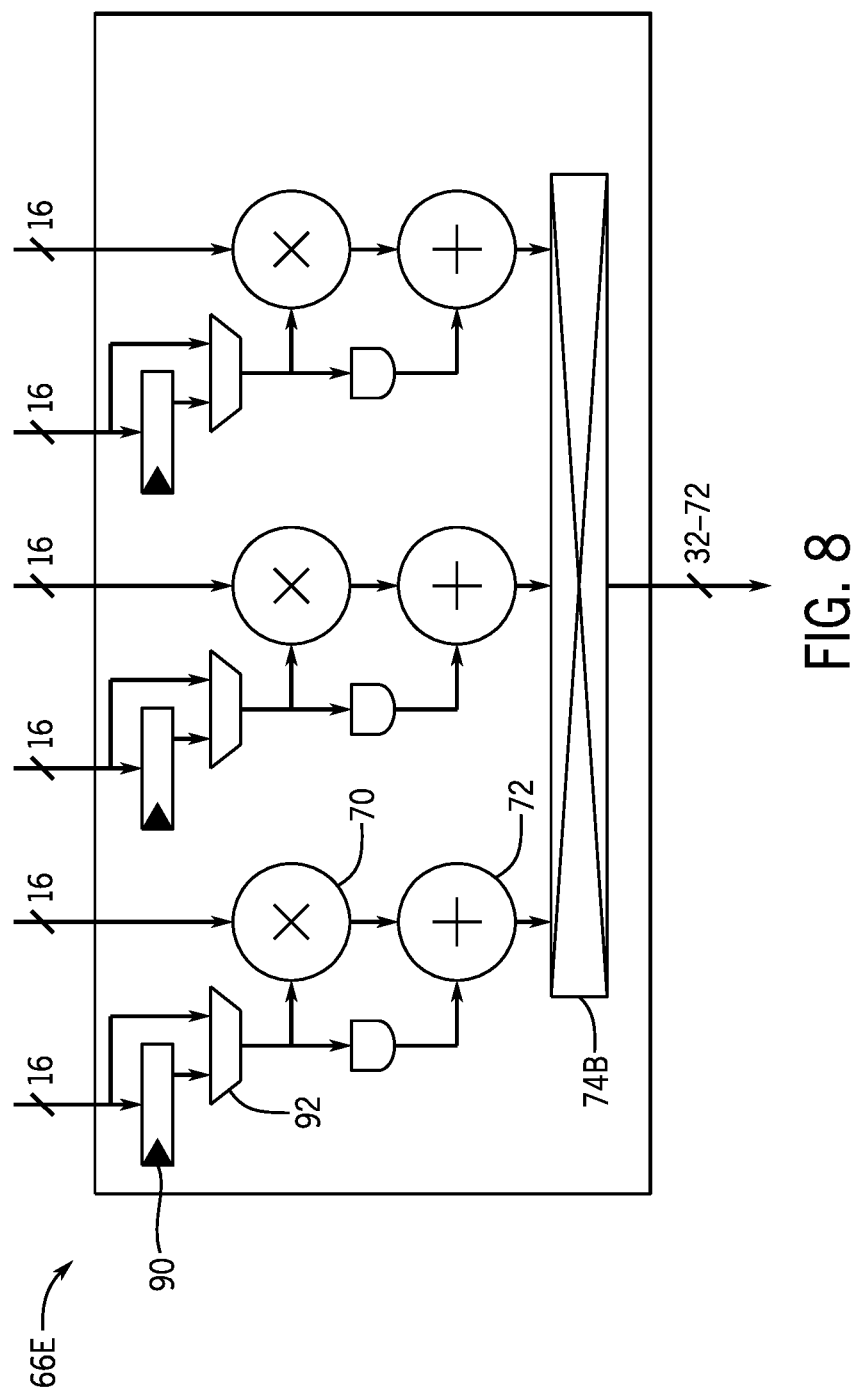
FIG. 8 is a block diagram of a fourth vector processing unit, in accordance with an embodiment.

FIG. 8 illustrates a vector processing unit 66E that may be utilized to perform operations involving bfloat16 values. In some embodiments, the bfloat16 values may be generated by crossbar switches 74A that truncate other values (e.g., FP32 values). The vector processing unit 66E may receive up to 96 inputs bits of data and output up to 72 output bits of data. Operations performed by the vector processing unit 66E are provided in Table 4. The vector processing unit 66E may perform three operations in parallel. More specifically, the vector processing unit 66E may perform any combination of three operations provided in Table 4 (e.g., three different iterations of one operation, two iterations of a first operation and one iteration of a second operation, or one iteration of three different operations) in parallel. Furthermore, the size of the output of the vector processing unit 66E may range from thirty-two to seventy-two bits depending on the operation(s) the vector processing unit 66E is performing and the number of inputs the processing unit 66E receives. For example, when performing addition or subtraction operations, the output may include relatively fewer bits than an output that may be generated when performing multiplication operations. As another example, when relatively fewer inputs (e.g., two) are received, the output may be smaller compared to an output generated based on more inputs.

TABLE 4

| Operation | Description of Operation | Inputs | Output |
| --- | --- | --- | --- |
| VVFP16MUL | vector-vector multiplication involving bfloat16 values | Vs1, Vs2 | Vd |

TABLE 4-continued

| Operation | Description of Operation | Inputs | Output |
|---|---|---|---|
| VSFP16MUL | vector-scalar multiplication involving bfloat16 values | Ss1, Vs2 | Vd |
| V(V/S)FP16(ADD/SUB) | vector-vector addition, vector-vector subtraction, vector-scalar addition, or vector-scalar subtraction involving bfloat16 values | (Vs1/Ss1), Vs2, | Vd |

Figure 9:
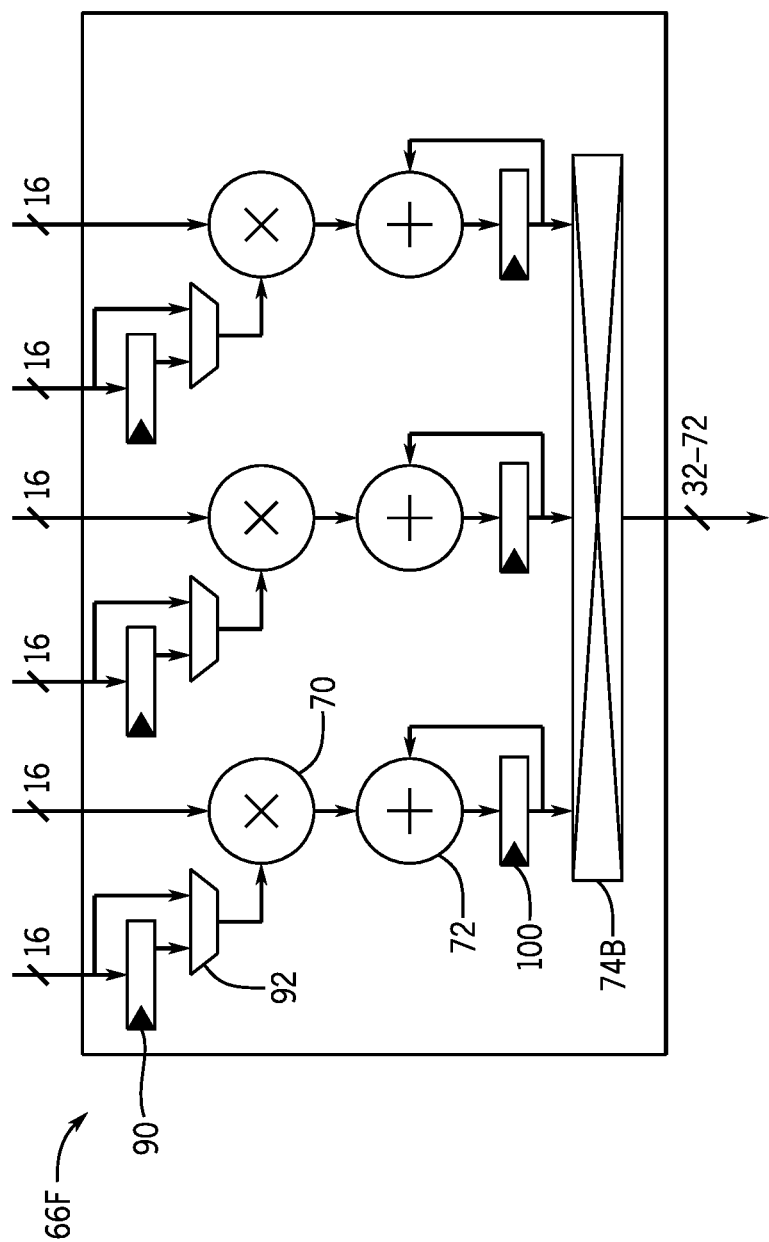
FIG. 9 is a block diagram of a fifth vector processing unit, in accordance with an embodiment.

FIG. 9 illustrates a vector processing unit 66F that may be utilized to perform operations involving bfloat16 values. In some embodiments, the bfloat16 values may be generated by crossbar switches 74A that truncate other values (e.g., FP32 values). The vector processing unit 66F may receive up to 96 input bits of data and output up to 72 output bits of data. The vector processing unit 66F may perform accumulation operations utilizing register 100 in a manner generally similar to the operations of the vector processing unit 66C discussed above. In other words, the vector processing unit 66F is an embodiment of the vector processing unit 66 that enables accumulation involving bfloat16 values. These operations are provided in Table 5 below. It should also be noted that, similar to the vector processing unit 66E, the vector processing unit 66F may perform three operations in parallel. That is, the vector processing unit 66F may perform any combination of three operations provided in Table 5 (e.g., three different iterations of one operation, two iterations of a first operation and one iteration of a second operation, or one iteration of three different operations) in parallel. Similar to vector processing unit 66E, the size of the output of the vector processing unit 66F may range from thirty-two to seventy-two bits depending on the operation(s) the vector processing unit 66F is performing and the number of inputs the processing unit 66F receives. For instance, when performing addition or subtraction operations, the output may include relatively fewer bits than an output that may be generated when performing multiplication operations. As another example, when relatively fewer inputs (e.g., two) are received, the output may be smaller compared to an output generated from more inputs.

TABLE 5

| Operation | Description of Operation | Inputs | Output |
|---|---|---|---|
| VVFP16MULACC | vector-vector multiplication and accumulation | Vs1, Vs2 | n/a |
| VSFP16MULACC | vector-scalar multiplication and accumulation | Ss1, Vs2 | n/a |
| VWFP16 | causes value(s) stored in register(s) 100 to be output | n/a | Vd |

Figure 10:
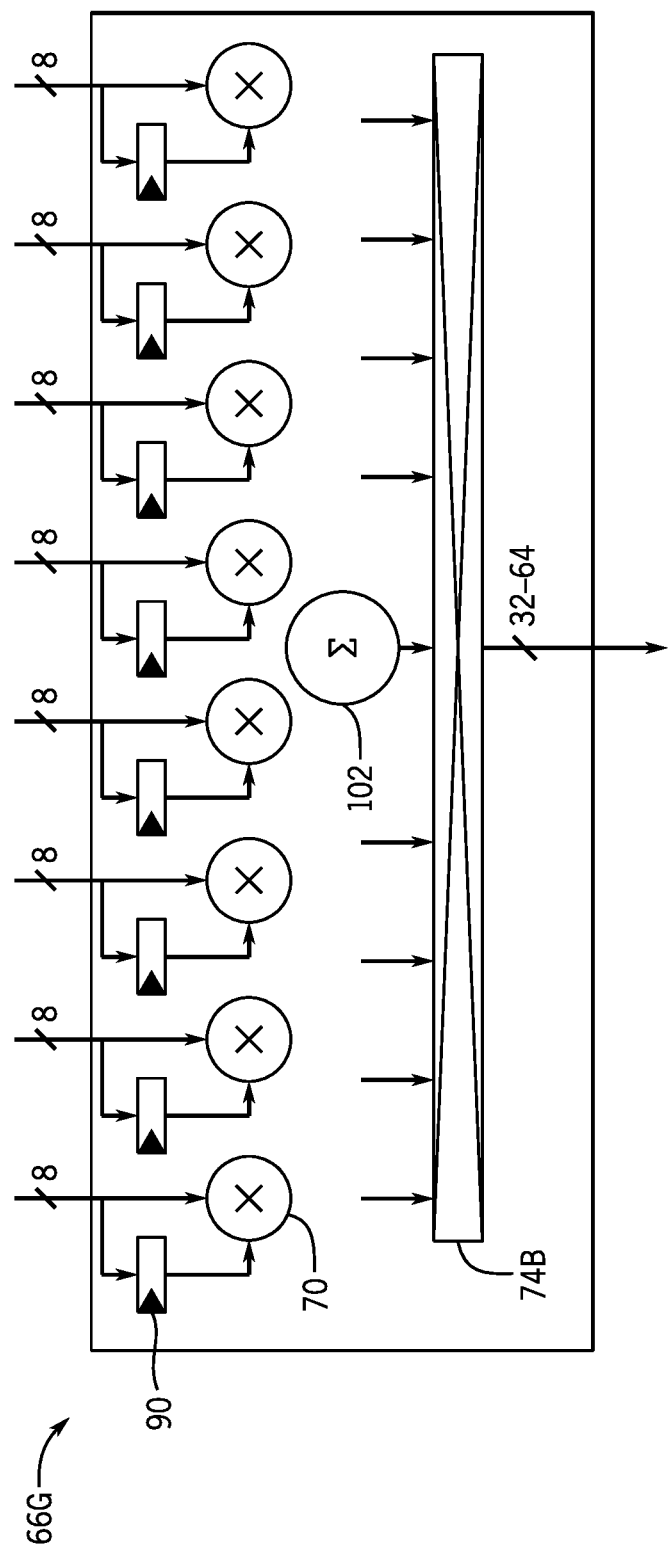
FIG. 10 is a block diagram of a sixth vector processing unit, in accordance with an embodiment.

FIG. 10 illustrates a vector processing unit 66G that can perform multiplication and addition operations involving fixed-point values, such as INT8 values. As illustrated, the vector processing unit 66G may receive up to 64 bits of input data and output up to 64 bits of data. More specifically, the vector processing unit 66G includes eight multipliers (e.g., eight of the multiplier circuitry 70) that may receive one input (e.g., external input) and one registered input (e.g., a value from register 90). As such, the registers 90 may be utilized to preload an operand of the multiplication operations that each of the multipliers will perform. The external input may be used for streaming in the other operands that the multiplier circuitry 70 will multiply against the registered inputs. The outputs generated by the multiplier circuitry 70 may be reduced (e.g., via adder 102) or propagated to crossbar switch 74B, which controls the output (e.g., a 32-64 bit output) of the vector processing unit 66G. In other words, the adder 102 may receive some or all of the outputs of the multiplier circuitry 70 and add the received outputs. Moreover, the outputs of the multiplier circuitry 70 may bypass the adder 102 and be provided the crossbar switch 74B. The vector processing unit 66G may also perform the operations provided in Table 6.

TABLE 6

| Operation | Description of Operation | Inputs | Output |
|---|---|---|---|
| VVINT8DOT | vector-vector dot product | Vs1, Vs2 | Sd |
| V(V/S)INT8MUL | Vector-vector or vector-scalar multiplication | Ss1, Vs2 | Vd |

When performing dot product operations, the vector processing unit 66G may preload vectors into the registers 90, and those vectors along with external inputs may be received and multiplied by the multiplier circuitry 70 to generate a scalar output. It should also be noted that the vector processing unit 66G may perform up to eight operation in parallel. For example, each piece of multiplier circuitry 70 may simultaneously operate to determine a product involving two different inputs.

Figure 11:
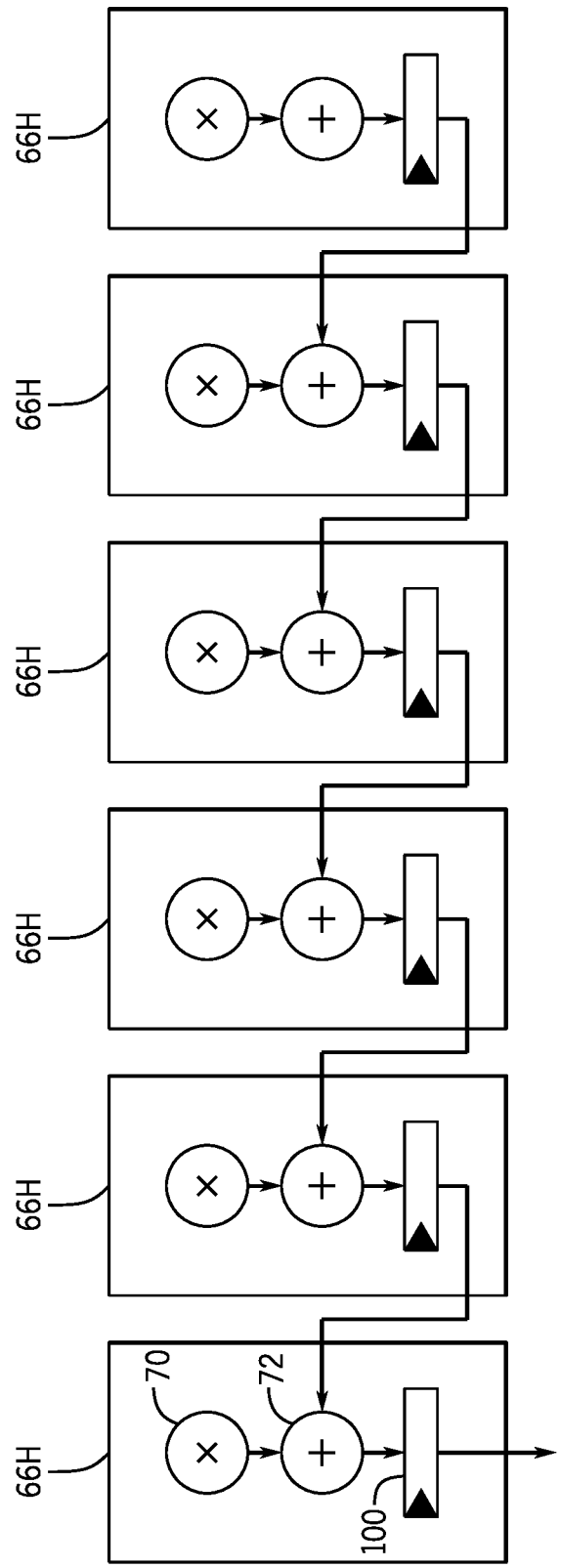
FIG. 11 is a block diagram of a vector processing units utilized to perform a reduction operation, in accordance with an embodiment.

Continuing with the drawings, FIG. 11 includes vector processing units 66H that are utilized to perform reduction operations. For instance, the reduction operations may involve determining and outputting a minimum value of a vector or maximum value of a vector; in either of which, the vector may be an input vector or an output vector generated by performing an operation (e.g., vector-vector multiplication, addition, or subtraction or vector-scalar multiplication, addition, or subtraction). Additionally, the reduction operations may include summing the values included in a vector. The vector processing units 66H of FIG. 11 may be any embodiment of the vector processing unit 66 discussed herein (e.g., such as a vector processing unit 66 that includes multiplier circuitry 70, adding circuitry 72, and register 100).

To perform a reduction operation, the vector processing units 66H and vector processing system 26A may implement a counter indicative of the number of clock cycles before data should be output. For instance, if there are sixteen vector processing units 66H chained together, a counter of sixteen clock cycles may be implemented so that the vector processing system 26A will not try to utilize the eventual output until sixteen clock cycles have occurred. Reduction operations may also be performed using vector processing units 66H operating in a tensor mode of operation. For instance, a vector or scalar from a register 90 may be multiplied by several different input vectors (or scalars). A reduction operation may be performed on each product generated from multiplying an input (e.g., vector or scalar) by a vector or scalar stored in the register 90.

Keeping the foregoing in mind, certain AI and machine-learning processes can be time-intensive and consume large amounts of processing power. For example, training hardware utilized to perform machine-learning or AI may take several weeks and involve many operations in order to back-propagate data. Additionally, utilizing a fixed architecture may be restrictive in that it may not be flexible enough to enable new algorithms to be implemented or workloads to be performed. In some cases, certain operations (e.g., functions) may become bottlenecks that contribute to the extended amounts of time that may be involved to train a computing system utilized for AI or machine-learning applications. Two examples of such functions are provided in FIG. 12. In particular, operation 120 is a batch normalization operation, and operation 122 is a softmax operation. Both the operation 120 and the operation 122 involve many individual operations. For example, performing the operation 122 on a vector having 64 values would utilize 192 operations (64 operations of calculating $e^x$ (where x is each value included in the vector), 64 operations to sum each calculated value, and 64 operations to divide each calculated value by the calculated sum), which would typically take 192 clock cycles to be performed.

Bearing this in mind, several embodiments of the vector processing system 26 that may reduce the amount of time used to train systems utilized for AI and machine-learning application will be discussed. Each of the embodiments of the vector processing system 26 discussed below may include any of the components of the vector processing system 26A discussed above. Additionally, each of the embodiments of the vector processing system 26 and the components thereof discussed below may perform any of the operations discussed above with respect to the vector processing system 26A and each embodiment of the vector processing units 66.

Figure 13:
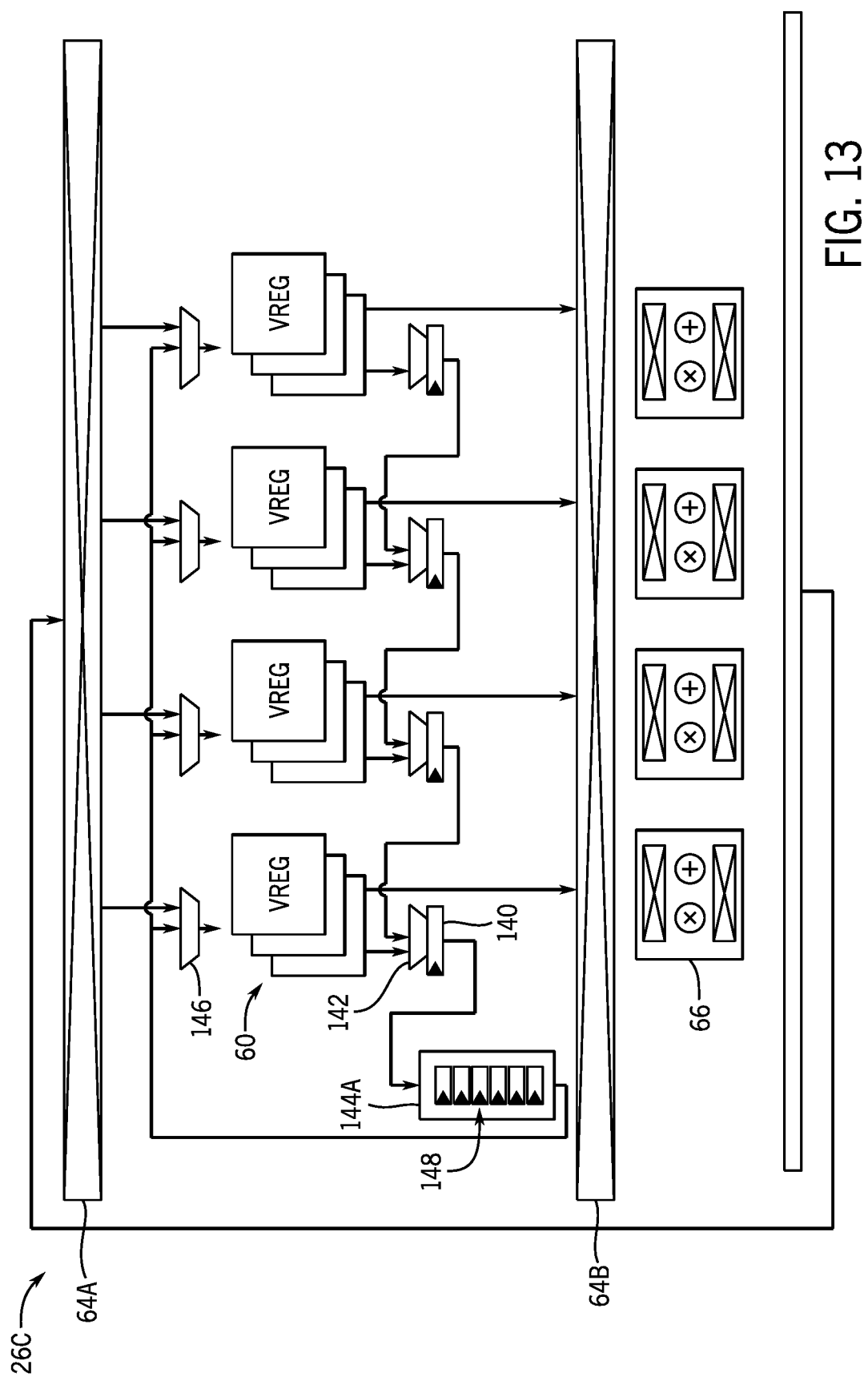
FIG. 13 is a block diagram of a vector processing system, in accordance with an embodiment.

FIG. 13 illustrates a vector processing system 26C generally similar to the vector processing system 26A except that the vector processing system 26C includes additional circuitry, such as shift registers 140, multiplexers 142, a functional unit 144A, and multiplexers 146. As described functional units (e.g., functional unit 144A) may perform operations on values stored in the vector registers 60, which may reduce the amount of time that would be utilized to perform those operations compared to only using vector processing units 66. For example, functional units 144 may perform operations simultaneously as the vector processing units 66, thereby reducing the number of operations performing by the vector processing units 66 as well as reducing the number of inputs the crossbar switches 64A, 64B would route compared to other vector processing systems that do not include functional units 144 (e.g., vector processing system 26A).

The shift register 140 of each "lane" (e.g., column of a multiplexer 146, vector registers 60, multiplexer 142, and shift register 140) can be loaded with values from that lane's vector register(s) 60. For example, the shift register 140 may be utilized to store a vector from the vector registers 60 upon which an operation will be performed (e.g., by the functional unit 144A). The multiplexers 142 may be utilized to control the flow of data across the shift registers 140 and to the functional unit 144A.

The functional unit 144A may be a function block that is utilized to perform one of several different operations. For example, the operations the functional unit 144A may be utilized to perform may include, but are not limited to, exponent (e.g., $e^x$) calculations, logarithmic calculations (e.g., $\log(x)$, $\ln(x)$), division operations, square root operations, inverse square root operations. The functional unit 144A may include registers 148 that are utilized as a buffer (e.g., a first-in first-out (FIFO) buffer) to store values (e.g., vectors) received from the vector registers 60. The multiplexers 146 receive outputs of the functional unit 144A and provide the outputs to vector registers 60 to be stored.

In general, in a case in which the shift registers 140 can be loaded with data from X lanes of data, a clock shift of X clock cycles can be made (e.g., using a counter to account for the number of lanes), and the functional unit 144A is utilized for Y lanes (e.g., there are Y lanes per functional unit 144A), it will take X+Y+2 clock cycles to provide the data from the vector registers 60 to the functional unit 144A, the functional unit 144A to perform an operation on each input, and write back the outputs of the functional unit 144A to the vector registers 60. Furthermore, the structure provided in FIG. 13 may be parallelized. For example, a functional unit 144A could be utilized for each 4, 8, 16, 32, 64, or any other suitable number of lanes.

Figure 14:
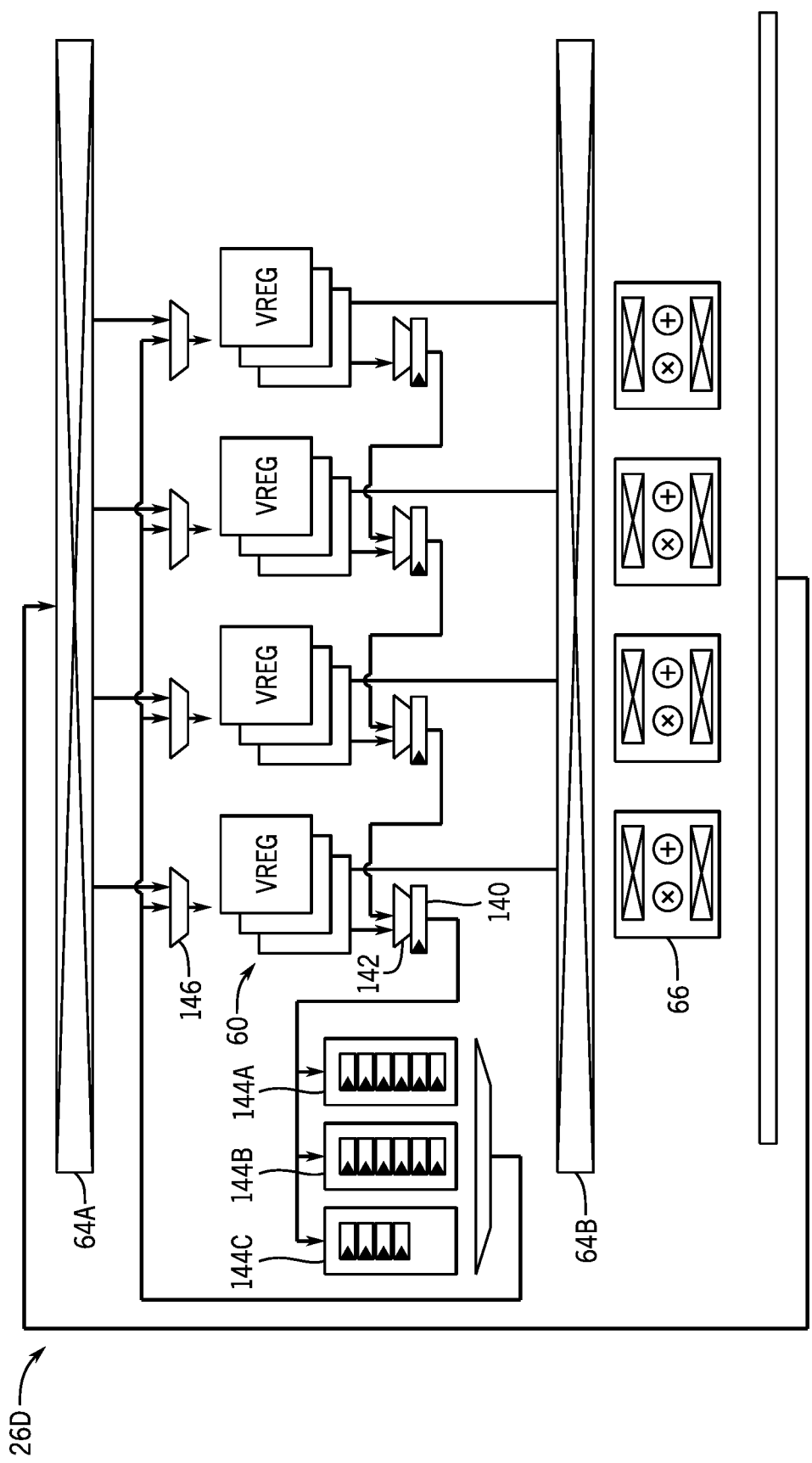
FIG. 14 is a block diagram of another vector processing system, in accordance with an embodiment.

FIG. 14 illustrates a vector processing system 26D that includes multiple functional units 144 (e.g., functional units 144A, 144B, 144C) that may perform different functions. For example, functional unit 144A may perform exponential operations, functional unit 144B may perform logarithmic operations, and functional unit 144C may perform division operations. The number of lanes for which each of the functional units 144A, 144B, 144C is utilized may be the same or may differ. For example, there may be one of each of the functional units 144A, 144B, 144C every n number of lanes. As another example, there may be one functional unit 144A every sixteen lanes, one functional unit 144B every thirty-two lanes, and one functional unit 144C every sixty-four lanes. In this last example, the size of the shift registers 140 may be smaller when there are fewer lanes associated with a functional unit 144. Furthermore, each of the functional units 144 may have different pipeline depths (e.g., depending on a particular function being performed or a user's desired implementation utilized to perform the function).

Figure 15:
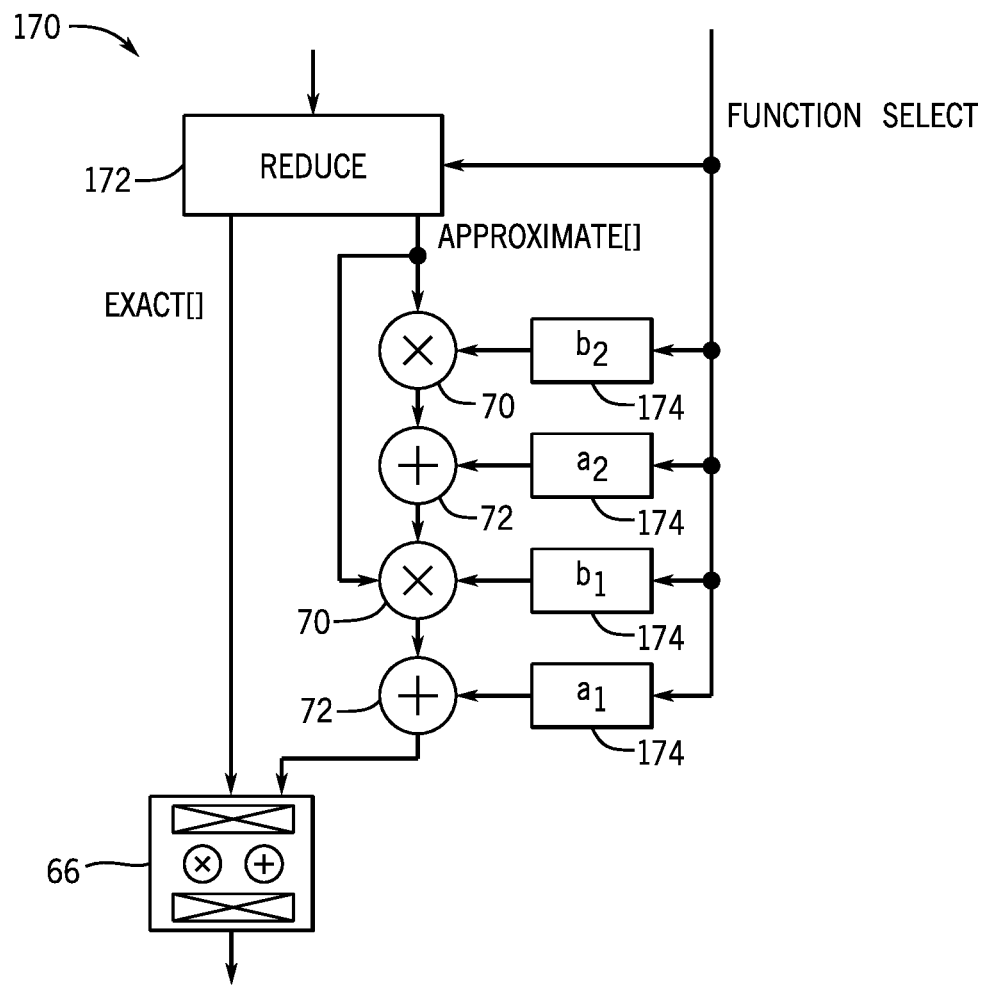
FIG. 15 is a block diagram of circuitry that may be utilized to perform a Homer's Rule pipeline, in accordance with an embodiment.

FIG. 15 illustrates circuitry 170 that may be included in a functional unit to perform a Horner's Rule pipeline that is shared across multiple functions. An exact decomposition and an approximate decomposition may be performed by reduction circuitry 172 (which may be implemented utilizing functional units 144). Coefficient selection circuitry 174 may select coefficients from input data, and a final operation for combination may be performed.

Figure 16:
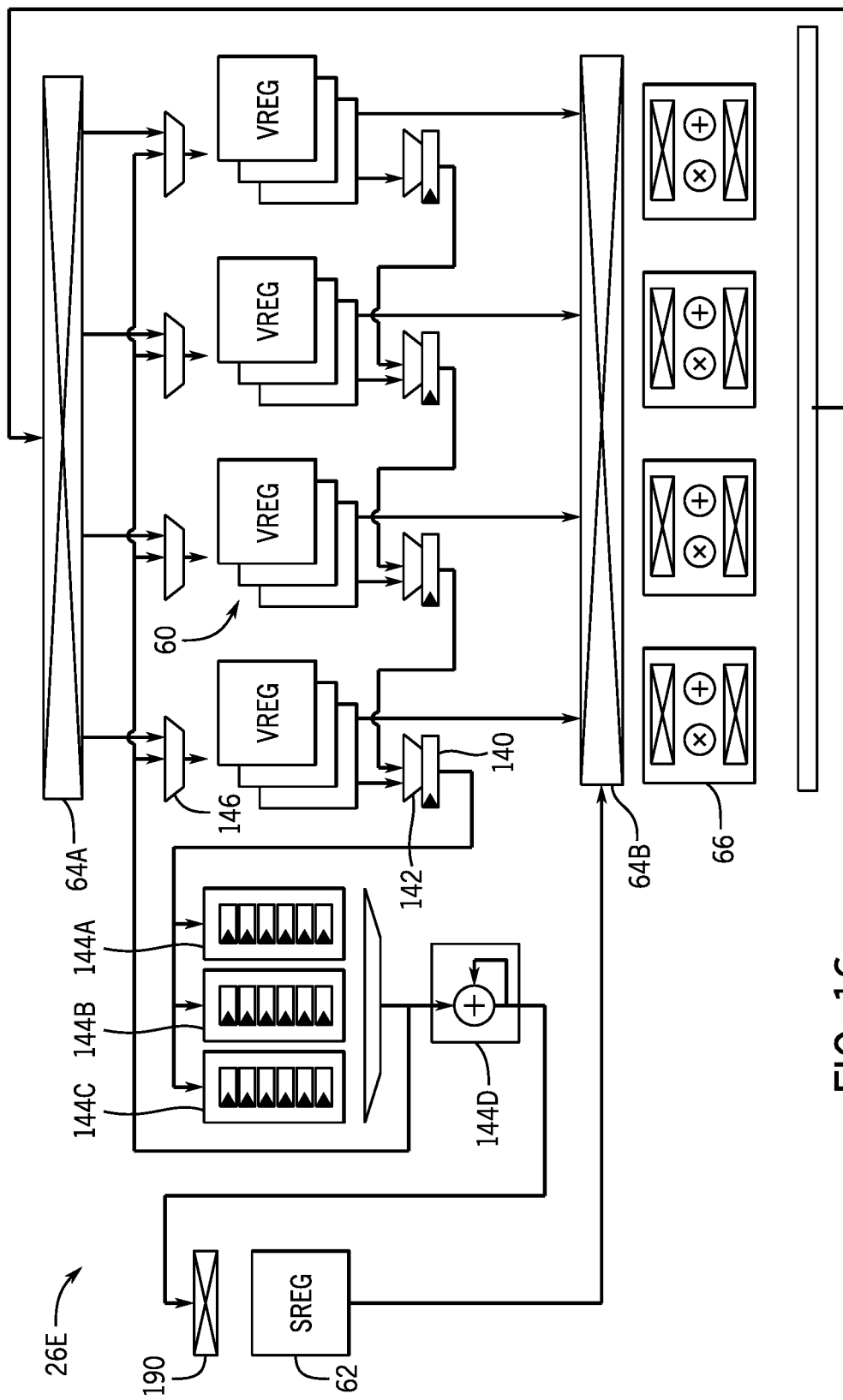
FIG. 16 is a block diagram of another vector processing system, in accordance with an embodiment.

FIG. 16 illustrates a vector processing system 26E that is generally similar to the vector processing system 26D except that the vector processing system 26E includes a functional unit 144D, a crossbar switch 190, and a scalar register 62. The functional unit 144D may include adding circuitry and a register, and the functional unit 144D may function as an accumulator. A value from the functional unit 144D may be provided to the scalar register 62 (e.g., via the crossbar switch 190). The scalar register 62 is communicatively coupled to the crossbar switch 64B, and data from the scalar register 62 may be provided to, and utilized by, the vector processing units 66 (e.g., as "Ss1"). Utilizing the vector processing system 26E may offer large time reductions for performing certain operations, such as the operation 122 shown in FIG. 12. For instance, in the example above in which the operation 122 is performed, the values of the sum of the exponent operations may be determined using the functional unit 144D. When each of the exponent operations has been performed, the sum of the exponent operations (e.g., the value of the denominator of the operation 122) will be calculated (e.g., instead of having to perform the exponent operations and then sum each result of the exponent operations). This value may then be provided to the vector processing units 66 via the crossbar switch 64B and utilized as a scalar in a vector-scalar operation (e.g., multiplication operation) on each of the results of the exponent operations. Furthermore, the functional unit 144D may perform accumulation operations at the same time data from the functional units 144A, 144B, 144C is provided back to the vector registers 60 for storage.

Figure 17:
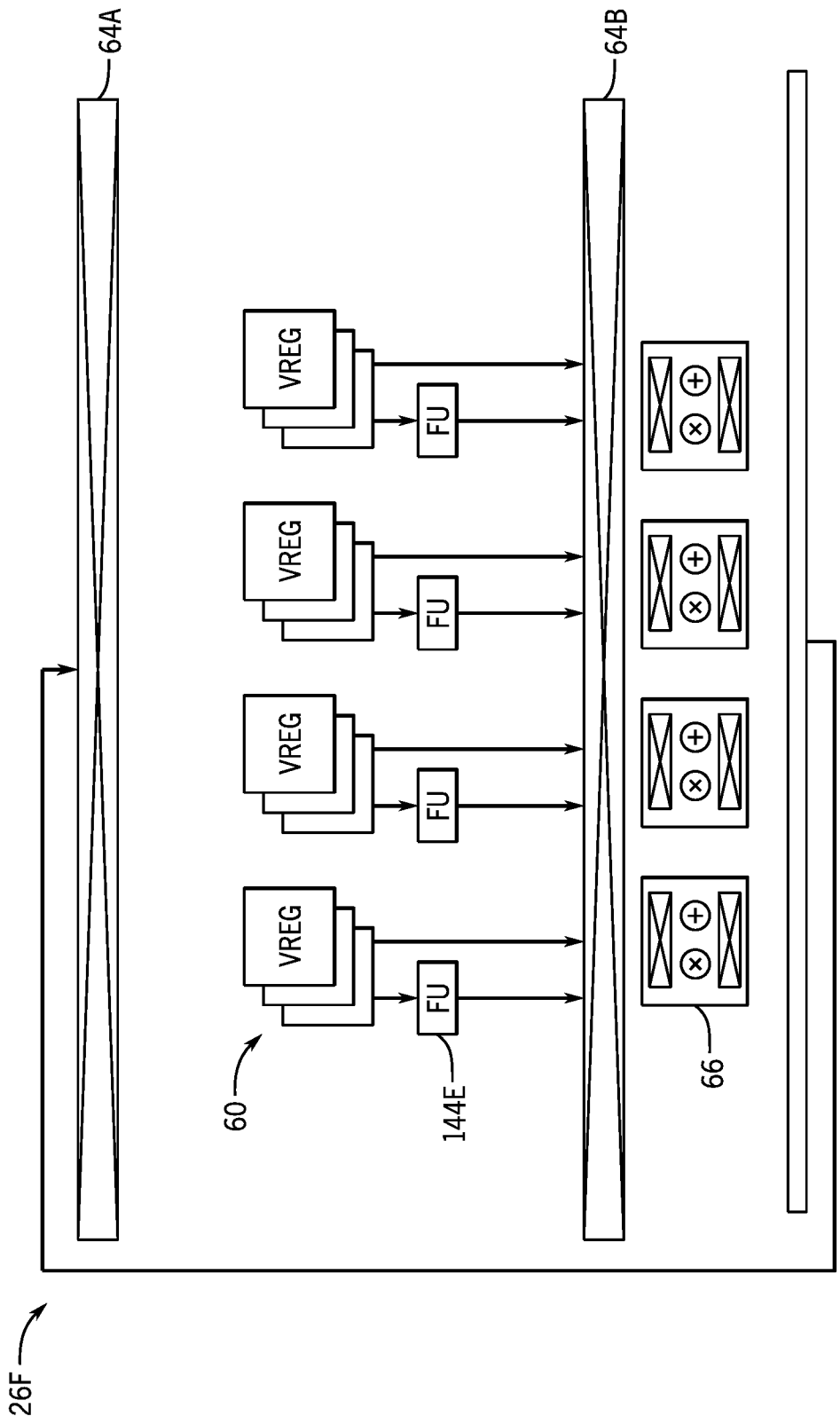
FIG. 17 is a block diagram of yet another vector processing system, in accordance with an embodiment.

Functional units 144 may also be provided for each lane. For instance, as shown in FIG. 17, a vector processing system 26F includes functional units 144E that are included in each lane. The crossbar switch 64B of FIG. 17 may include additional routing circuitry (e.g., multiplexers) to route the data output by the functional units 144E. As non-limiting examples, the functional units 144E may perform division operations and inverse square root operations.

Figure 18:
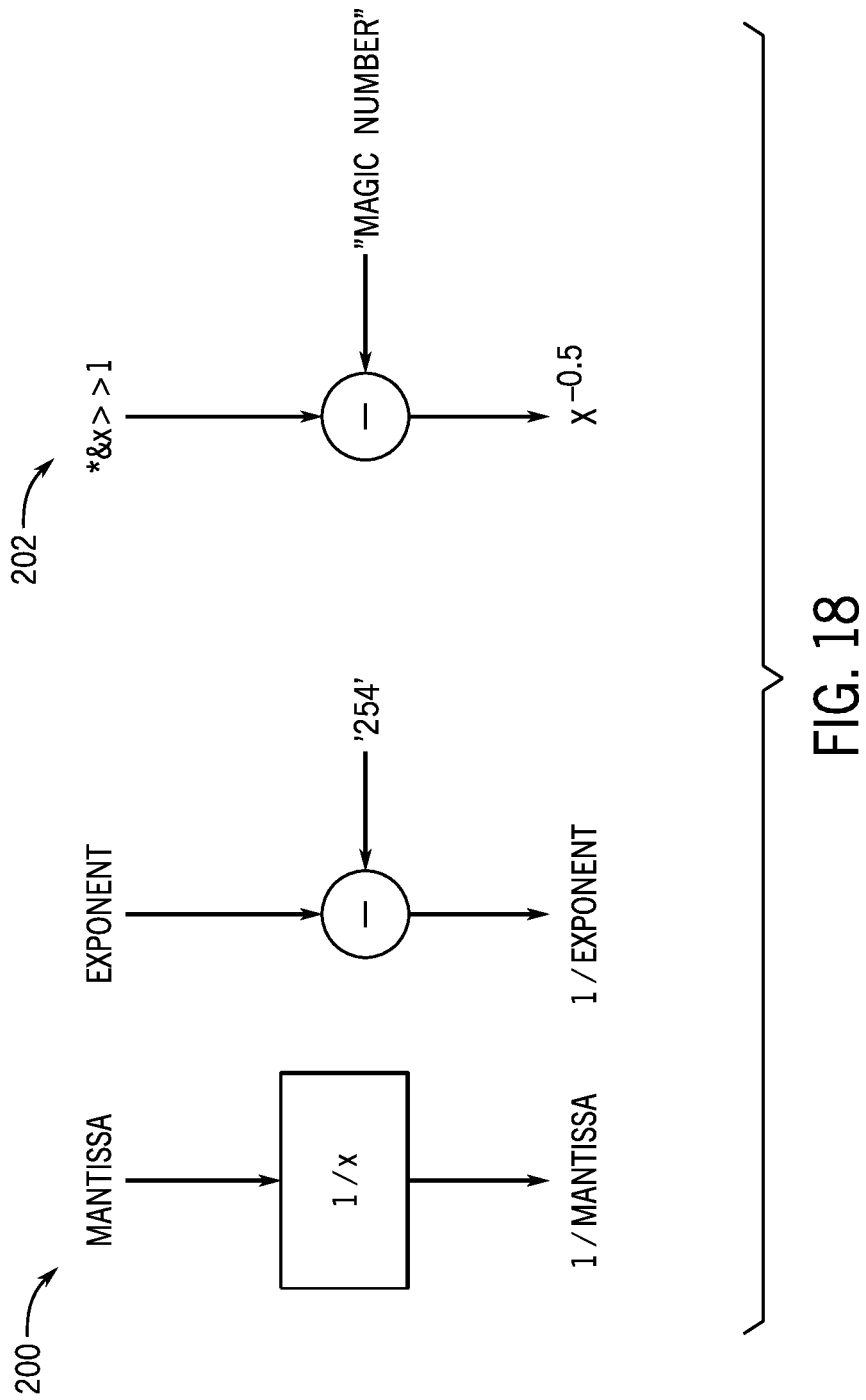
FIG. 18 illustrates how division and inverse square root operated may be performed using functional units included in a vector processing system, in accordance with an embodiment.

FIG. 18 illustrates the operation of the functional units 144E. For example, operation 200 illustrates how a division operation may be performed, and operation 202 illustrates how an inverse square root operation may be performed. The "magic number" is an inverse square root first constant that may be an estimation of a starting iteration used for a floating point inverse square root determination. The operations 200, 202 may be performed on data of various formats, such as, but not limited to FP32 and bfloat16.

Figure 19:
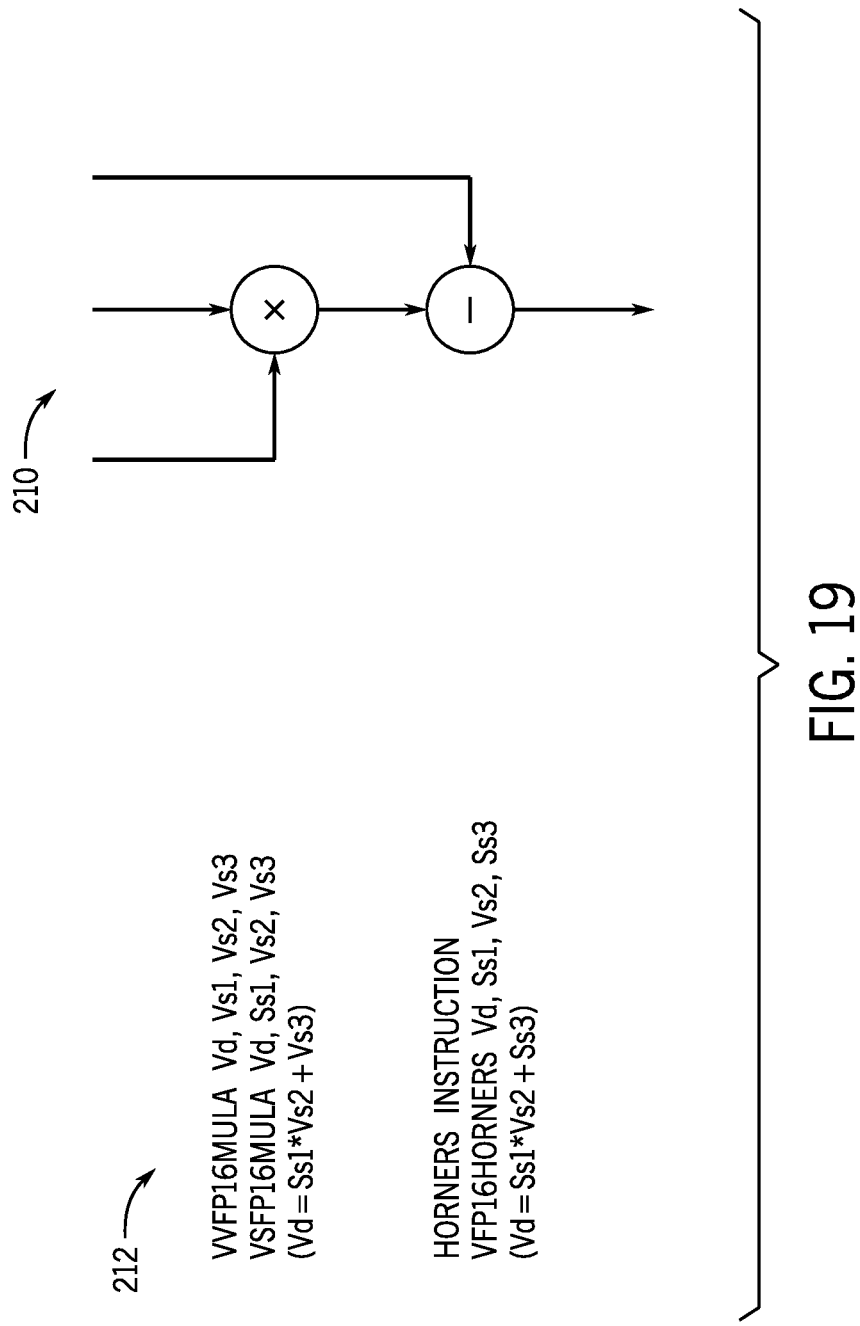
FIG. 19 illustrates circuitry that may be included in a functional unit of a vector processing system as well as operations that the circuitry may perform, in accordance with an embodiment.

FIG. 19 illustrates circuitry 210 that may be included in a functional unit 144 as well as operations 212 that the circuitry 210 may perform. The operations include a vector-vector multiplication and addition ("VVFP16MULA") involving bfloat16 values, a vector-scalar multiplication and addition ("VSFP16MULA") involving bfloat16 values, and a Horner's rule instruction, which may be utilized to expand polynomials (e.g., utilizing two scalars).

Figure 20:
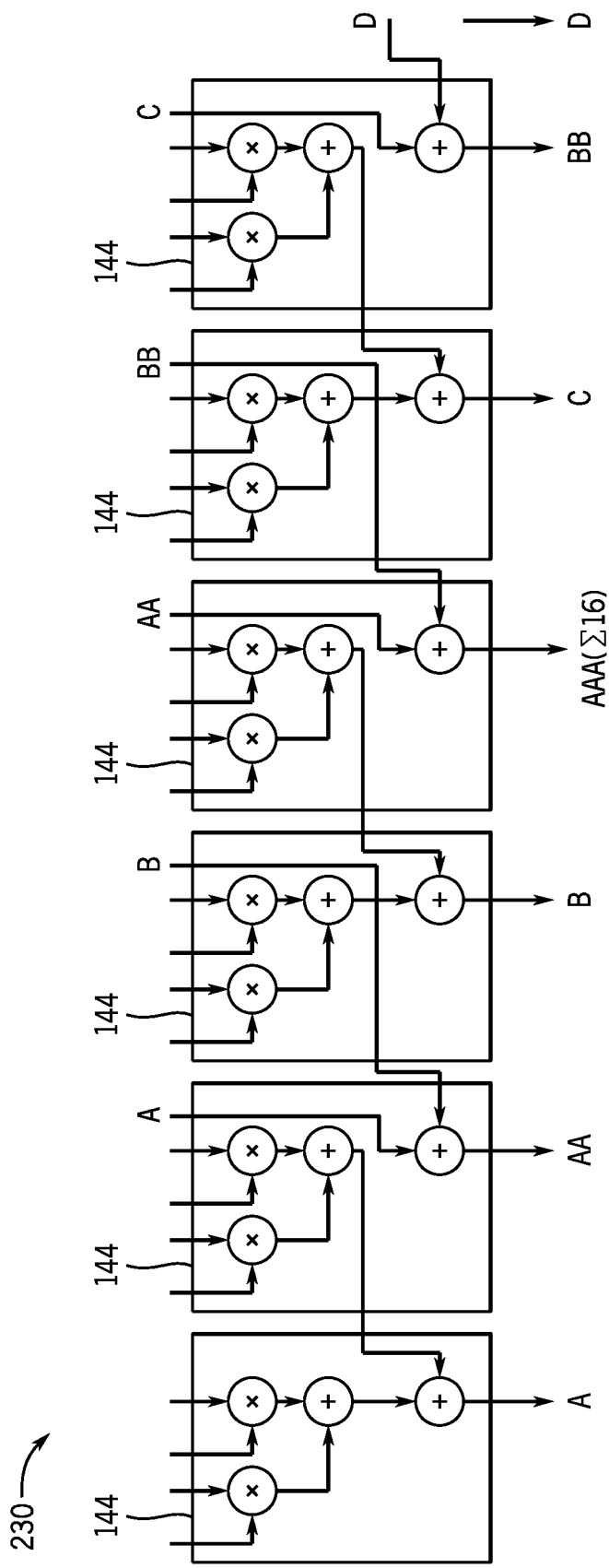
FIG. 20 is a block diagram of a chain of functional units of a vector processing system used to perform a reduction operation, in accordance with an embodiment.

The functional units 144 may also be utilized for reduction operations. For example, FIG. 20 illustrates a chain 230 of functional units 144 that may be included in a vector processing system 26 and utilized to perform reduction operations (e.g., utilizing a recursive dataflow). In particular, the chain 230 of functional units 144 may dynamically perform logarithmic reductions. For example, the chain 230 of functional units 144 may perform a 256 element reduction in approximately fifteen clock cycles. In the context of the operation 122, the chain 230 of functional units 144 may sum the values (e.g., 64 values) from the exponent operations in approximately ten clock cycles. The reduction operations that the chain 230 of functional units 144 may perform include, but are not limited to, sum and reduce (e.g., calculate a sum and perform a reduction on the sum), a max reduce (determine a maximum value), and a min reduce (determine a minimum value).

It should be noted that the portions of the various embodiments of the vector processing system 26 may be included in one another. For example, the vector processing systems 26C, 26D, 26E may be modified to include functional units 144 in each lane (e.g., as shown in FIG. 17). In other words, functional units 144 may be included vector processing units 66 inside of lanes 82 in vector processing systems 26.

Register Files and Vector Processing Unit Lanes

Returning briefly to FIG. 4, register files and vector processing unit lanes (e.g., lanes 82A, 82B) will now be discussed. The register files discussed herein may include the vector register files 81 (which may correspond to the vector registers 60 of FIG. 3) as well as scalar registers files (e.g., register files used for the scalar register 62 of FIG. 3). For example, as noted above the vector register files 81 are communicatively coupled to one or more lanes 82 of a vector compute unit 80, and vector operands may be supplied to the vector processing units 66 and functional units 79 of the lanes 82. The lanes 82 accept elements of the operand, perform computations on the elements, and output a resulting value. The resulting value may be provided to, and stored in, the vector register file 81.

With this in mind, the operations of the vector processing system 26B may be pipelined to improve the performance of the vector processing system 26B. In other words, as discussed below, various embodiments of portions of the vector processing system 26B, including the vector register file 81 and lanes 82 may be utilized to enable the vector processing system 26B and integrated circuit device 12 to more efficiently perform computations involving vectors. In other words, the integrated circuit device 12 may be customized to more efficiently or effectively perform vector operations (e.g., in comparison to or relative to other embodiments). For instance, in some cases, various approaches may be taken to minimize or reduce "chime," which is the number of clock cycles taken for a vector instruction to execute while also keeping "dead time" low. As used herein, "dead time" refers to the time taken to drain a lane 82 as the lane finishes a vector instruction and prior to being able to execute the next vector instruction to be performed by the vector processing unit 66 that is included in that lane 82. It some cases, communication across lanes 82 inside a vector compute unit 80 as well as communication between vector compute units 80 may be utilized.

Turning the discussion largely to the vector register file 81, the vector register file 81 is utilized to maintain vector data for a given vector compute unit 80. The vector register file 81 may supply operands to the lanes 82 of the vector compute unit 80 and store the outputs of the lanes 82. As noted above, the vector register file 81 may be implemented using on-chip memory included in the integrated circuit device 12, such as static RAM (SRAM). Keeping this in mind, several vector register file design options will be discussed below. However, before doing so, several parameters of the memory that may be utilized to implement the vector file register 81 will be described. Each of these parameters may be taken into consideration by a program designer when designing a vector processing system.

First, there is depth, which refers to the number of words that can be stored in a particular register file. In other words, the depth may represent the amount of data that a particular register can store. Second, there is width, which refers to the number of bits in each word. That is, the width may represent the size of the pieces of data that will be stored. The third parameter is the number of read and write ports.

Continuing with the drawings, FIG. 21 is a block diagram of a first register file organization 250A. As illustrated, a memory block 252A that stores a register file (e.g., vector register file 81) has two read ports 254A and a single write port 256A connected to a lane 82C. The register file includes contiguous vector elements. The vector processing unit 66 of the lane 82C may perform operations using one or two inputs received from the read ports 254A to generate a single output. The output may be stored in the memory block 252A via the write port 256A.

FIG. 22 is a block diagram of a second register file organization 250B in which a register file has been scaled to work with two lanes 82D, 82E. More specifically, the register file is organized into two banks (e.g., memory blocks 252B, 252C). Each of the memory blocks 252B, 252C has two read ports 254B and a single write port 256B connected to a lane 82 (e.g., one or lanes 82D, 82E). Vector elements are interleaved so each memory bank includes independent vector element groups. For example, odd elements may be stored in and read from memory block 252B, operated on by lane 82D, and outputs from the lane 82D may be provided to the memory block 252B for storage. Even elements may be stored in and read from memory block 252C, operated on by lane 82E, and outputs from the lane 82E may be provided to the memory block 252C for storage. Utilizing the second register file organization 250B may enable results to be more quickly determined compared to the first register file organization 250A because multiple lanes 82 are used to perform operations on inputs. However, relative to the first register file organization 250A, the second register file organization 250B occupies approximately double the amount of area on the integrated circuit device 12.

FIG. 23 is block diagram of a third register file organization 250C in which two lanes 82 (e.g., lanes 82F, 82G) are also used, but the register file is implemented as a single wide register file memory bank (e.g., memory block 252D). Each word in the memory bank 252D holds two vector elements. Thus, each read port 254C can supply two elements in a single read, and the elements are provided to the two lanes 82F, 82G (e.g., via decatenation circuitry 258). Similarly, results from the two lanes are concatenated (e.g., via concatenation circuitry 260) to form a full word to be written to the register file stored in the memory bank 252D.

The presently disclosed techniques enable register file organizations 250 to be utilized in a manner that makes efficient use of memory resources that may be included in the integrated circuit device 12. For example, in one embodiment in which the integrated circuit device 12 is a programmable logic device such as an FPGA, register file organizations 250 may utilize memory that is configurable to support 1000 20-bit registers (e.g., an M20K register file) or 512 40-bit registers. Thus, the depth (e.g., number of registers) and width (size of each register) may be configurable to flexibly support various data types (e.g., based on word size). For instance, to store FP32 values, a single memory block having registers that are forty bits wide may store up to 512 values. Alternatively, two memory blocks having registers that are twenty bits wide may be utilized in parallel to support FP32 values. Furthermore, a single pipeline stage may be used to perform operated reads. For example, if a vector register file uses multiple memory blocks and data is to be routed (e.g., via soft logic of the FPGA) to multiple lanes 82, pipelining may improve implementation frequency. For instance, multiple pipeline stages may be utilized to read operands and write back outputs of the lanes 82. It should also be noted that multiple memory blocks may be utilized to implement deeper register files. For example, to support more than 512 vector registers, multiple memory blocks of the integrated circuit device 12 may be utilized. Utilizing a deeper vector register file enables a longer pipeline and longer chime to be supported because the vector register file can be used to execute long vectors as a sequence of operation on several vector subsets. As such, pipeline ramp-up time may be amortized, thereby improving overall efficiency of the integrated circuit device 12.

Furthermore, vector register files may include mixed precision elements. That is, data having different widths (e.g., number of bits) may be included in a vector register file. For example, a single register file may include various precisions of fixed point values, floating point values, or a combination thereof. As another example, a single register file may include FP32 values or INT8 values, which may both be 32-bit vector elements (e.g., when four INT8 values are used).

Instructions dictate the operation to be performed on a particular vector element and the precision involved in such an operation. For instance, based on instructions and element width, various amounts of elements may be read in a single cycle. For example, a 32-bit wide read port can read a single FP32 value, two bfloat16 values, or four INT8 values in a single cycle.

Moreover, the memory blocks utilized for the vector register files may be set based on target precisions. For instance, if the end user wishes to target applications using INT8 precision, the end user may choose to pack five INT8 values onto a single read port of a data block that includes 40-bit registers over another type of memory block that, if used, would have unused bits. As another example involving FP32 values, five FP32 values (having 160 total bits) may be stored in four 40-bit registers as opposed to using one 40-bit register to store a single FP32 value, as doing so would result in eight bits of the register used to the single FP32 value being unused.

Furthermore, in-line casting operations may be performed when vector register file read and write operations are performed. That is, the integrated circuit device 12 may perform precision conversions when reading or writing data. In one embodiment, casting may be performed by logic included on the integrated circuit device 12 (e.g., soft logic of an FPGA) or by memory itself (e.g., on-chip memory included in the integrated circuit device 12 or memory communicatively coupled to the integrated circuit device 12). Accordingly, values of one precision may be read from a vector register file, converted to another precision, and the values of the other precision may be utilized when performing operations (e.g., in lanes 82). The resulting value(s) may be converted back to the original precision and stored in the vector register file with the original precision.

Figure 24:
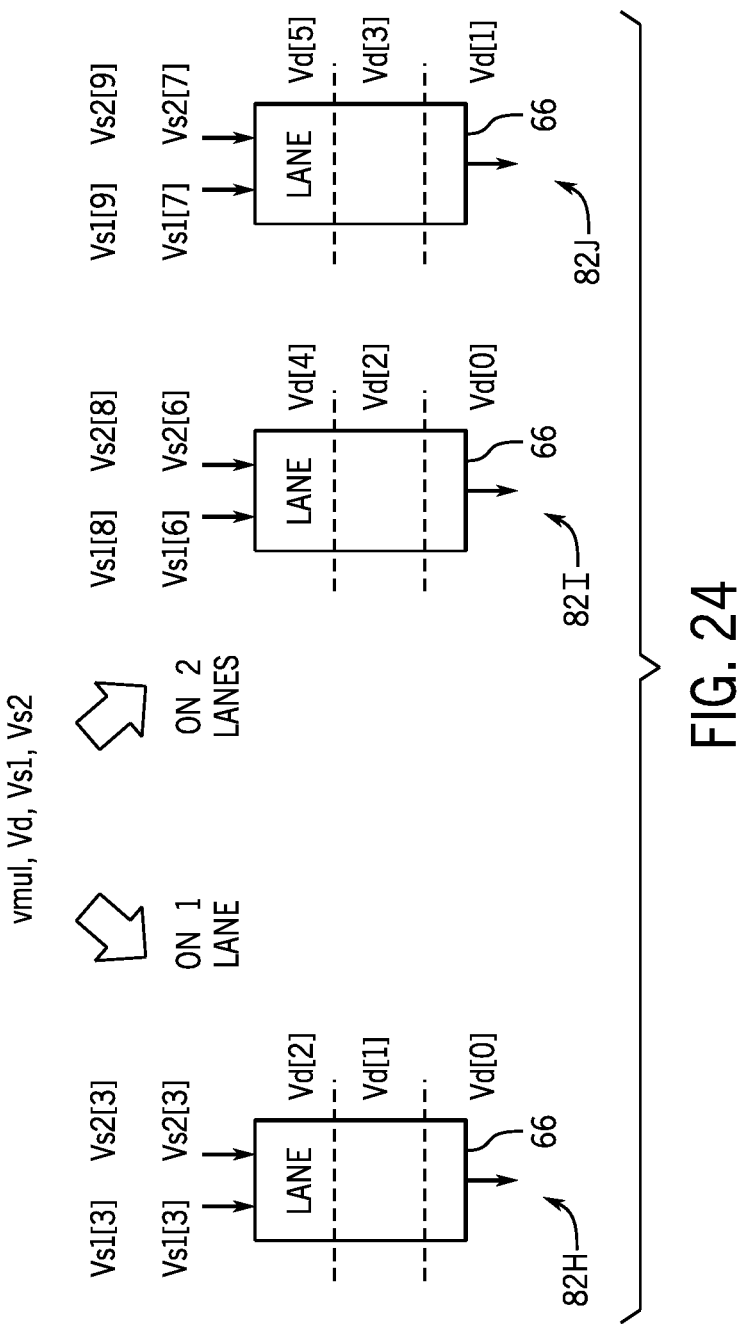
FIG. 24 illustrates utilizing lanes to scale performance of the vector compute units of vector processing systems, in accordance with an embodiment.

Continuing with the drawings, FIG. 24 illustrates utilizing lanes 82 to scale performance of the vector compute units 80. In particular, FIG. 24 includes a single lane 82H that may perform operations on inputs (e.g., values received from a vector register file 81) as well as two lanes 82I, 82J that may also be utilized to perform operations on inputs. Because elements of a vector are independent, the elements can be partitioned and assigned to one or more lanes 82. For example, performance may be scaled by instantiating multiple lanes, and independent vector elements may be computed simultaneously by the lanes 82. As such, a single vector instruction can invoke many operations and utilize the number of lanes 82 available in the vector processing unit 66. The partitioning of vector elements into lanes can be done by interleaving vector elements so that they can be stored and operated on as independent element groups.

Bearing this in mind, FIG. 24, more specifically, illustrates two potential implementations for performing a single vector instruction (vmul) that reads two vectors (Vs1, Vs2) and produces a write output vector (Vd). In one embodiment, a single lane 82H is used to execute the instruction. In such an embodiment, each vector element is assigned to the lane 82H, and the vector register file keeps all vector elements as well. In another embodiment also illustrated in FIG. 24, two lanes 82I, 82J are used to perform the instruction. In particular, lane 82I is assigned even vector elements, and lane 82J is assigned odd elements. These odd and even groups are purely independent and can be operated on in parallel by the two lanes (and kept on separate vector register files, as discussed above).

Keeping the discussion of FIG. 24 in mind and returning briefly to FIG. 4, the lanes 82 are highly customizable to enable operations to be performed using a particular configuration. For instance, functional units 79 can be composed to perform other operations (e.g., operations more complex than multiplication and addition), thereby improving efficiency because a single register file read into a lane 82 may be used in multiple dependent operations that occur within several functional units 79 within a lane 82. However, as will be discussed below, when fewer functional units 79 are included in a lane, such complex operations may still be performed by performing multiple vector instructions (e.g., multiple fetch, decode, and vector register file read operations).

Moreover, the number of functional units 79 and connections across functional units 79 (e.g., via interconnect circuitry 84) are customizable depending on target vector processor instances. For example, a lane 82 can include a single functional unit 79 or many functional units 79 (e.g., five functional units 79, ten functional units 79, dozens of functional units 79, or over one-hundred functional units 79). Furthermore, interconnects enable more data to move between functional units 79 of a lane 82. The type of interconnect instantiated on a vector processing system 26 implemented on the integrated circuit device 12 (or partially implemented on the integrated circuit device 12) can be customized as desired by an end user or designer. For instance, there may be cascading functional units 79 with fixed ordering to a configurable crossbar or other routing circuitry that can dynamically decide the order of operations to be performed on the function units 79.

The control logic 83 is programmable and may manage the interaction and operations of functional units 79 based on the executed instruction. Control can be exposed as ISA architectural states and driven dynamically by instructions, thereby enabling flexible customized operations to be invoked on the lanes 82 of vector processing systems 26 via software.

Furthermore, inter-lane links 85 facilitate connections across lanes 82. Lanes 82 may interact and perform coordinated processing, such as for reduction operation discussed above or coarse tensor operations discussed below. For such cases, inter-lane links 85 can be established across lanes 82. The link could be for moving data across lanes 82, (for instance, to transfer intermediate results produced by one lane 82 to a neighboring lane 82) or for in-line computing (e.g., accumulation). As different instances of vector processing systems 26 can be customized for different user goals (e.g., optimized for different application domains), the choice of what links or whether any inter-lane links 85 are to be used could be made by the user of the integrated circuit device 12.

Figure 25:
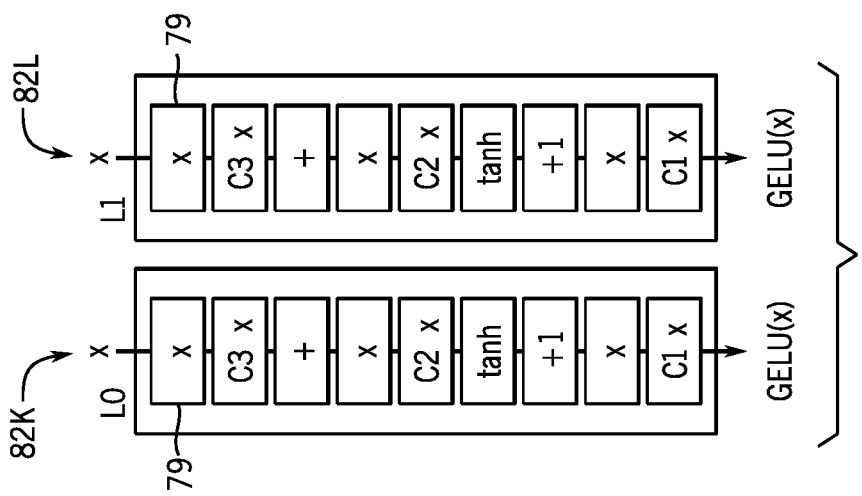
FIG. 25 illustrates lanes that each include fully cascaded sets of functional units utilized to perform a GELU operation, in accordance with an embodiment.

There are many customization and design options possible when choosing an implementation of a vector processing system 26 to use, such as type and number of functional units 79, what interconnect to use, and what dynamic programmability to support. A vector processing system instance would tailor the customization and design options to the user-desired goal. For example, if there is a specific target application domain, then the type of functional units 79 can be optimized for commonly used operations in the domain. If the target is to use minimal FPGA area/resource, an instance can choose a simple design without inter-lane links and only one functional unit. If the target is more general purpose, and need to cover many operations, perhaps a more software programmable lane could be desired so that a single vector processor instance can serve wide range of applications. To help further discuss customization, FIGS. 25-27 will now be discussed. More specifically, FIGS. 25-27 each illustrate one or more lanes 82 utilized for carrying out a gaussian error limit unit (GELU) operation, which can be performed in accordance with Equation 1 provided below:

$$GELU(x) = c_1 \times x \times (1 + \tanh(c_2 \times x \times (1 + c_3 \times x \times x))) \quad \text{Equation 1}$$

where $c_1$, $c_2$, and $c_3$ are constants. In particular, FIG. 25 illustrates lanes 82K, 82L that each include fully cascaded sets of functional units 79. In other words, an input (e.g., x) is received by a first functional unit 79 that performs an operation (e.g., multiplication) involving the input to generate an intermediate result, which is provided to a subsequent functional unit 79 for further processing. Such a chain of operations continues until a final functional unit 79 in a lane 82 generates an output (e.g., GELU(x)). In the example provided in FIG. 25, a single register file read of the input can be made per lane 82, and the functional units 79 perform the GELU operation in a single pass through the lane 82. With two lanes 82K, 82L available, the illustrated implementation can produce two GELU results per cycle.

Figure 26:
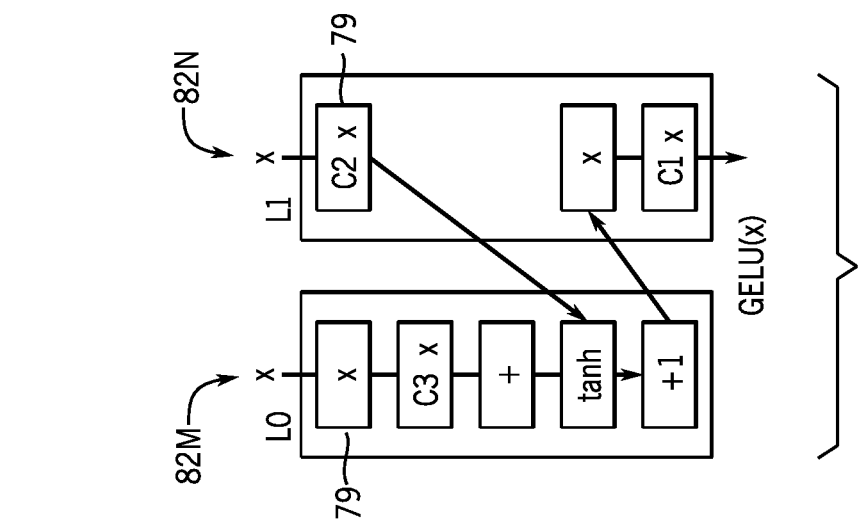
FIG. 26 illustrates another implementation of the GELU function in which lanes each perform portions of a single GELU operation to produce one output, in accordance with an embodiment.

FIG. 26 illustrates another implementation of the GELU function in which lanes 82M, 82N each perform portions of a single GELU operation to produce one output (e.g., GELU(x)). In particular, the lanes 82M, 82N may share data with one another via inter-lane links, as discussed above, such that one lane 82 may receive an input from another lane and perform one or more operations (via functional units 79). As such, the GELU operation is divided into various portions that are performed via the lanes 82M, 82N. In this case, an input may be read by both lanes 82M, 82N once, and the lanes 82M, 82N can produce one GELU result per cycle. Accordingly, multiple lanes 82 may be utilized to perform a process (e.g., a GELU operation) that results in a single output.

Figure 27:
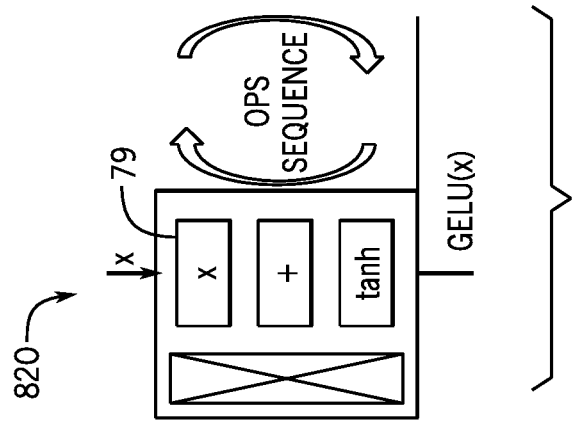
FIG. 27 is a block diagram of another lane that may be used to perform a GELU operation, in accordance with an embodiment.

FIG. 27 illustrates a lane 820 that with a minimal number of functional units 79 (e.g., one functional unit 79 used for multiplication, one functional unit 79 utilized for addition, and one functional unit used for hyperbolic tangent (i.e., tanh) operations) utilized to perform a GELU operation. In other words, lane 820 includes one functional unit 79 for each operation type used in to perform a GELU operation. Control circuitry (e.g., control logic 83) may sequence the operation in time to complete the GELU operation. For example, as each portion of the GELU operation is performed, an output may be generated and rerouted via the control circuitry so that a subsequent operation can be performed by the functional unit 79 able to perform that operation. As such, the GELU operation would use more than one cycle to complete. However, as can be seen by comparing FIG. 27 to both FIG. 25 and FIG. 26, the lane 820 is simpler (e.g., includes fewer functional units 79) compared to lanes 82K, 82L, 82M, 82N.

Before continuing with other features supported by the lanes 82 it should be noted that the GELU operation is provided as an example of one operation that vector processing systems 26 may perform. Examples of other operations that the vector processing system 26 may perform (e.g., using vector processing units 66 of lanes 82) are the rectified linear activation function (RELU), a hyperbolic tangent operation (Tanh), sigmoid functions, activation functions, the exponential linear unit (ELU) function, an Max out functions. Accordingly, logic of the integrated circuit device 12 (e.g., hard logic such as one or more DSP blocks) may be utilized to support a variety of operations and functions.

Lanes 82 may also support in-lane operations involving data of different widths. For instance, as noted above, the vector processing system 26 supports several data types, including, but not limited to, INT8, FP32, bfloat16. The lanes 82 can also operate on a pack of elements, which may be thought of as being a small vector. As an example, a lane that supports 32-bit data operands could compute an FP32 element or a 4-element INT8 vector. Another example is a lane 82 with an 80-bit read port in which 10 INT8 values may be read and used as operands in circuitry utilized to implement at least a portion of a vector processing system 26. For example, an FPGA may include logic (e.g., soft logic, hard logic, or a combination thereof) that implements a tensor block that can determine dot products using the ten INT8 values as inputs. For example, each of the ten INT8 values may be multiplied by another value (e.g., a value pre-loaded into the tensor block) to generate ten different values (e.g., as part of determining a dot product).

Figure 28:
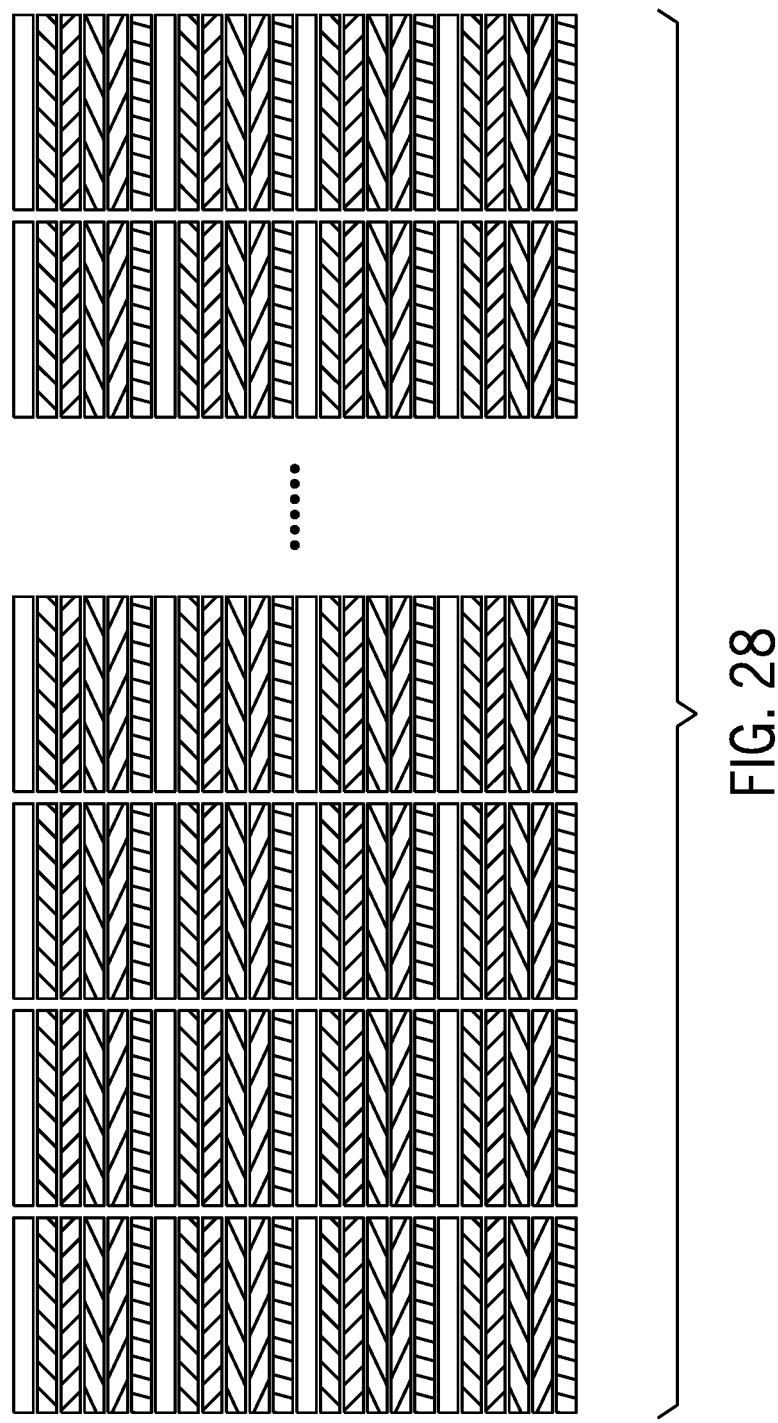
FIG. 28 illustrates a first manner of stacking vector registers, in accordance with an embodiment.
Figure 29:
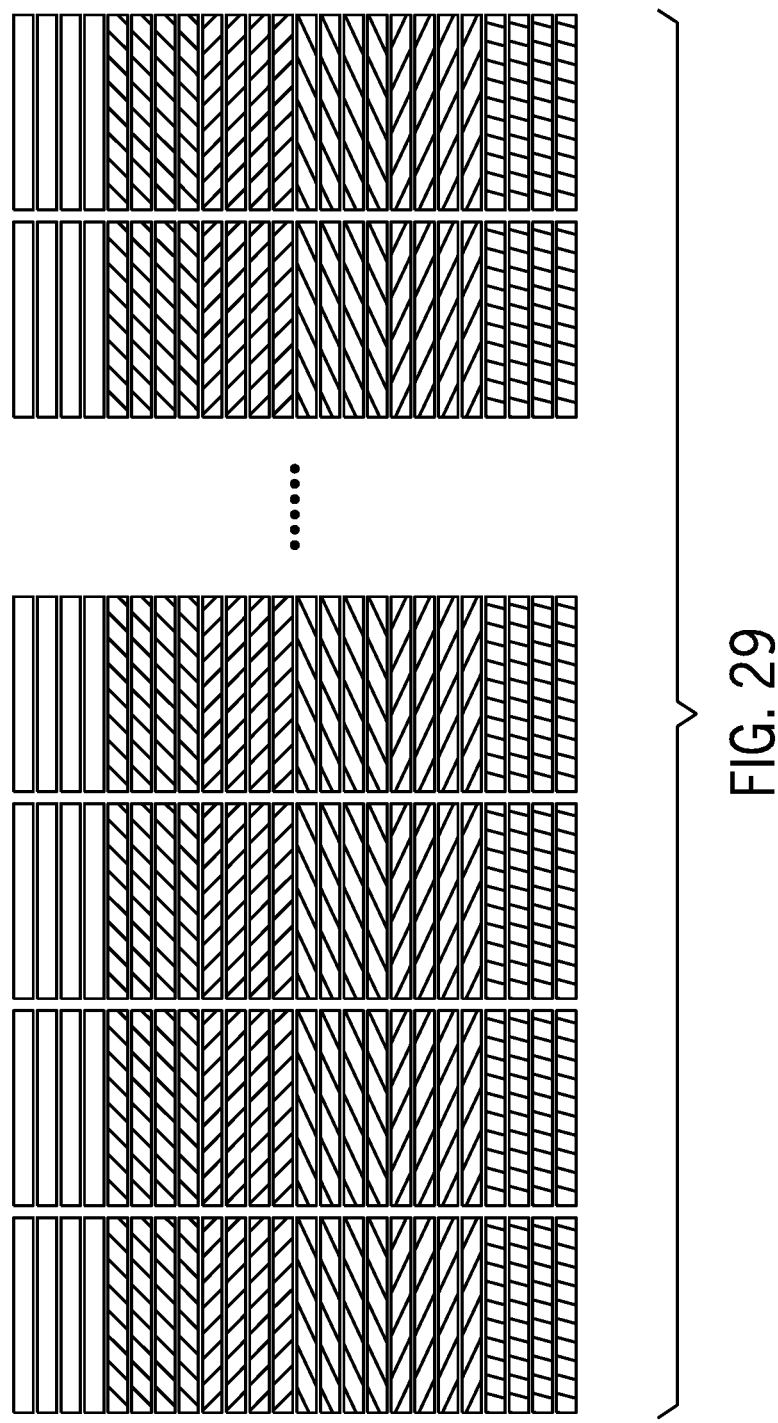
FIG. 29 illustrated a second manner of stacking vector registers, in accordance with an embodiment.

In many cases, there may be as many lanes 82 as there are vector elements. This may enable the integrated circuit device 12 to more quickly perform the operations (e.g., vector or scalar operations) associated with the vector elements (e.g., as opposed to using a lane to perform elements for multiple vector elements). For instance, in some cases there may be fewer lanes 82 than the number of vector elements. This can be implemented as virtual lanes based on the memory-based register file (e.g., that may include the vector registers 60). For example, in a case with sixty-four registers of 256 vector elements (e.g., 32-bit values) and thirty-two lanes 82, each vector register 60 may be stacked over eight locations (due to 256 divided by thirty-two being right). As illustrated in FIG. 28 and FIG. 29, the vector registers 60 may be stacked in different ways. For example, in FIG. 28 and FIG. 29, each box is representative of a vector element, with each column of vector elements being vector elements of a given lane 82, and each shading or hashing pattern representing one register (e.g., for a given column). In this manner, there may be multiple copies of data stored in parallel memories, thereby enabling the data to be accessible from multiple locations (e.g., lanes 82) at any particular clock cycle. As such, operations in which data is read from multiple registers (e.g., vector-vector multiplication, which involves vector elements being read from multiple registers) can be performed in a single clock cycle.

Furthermore, before continuing to discuss how DSP blocks may be controlled, it should be noted that the vector processing system 26 may perform out-of-order processing. Out-of-order processing is a computer architecture technique that allows instructions to be executed out of program order. For instance, out-of-order processing may be used when instructions execute with varying level of latencies. For example, a memory load operation that does not read from a cache may take many cycles to read data from off-chip memory. If there is an independent add instruction after this load instruction, it cannot execute until the load completes. An out-of-order execution allows the add instruction to execute even while the load miss is being serviced. Accordingly, the vector processing system 26 may perform in-order processing as well as out-of-order processing.

As discussed above, the vector processing units 66 may be implemented using hard logic included on the integrated circuit device 12, such as in DSP blocks of the integrated circuit device 12. To enable the DSP blocks to perform different instructions, the DSP blocks (and, thus, vector processing units 66) are dynamically configurable to enable the DSP blocks to execute instructions. In other words, each DSP block of the integrated circuit device 12 are dynamically configurable to operate in a mode for a given instruction that will be executed by the DSP block. With this in mind, three examples of controlling a DSP block are discussed below with respect to FIGS. 30-32.

Figure 30:
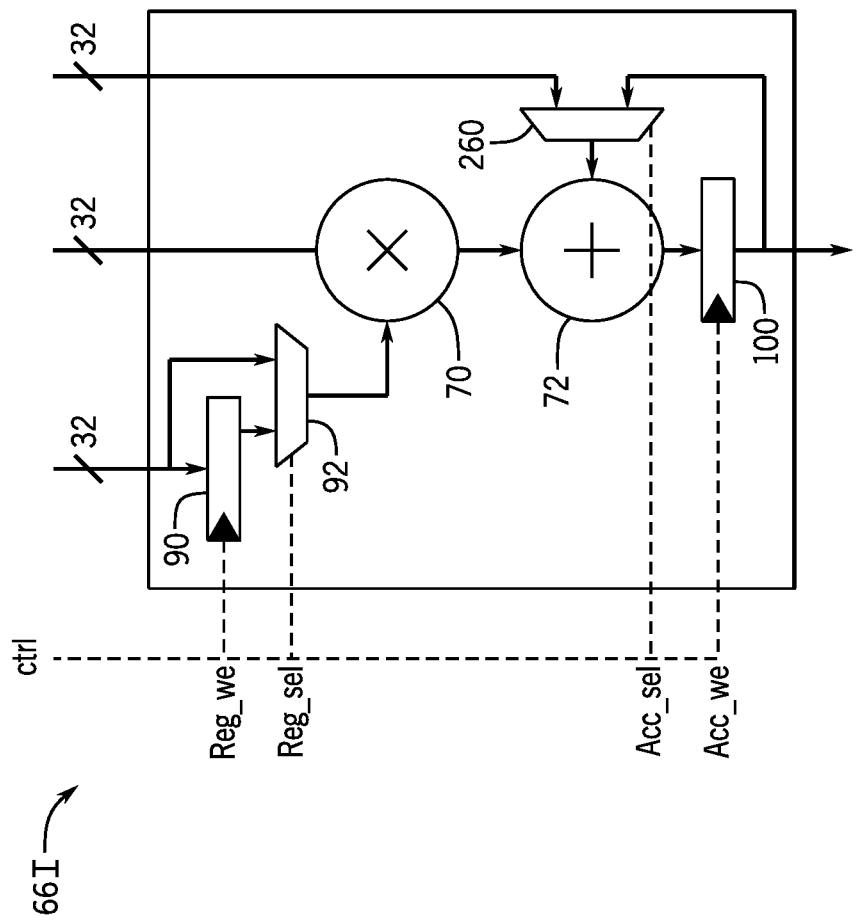
FIG. 30 illustrates how circuitry within a vector processing unit may be controlled, in accordance with an embodiment.

FIG. 30 illustrates a vector processing unit 66I that is somewhat similar to the vector processing units 66B, 66C discussed above. In particular, in comparison to the vector processing unit 66C, the vector processing unit 66I includes a multiplexer 260 that may receive two inputs: one input from circuitry outside of the vector processing unit 66I (e.g., a value from a vector register 60) and a second input from the register 100, which may be used for accumulation. In this example, the vector processing unit 66I receives control signals ("ctrl") via an external input. In other words, a DSP block (e.g., that is used to implement the vector processing unit 66I) may receive control signals from control circuitry included in the integrated circuit device 12. In this case, soft logic of the integrated circuit device 12 can drive the control directly through these inputs. As shown, the signals may include a write enable ("Reg_we") signal that enables data to be written to the register 90, a register select ("Reg_sel") signal that enables the multiplexer 92 selected a particular input to output, an accumulate select ("Acc_sel") signal that enables a particular input to the multiplexer 260 be to selected as the output, and an accumulate write (Acc_we) signal that enables data to be written to the register 100. In this manner, data may be selectively written and used for operations to be performed by the vector processing unit 66I.

Figure 31:
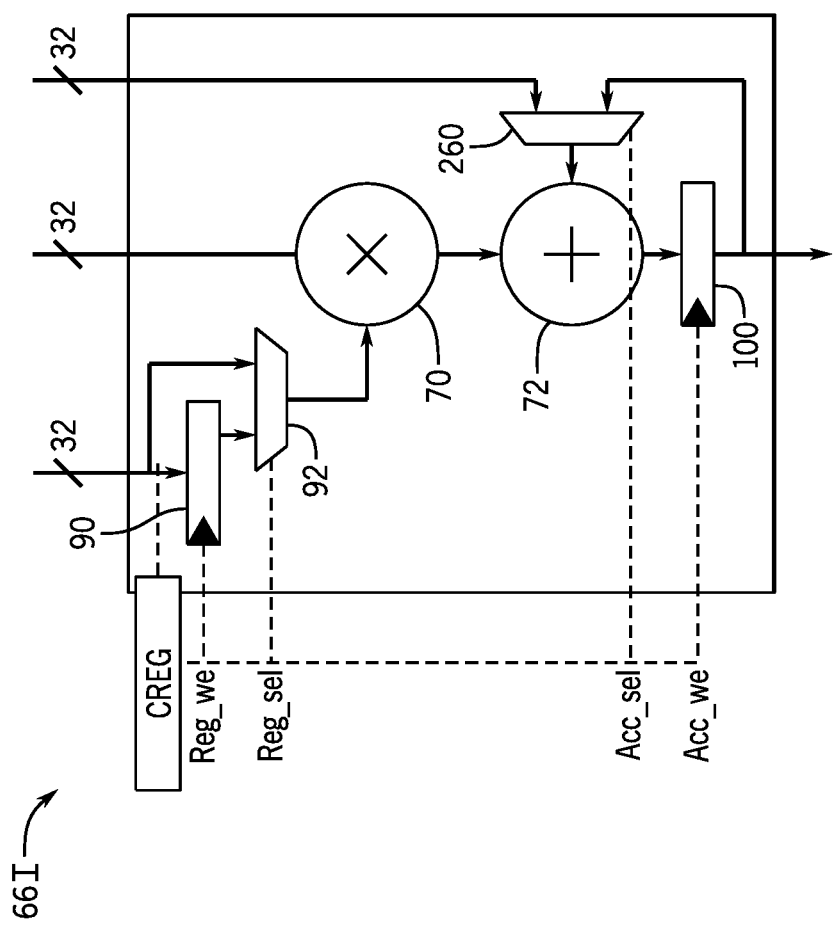
FIG. 31 illustrates how circuitry within a vector processing unit may be controlled, in accordance with an embodiment.

Another option for controlling the vector processing unit 66I is to use the existing set of control inputs but share some of the inputs to bring in control signals, which are then registered in the vector processing unit 66I. This is illustrated in FIG. 31. In other words, the vector processing unit 66I (or DSP block utilized to implement the vector processing unit 66I) may include a control register ("creg") that receives control signals and causes circuitry in the vector processing unit 66I to be controlled accordingly. Any subsequent operation would follow the mode as configured by the registered control. In this case, vector instructions could first set this control register, and then the vector processing unit 66I may perform operations on the vector elements based on the configured mode.

Figure 32:
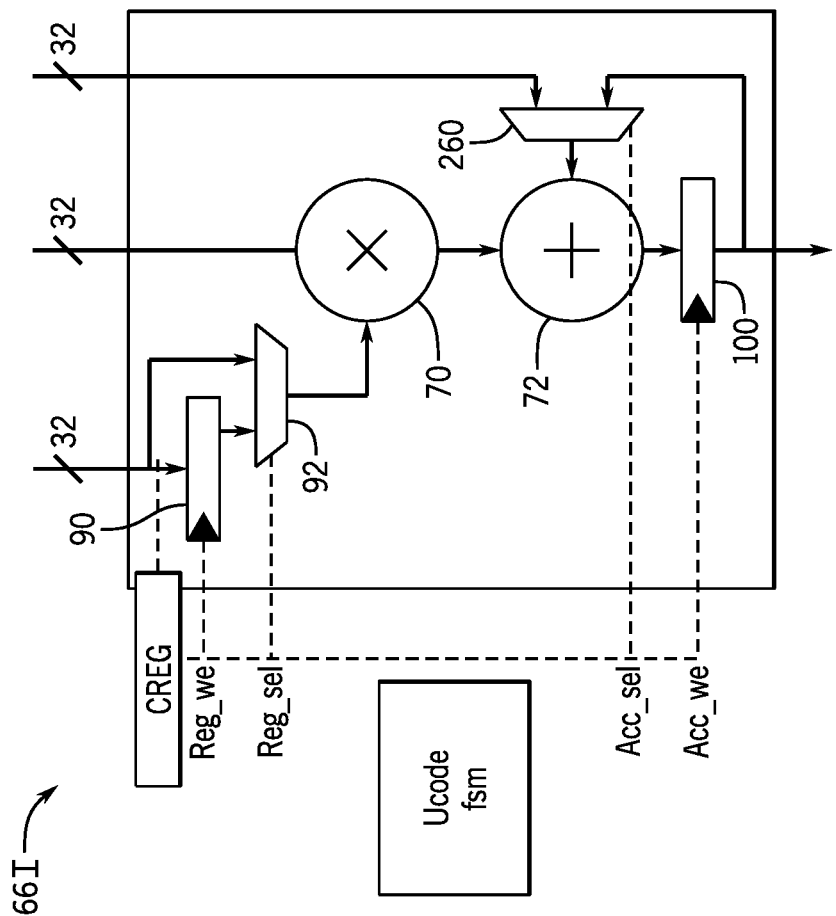
FIG. 32 illustrates how circuitry within a vector processing unit may be controlled, in accordance with an embodiment.

As discussed above, vector processing units 66 may perform a sequence of operations over time. This may involve switching among different modes in different cycles. Turning to FIG. 32, in such a case, a sequencer unit (indicated by "Ucode fsm") in the vector processing unit 66I may be programmable, such as through micro-codes, to cause the vector processing unit 66I to switch modes of operation to perform a sequence of operations. Such a form of control may be useful for performing the GELU function described above. Utilizing the sequencer unit may also reduce the amount of soft logic utilized to implement complex control sequences outside of the vector processing units 66.

Handling Hazards

As with other architectures, several types of hazards may occur during operation of the vector processing system 26. Such hazards include read-after-write, write-after-read, and write-after-write hazards.

A read-after-write hazard occurs when an instruction consumes an input operand that is produced by an older instruction. To read the input operand, the instruction needs to ensure that it reads the latest value as produced by the older instruction. However, if the older instruction has not yet written back the result, then a hazard resolution may be performed (e.g., stalling until older instruction writes the result, or forward the result using bypass paths) to prevent a read-after-write hazard from occurring.

A write-after-read hazard is where an instruction writes to a register that an older instruction is reading from. If both instructions execute concurrently, the vector processing system 26 ensures the older instruction has read the input operand that it uses prior to performing the write to prevent a write-after-read hazard from occurring.

A write-after-write hazard is similar to a write-after-read hazard, but it is for an instruction that writes to a register that is also the write target of an older instruction. If both instructions execute concurrently, the vector processing system 26 ensures the proper write order is performed, thereby preventing a write-after-write hazard from occurring. Indeed, as discussed below, the vector processing system 26 may resolve read-after-write, write-after-read, and write-after-write hazards.

Various techniques may be undertaken to resolve hazards. One way to solve hazards is to wait until a hazard no longer exists. For example, the integrated circuit device 12 may stall and wait before reading from a register until an older instruction that produced a result to that register has written its result to the register. As another example, the integrated circuit device 12 may implement bypass or forward paths to enable a computation result to be directly read by consumer unit (e.g., a DSP block) without having to wait for the result to be written back to the register file. Keeping this latter example in mind, the vector processing system 26 may utilize chaining, which is a type of forwarding in which a result produced by an older instruction that is needed by a younger instruction is directly consumed through chaining paths across vector processing units 66.

To help explain chaining and how the vector processing system may perform chaining, an example will now be discussed. The example involves the following instructions:

$I_0$: Vadd $V_1$, $V_2$, $V_3$
$I_1$: Vadd $V_5$, $V_1$, $V_4$ where $I_0$ is a first instruction, $I_1$ is a second instruction, Vadd is a vector addition operation that outputs a vector (e.g., $V_1$ or $V_5$), and $V_1$, $V_2$, $V_3$, $V_4$, and $V_5$ are vectors. Thus, $V_1$ is the sum of $V_2$ and $V_3$, and $V_5$ is the sum of $V_1$ and $V_4$. Accordingly, $I_1$ is dependent on $I_0$ because $I_1$ uses the output of $I_0$ (i.e., $V_1$) as an input. This may lead to a read-after-write hazard.

Figure 33A:
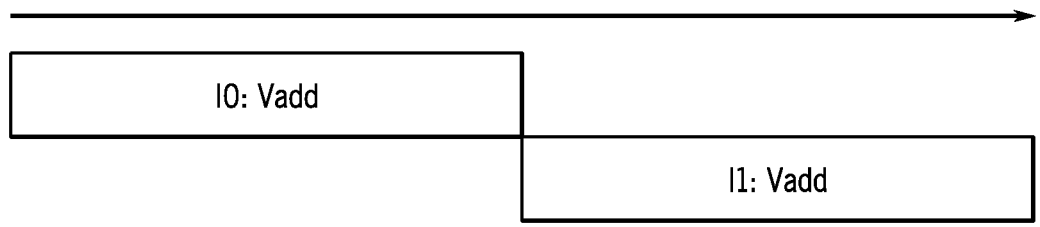
FIG. 33A illustrates the timing of the execution of two instructions when chaining is not employed, in accordance with an embodiment.
Figure 33B:
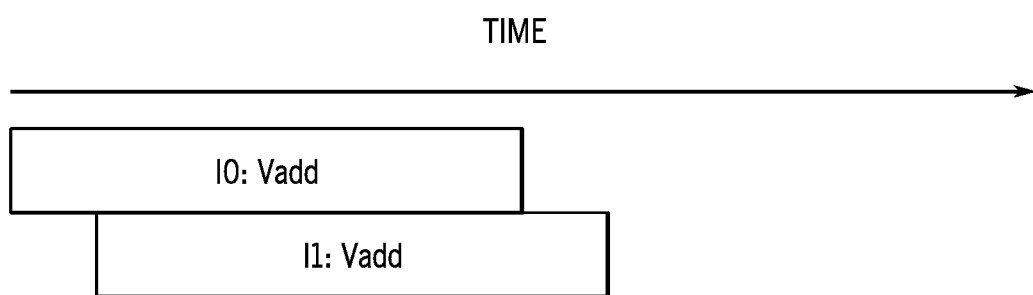
FIG. 33B illustrates the timing of the execution of two instructions when chaining is employed, in accordance with an embodiment.

FIG. 33A illustrates the implication of such a data dependency without chaining. Indeed, as shown in FIG. 33A, the second operation $I_1$ is not executed until the first operation $I_1$ has been completed (and the output is written). FIG. 33B illustrates how operations $I_0$ and $I_1$ may be performed in less time when chaining is utilized. More specifically, a vector processing unit 66 performing $I_1$ may begin to receive portions of the output (i.e., $V_1$) of another vector processing unit 66 as the output is generated. This allows parallel execution of $I_0$ and $I_1$ and reduces overall execution time of the instructions.

Figure 34:
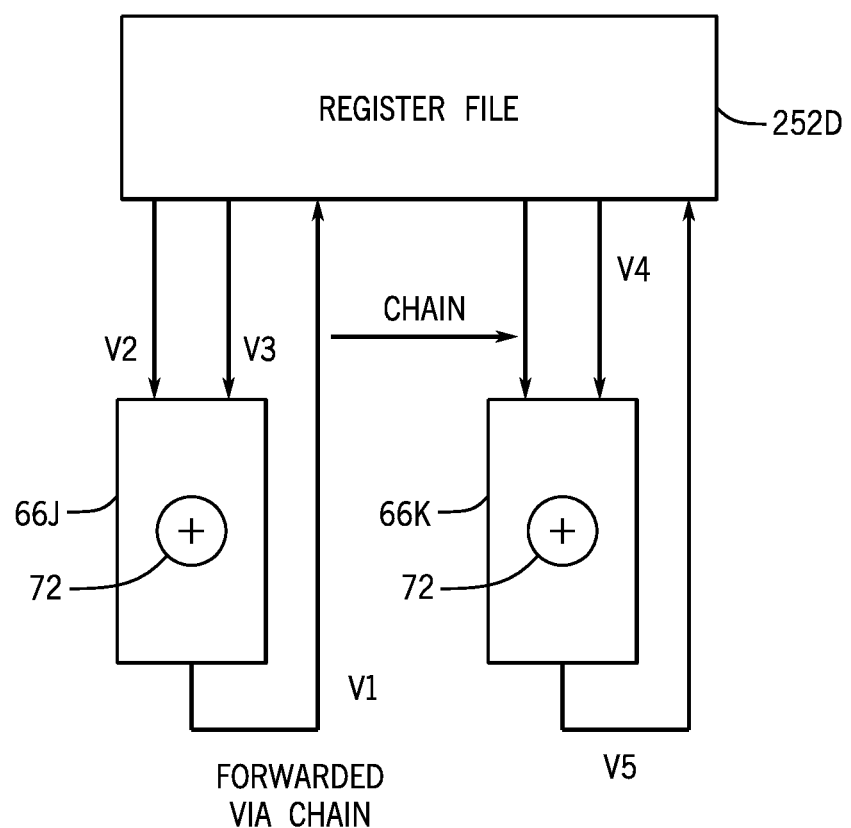
FIG. 34 is a block diagram of an architecture that may enable chaining, in accordance with an embodiment.

FIG. 34 depicts an example architecture for chaining. As illustrated, $I_0$ is executed by vector processing unit 66J, and $I_1$ is executed by vector processing unit 66K. Both the vector processing unit 66J and the vector processing unit 66K receive operands from a register file 252D and write results back to the register file 252D. Additionally, a chaining path is implemented between the output of the vector processing unit 66J and the input of the vector processing unit 66K. Hence, the vector processing unit 66K may begin to utilize a portion of the output of the vector processing unit 66J without the result being written to the register file 252D. Furthermore, the vector processing system 26 may be customized with fully chained support across vector processing units 66 and lanes 82 by fully implementing inter-lane and inter-unit links (as described above). Indeed, chaining may be implemented using soft logic on the integrated circuit device 12. As discussed below, there are several other manners in which chaining may be implemented.

Figure 35:
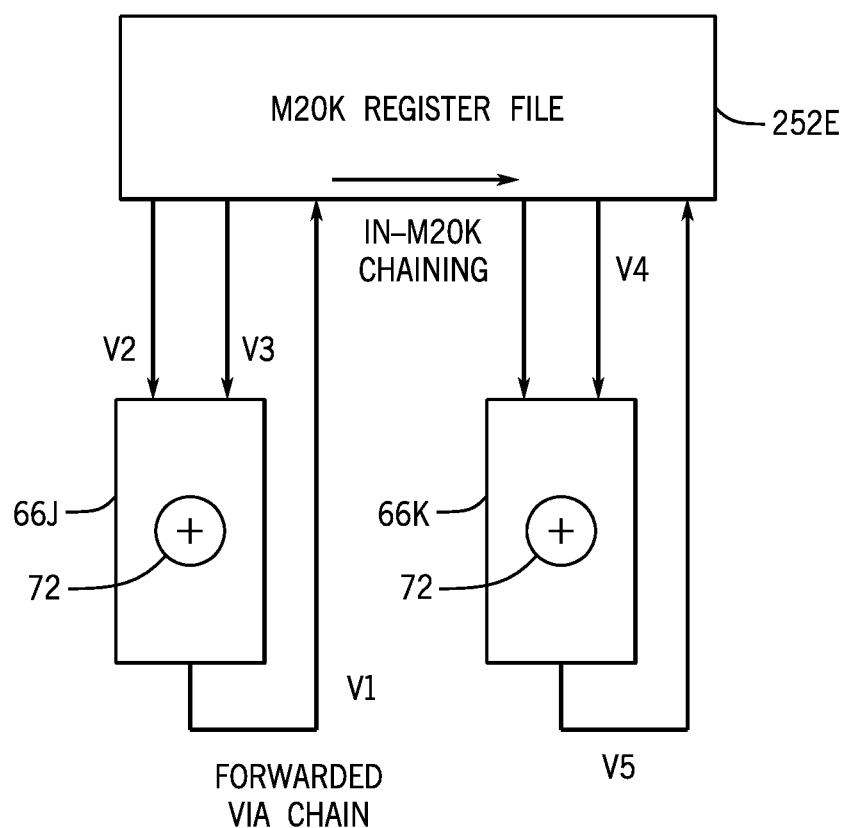
FIG. 35 illustrates chaining via a register file, in accordance with an embodiment.

First, as illustrated in FIG. 35, is chaining via a register file 252E (e.g., an M20K register file). In particular, an M20K mode that enables write values to be bypassed to read ports is utilized, thereby enabling register files implemented in M20K registers to interface with other vector processing units 66 and lanes 82. Control logic that may be included in the vector processing system 26 may determine that data written back to the register file 252E should be chained to another vector processing unit 66 (e.g., vector processing unit 66K) that reads the data, and the M20K internal bypass is used to enable the vector processing unit 66K to receive data output by the vector processing unit 66J more quickly.

Figure 36:
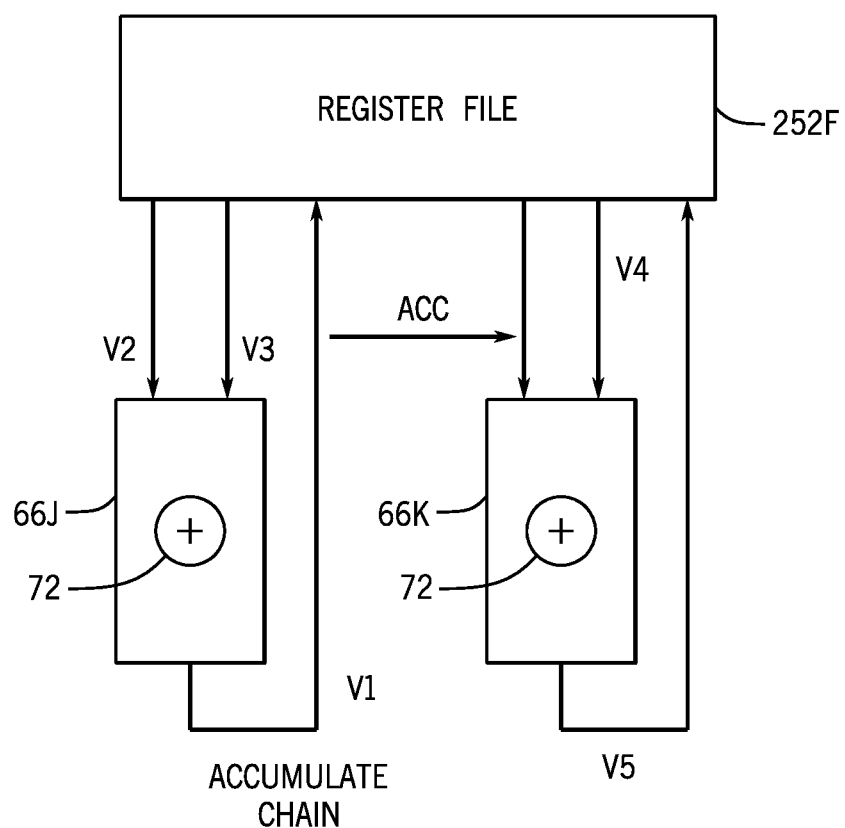
FIG. 36 illustrates a chained accumulate operation, in accordance with an embodiment.

Continuing to FIG. 36, another form of chaining is a chained accumulate operation. In this operation, operands forwarded across vector processing units 66 are accumulated. Thus, data is not only forwarded, but the data is also operated on (i.e., accumulated) before being provided to another vector processing unit 66.

Figure 37:
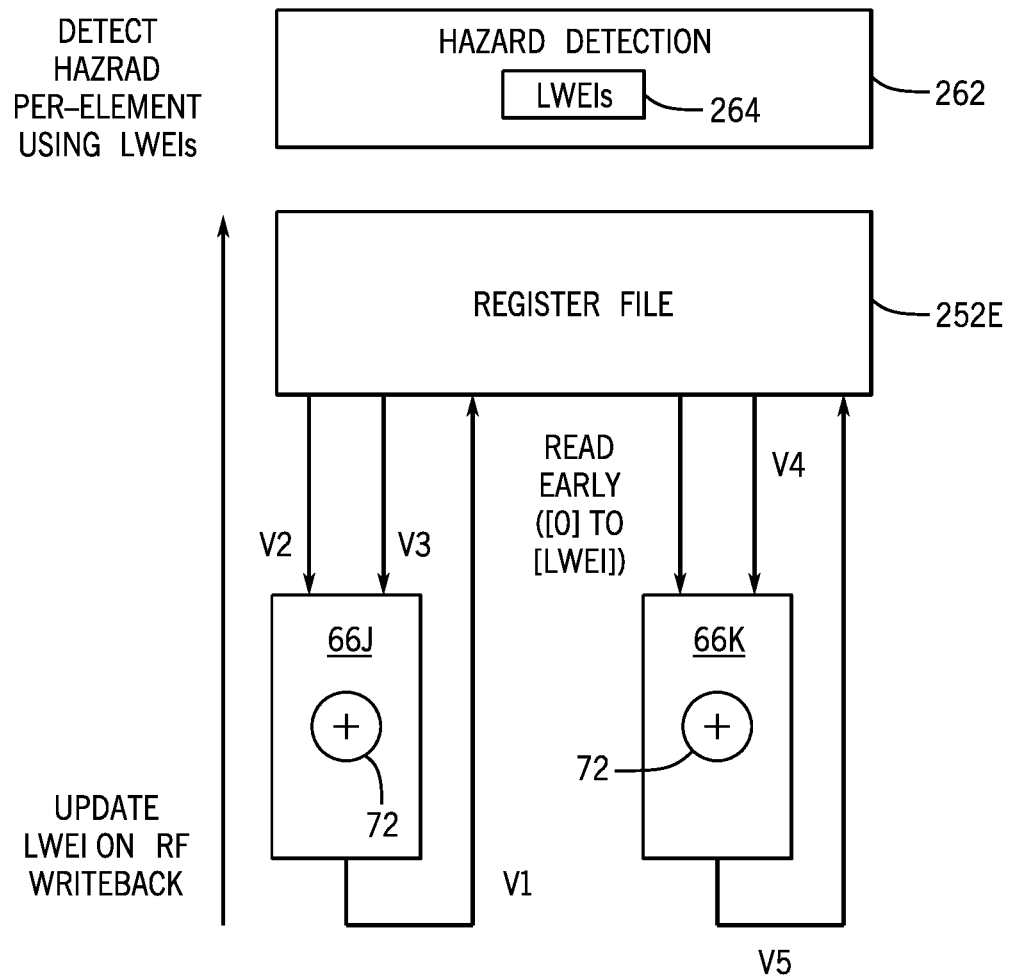
FIG. 37 an architecture support for chaining, in accordance with an embodiment.

Another architecture support for chaining is illustrated in FIG. 37. Here, a vector compute unit 80 (which may be implemented at least partially using a DSP block) includes hazard detection circuitry 262 that detects hazard conditions per vector element so that vector elements that have been written back to the register file 252E can be read out by subsequent dependent instruction even if there are still remaining vector elements that have not yet been computed. In other words when a first instruction still has not finished, another instruction that is dependent upon the first instruction may be initiated using vector elements of the output generated from performing the first instruction as the vector elements are generated. To facilitate such per-element hazard detection, the vector compute unit 80 provides updates to the hazard detection logic 262 that keeps track which elements have been committed so far (e.g., via a Last Written Element Index "LWEI" 264). The hazard detection logic 262 then uses the LWEI 264 in addition to register file read and write indices to determine whether a hazard condition is present.

Continuing with the example from above involving $I_0$ and $I_1$, the hazard detection circuitry 262 detects a hazard because the $I_1$ register read index (i.e., $V_1$) matches the $I_0$ register write index. Using the LWEI 264, the hazard detection circuitry 262 can further inspect, as $I_0$ is executed, which elements of $V_1$ (e.g., portions of $V_1$) have been computed and written back to the register file 252E and are therefore able to be read. As such, a vector processing unit 66 may begin executing $I_1$ once the first element of $V_1$ has been written back to register file 252E. Accordingly, execution of $I_1$ may be before execution of $I_0$ has completed, and the integrated circuit device may not wait for execution of $I_0$ to finish before beginning to execute $I_1$.

Figure 38A:
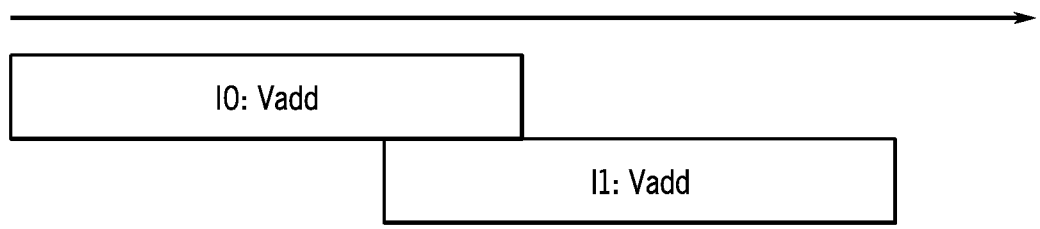
FIG. 38A illustrates the timing of the execution of two instructions when tailgating is not employed, in accordance with an embodiment.
Figure 38B:
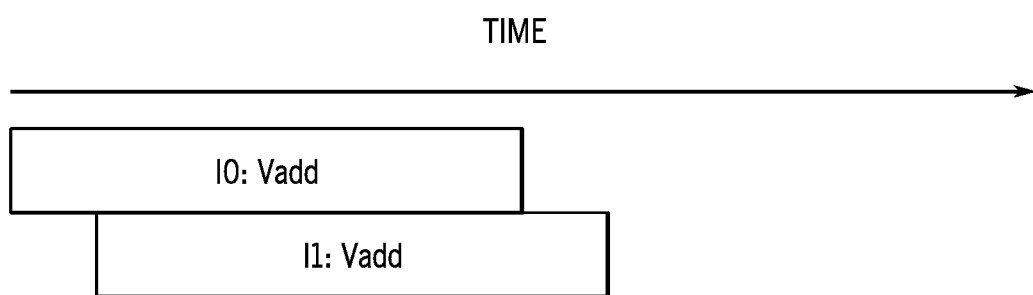
FIG. 38B illustrates the timing of the execution of two instructions when tailgating is not employed, in accordance with an embodiment.

Another example of how the vector processing system 26 may handle hazards is called tailgating. In particular, tailgating is an optimization that may be used to handle write-after-read hazards, which may occur where a newer instruction is permitted to write to a target register that is still being read by an older instruction. Tailgating is discussed with respect to FIGS. 38A, 38B, and 39, which will be discussed with reference to a different example involving the following instructions:

$I_0$: Vadd $V_1$, $V_2$, $V_3$
$I_1$: Vadd $V_2$, $V_4$, $V_5$ where $I_0$ is a first instruction, $I_1$ is a second instruction, Vadd is a vector addition operation that outputs a vector (e.g., $V_1$ or $V_2$), and $V_1$, $V_2$, $V_3$, $V_4$, and $V_5$ are vectors. Thus, $V_1$ is the sum of $V_2$ and $V_3$, and $V_2$ is the sum of $V_4$ and $V_5$. Because a value for $V_2$ may be written to a register address for $V_2$ while an initial value of $V_2$ is being read from the register (e.g., during execution of $I_0$), a write-after-read hazard may occur. Indeed, as shown in FIG. 38A, when tailgating is not employed, a vector processing unit 66 that executes $I_1$ cannot write to a register that stores $V_2$ until another vector processing unit 66 has finished reading the value for $V_2$ from that register. However, as shown in FIG. 38B, when tailgating is utilized, values generated by the vector processing unit executing $I_1$ can be written to the register for $V_2$ while the vector processing unit that is executing $I_0$ is still reading old (e.g., original) values from the register for $V_2$.

Figure 39:
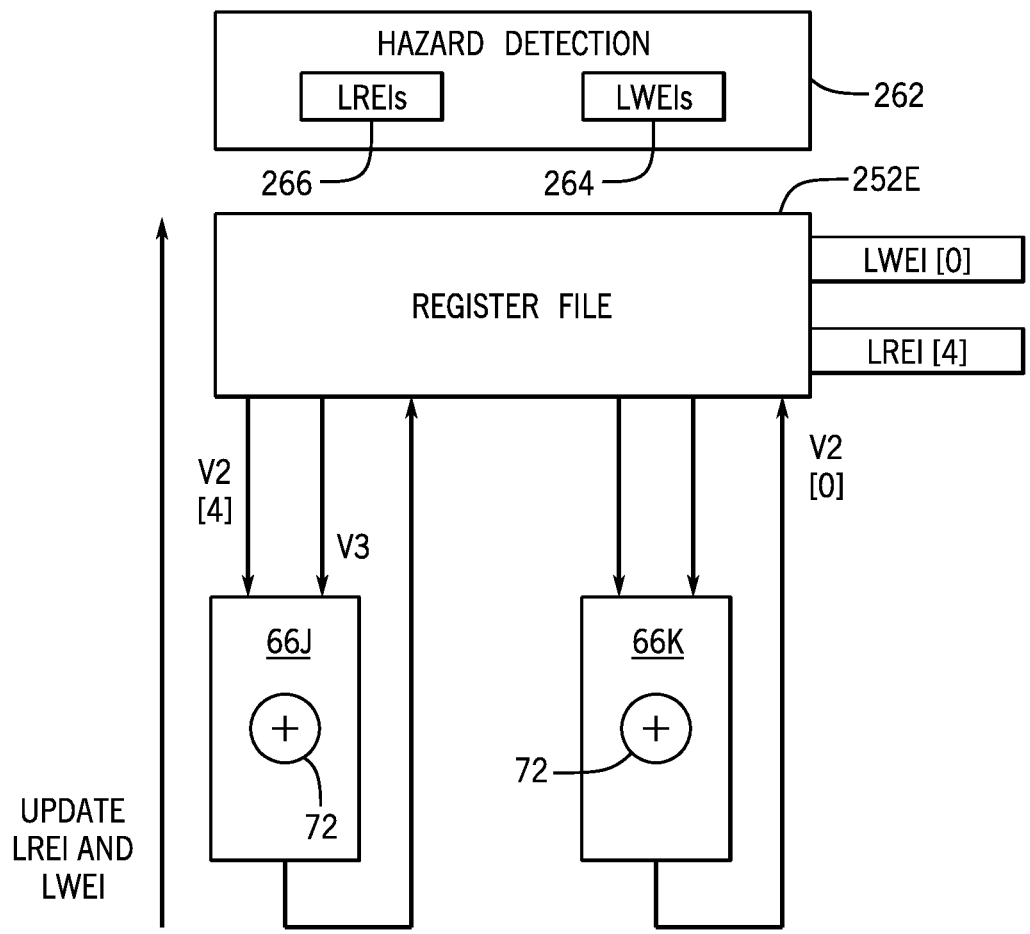
FIG. 39 illustrates an architecture approach for tailgating in which control logic maintains a last-read element index, in accordance with an embodiment.

FIG. 39 illustrates an example architecture approach for tailgating in which control logic (e.g., the hazard detection circuitry 262) keeps track of last-read element index (LREI) 266 and the LWEI 264 of instructions. Accordingly, the vector processing system 26 is able to track of which elements have been read from a register during execution of an older instruction, and new values can be written by a newer instruction to the register. In FIG. 39, once the vector processing unit 66J that is executing $I_0$ has read $V_2[0]$, then $I_1$ can write a new value for $V_2[0]$ in the register file 252E.

The vector processing system 26 may also handle operands that may be read and used for multiple operations. For example, in a scaling vector operation in which multiple elements of a vector are multiplied against a scalar value, the scalar value is used for a relatively long period of time against multiple vector elements (e.g., as opposed to a value that is used once against another element). As another example, for a tensor operation (which is discussed in more detail below), an entire vector operand can be used against multiple vectors in a computation (e.g., matrix-vector multiplication). For these scenarios, a separate buffer (e.g., a ping-pong buffer, a pre-load buffer, a buffer within a vector processing unit 66) can be used to hold the operand as the operand is used (e.g., for extended durations). After the operand has been read from the register file into this buffer, the operand is safe for tailgating, and the register file space for that operand may be written by a value generated from executing a newer instruction.

Conditional Execution

The vector processing system 26 also supports conditional execution on mixed vector and scalar code (e.g., vector-scalar multiplication) as well as on vector code (e.g., vector-vector addition or multiplication). In other words, as discussed below, the vector processing system 26 may execute conditional instructions. For the conditional mixed scalar vector conditional code, the integrated circuit device 12 may rely on the scalar unit 87 (which may include one or more scalar processing units that are implemented on the integrated circuit device 12, another integrated circuit device communicatively coupled to the integrated circuit device 12, or both). Using scalar conditional instructions enables arbitrary conditional scalar code structures (e.g., a for loop, a while loop, etc.) that trigger vector code. Accordingly, the discussion below focuses largely on conditional execution involving vectors. In this case, conditions are applied to elements of the vectors, and certain actions are then performed according to the condition. To facilitate this, the vector ISA includes a flag or mask register on each element in a vector register to describe such conditions. Consequently, the ISA also includes vector instructions that can manipulate the flag registers and mask registers as well as perform conditional computations based on the content on these registers.

Figure 40:
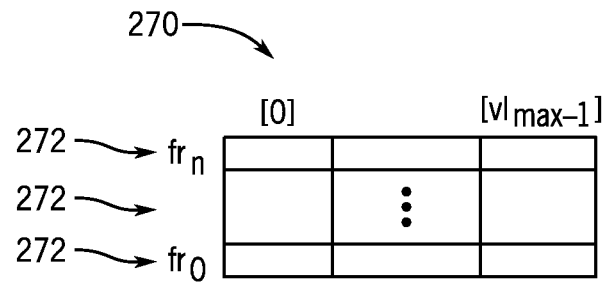
FIG. 40 illustrates a flag register, in accordance with an embodiment.

Keeping this in mind, an ISA that supports conditional execution is illustrated in FIG. 40. More particularly, FIG. 40 includes a flag register file 270, and the architectural states for conditional execution are flag registers (FRs) 272 (e.g., each row of cells of the flag register file 270) shown in FIG. 40. Each flag register 272 includes one value (e.g., a one-bit value) per vector register element. This value describes the condition to be applied to the corresponding vector element. There are multiple types of conditional vector instructions in the ISA. More specifically, there are instructions that manipulate and produce flags, and there are instructions that operate conditionally based on flags. Four examples of instructions that manipulate flag register are discussed below with respect to FIGS. 41-44.

Figure 41:
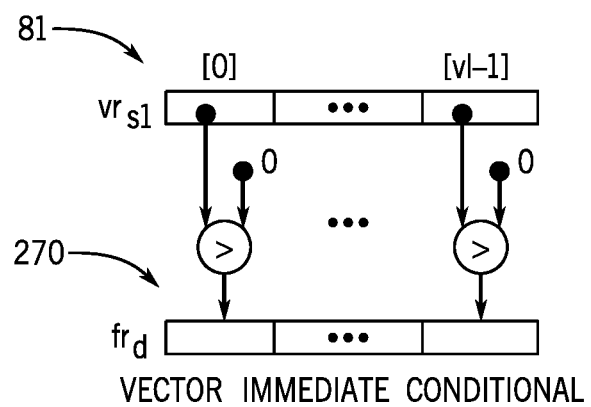
FIG. 41 illustrates a vector immediate conditional instruction, in accordance with an embodiment.

Turning to FIG. 41, a vector immediate conditional instruction accepts a vector register input (e.g., from a register of vector register file 81) and an immediate value. For each element in the input vector register, the vector processing system 26 performs a conditional check on the vector element against the immediate value and sets or clears the flag register. In FIG. 41, the conditional instruction is a greater than zero check ("vecgtz"), in which case a flag set to one corresponds to a vector element greater than the immediate value of zero.

Figure 42:
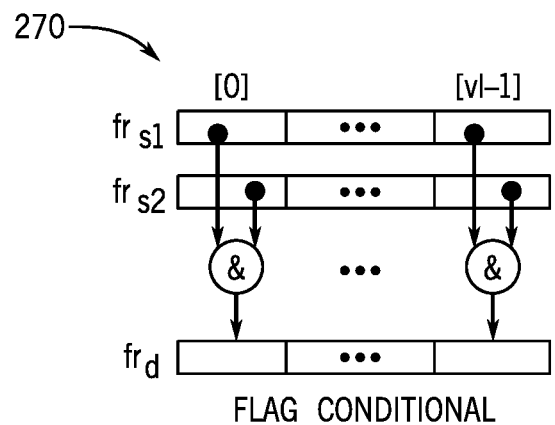
FIG. 42 illustrates a flag conditional instruction, in accordance with an embodiment.

Another example is a flag conditional instruction, in which two values from flag registers 272 of the flag register file 270 are accepted as inputs, and a new flag is output to an output flag register (e.g., $fr_d$). For each bit in the inputs from the flag register file 270, the instruction performs a Boolean operation and produces the resulting bit in a flag register output. In FIG. 42, a "flagand" instruction is illustrated in which an AND operation on two input flag registers is performed.

Figure 43:
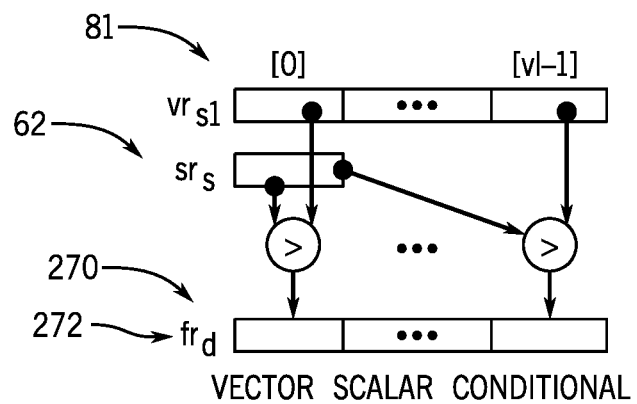
FIG. 43 illustrates a vector-scalar conditional instruction, in accordance with an embodiment.

Third, a vector-scalar conditional instruction accepts a vector register input (e.g., from a vector register file 81) and a scalar register input (e.g., from scalar register 62). For each element in the input vector register, the vector processing system 26 performs a conditional check on the vector element against the value from the scalar register 62 and sets or clears the flag register 272. In FIG. 43, whether an element in the input vector register (e.g., vector register file 81) is greater than the value of the scalar register 62 is determined, and a result is written based on the comparison (e.g., to a vector register 272 of $fr_d$).

Figure 44:
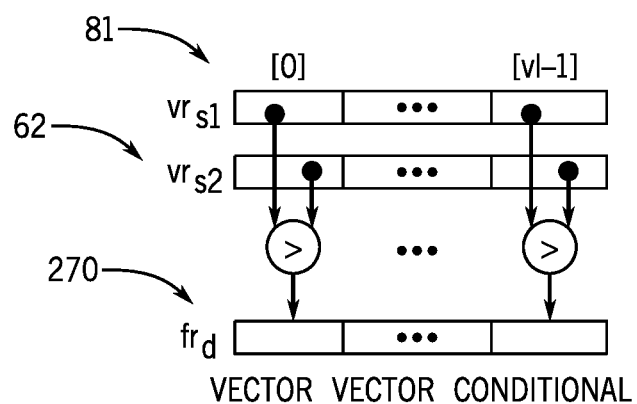
FIG. 44 illustrates a vector-vector conditional instruction, in accordance with an embodiment.

Turning now to FIG. 44, another example of a condition instruction that the vector processing system 26 may perform is a vector-vector conditional instruction in which two input vector registers values are accepted as inputs. For each pair of input vector elements, vector processing system 26 performs a conditional check and sets or clears the corresponding output flag register bit. The example in FIG. 44 shows a "vecgt" operation in which the vector processing system 26 determines whether elements in vector register $vr_s1$ are greater than elements in vector register $vr_s2$. It should also be noted that the vecgt operation may be used for vector-scalar conditional instructions, such as the conditional instruction discussed in the preceding paragraph.

Once flags are produced, many types of vector instructions can utilize the flag to conditionally perform vector operations. Vector compute instructions (e.g., instructions for addition, multiplication, or other operations) as well as memory instructions (e.g., instructions to load or store data) can include a flag as an input and cause the corresponding operation to be performed only on vector elements having an associated flag value of 1. In other words, conditional instructions may be performed, and the vector processing system 26 may perform the conditional instructions by checking whether a value of a flag register 272 corresponding to a particular value (e.g., a vector register value) has a value indicating a flag is present. In this manner, the vector processing system 26 may utilize predication or a predication-like scheme to check whether a precedent for a conditional operation is present (e.g., based on a value in a flag register) before executing an instruction.

Continuing with the drawings, FIG. 45 illustrates a code example of a conditional execution. In particular, FIG. 45 includes code 280, which is a loop that does element-wise multiplication of two arrays, $V_2$ and $V_3$, and outputs array $V_4$. Thus, the loop iterates over each element in the array and multiplies elements of $V_2$ and $V_3$ to produce an element of $V_4$. Furthermore, the multiplication is conditional. In particular, there is another input array $V_1$, with each element containing the condition for the multiplication. In each loop iteration, if the element in $V_1$ is not zero, then the vector processing system 26 performs multiplication of corresponding $V_2$ and $V_3$ element. Conversely, if the corresponding element of $V_1$ is zero, then no multiplication involving corresponding elements of $V_2$ and $V_3$ will be performed.

FIG. 45 also includes an implementation 282 indicative of how the code 280 can be written as vector program. Because the loop has a known number of thirty-two iterations, the vector code can be fully unrolled as operations on vectors having a length of thirty-two bits. A first instruction (e.g., Ld_imm) sets such vector length. After that, the $V_1$ vector that includes the elements for the conditional check is loaded. Then, flags are generated by checking each element of $V_1$, whereby a flag is set if the element is not equal to zero. The resulting flag bits are written to flag register $F_0$. The subsequent instructions perform conditional loads of vectors $V_2$ and $V_3$, which bring only elements having corresponding flag bits that have been set (e.g., to a value of one). Then, a conditional vector multiplication operation is done on the elements of the $V_2$ and $V_3$ vector registers having corresponding flag registers indicative of a flag being present, and the result is written to output vector register $V_4$. The elements of vector $V_4$ with a corresponding flag present may then be stored to external memory.

The micro-architecture to support conditional execution includes flag registers, flag generation, applying flags onto vector conditional execution, and moving flags. Each of these is discussed in more detail below, starting with implementing flag registers.

Flags may be implemented in their own register file structure (e.g., flag register file 270) or as embedded bits within the vector register file (e.g., vector register file 81). If architected as separate register file, then the flag registers files 270 may be smaller structures than vector register files 81. Additionally, the flag register files 270 may provide sufficient ports to be readable and writable by vector processing units 66 utilizing the flag register files 270. On the other hand, if architected to be embedded bits within vector register file 81, the register file structure would utilize comparatively more bits because both flag bits and vector data would be kept in the vector register file 270. However, the flag bits can be read along with vector data in the vector register file 81. Hence, storing flag bits in the vector register file 81 may be desirable if the vector processing units 66 that cause the flags to be generated are also mostly interacting with the vector register file 81 (e.g., if flags are generated for a lane 82, instead of separate flag compute unit, as described next). Furthermore, because vector register files 81 may be implemented on M20K hard on-chip memory units included within the integrated circuit device 12 that have specific port widths (e.g., 20-bit or 40-bit), vector data may not utilize all the full width of the ports, and unused bits could be used for flags. For example, when using 40-bit wide M20K as vector register file 81 for a 32-bit vector element, there are 8 bits that are unused that could be usable for flag bits. Similarly, for 16-bit elements, there could be two 16-bit elements data with four 2-bit flags that can fit within the 40-bit width.

Additionally, there are also several options as to where flag computation is performed. As discussed below, a separate unit may be utilized to perform flag computations, or flag computations may be performed via lanes 82 (and the circuitry (e.g., vector processing units 66)) that also perform vector data computations.

The vector processing system may include one or more vector flag compute units (VFCUs) that perform flag computations and are separate from the vector processing units 66 and memory units (e.g., memory 68, vector register file 81 (which may include the vector registers 60), memory blocks 252). For example, in one instance, a VCFU may be utilized when the flag register file 270 is implemented as its own structure. In other words, the VFCU may include the flag register file 270 as well as processing circuitry (implemented in soft logic or hard logic) that is used to perform flag computations. The VFCU is communicatively coupled to other units that utilize flags, such as vector compute units 80 that include the vector processing units 66. As conditional vector execution would happen in the vector compute units 80, flags may be sent from the VFCU to the vector compute units 80 (and vector processing units 66) for each conditional instruction.

As another example, a general vector compute unit lane (e.g., lane 82) may be architected to also support flag computation in addition to vector computation. Such an implementation may be more suitable when the flag register file 270 is embedded in the vector register file 81. In this case, the functional units 79 may perform vector computations and flag computations. In this manner, when conditional instructions are performed, there would be relatively less flag movement because flags are already in the same register file structure as the vector data and already connected to the lanes 82. In one embodiment, each lane 82 may support flag computation. In other embodiment, a first portion of the lanes 82 may support flag computation, while another portion of the lanes 82 may be communicatively coupled to a VCFU that performs flag computations for those lanes 82.

Figure 46:
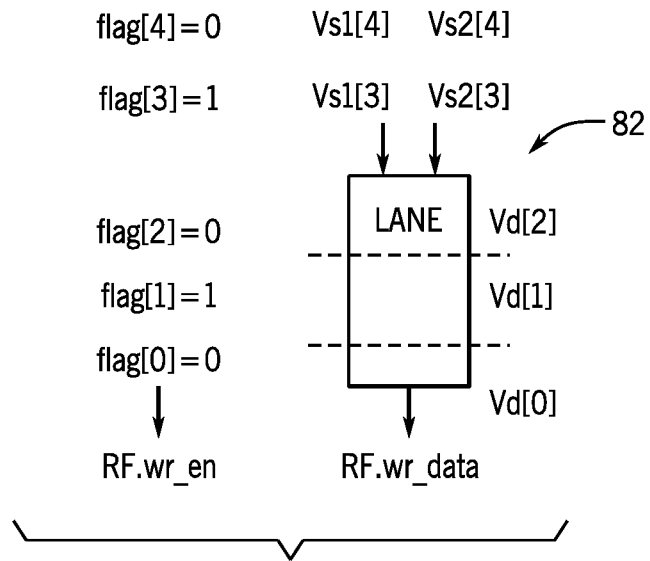
FIG. 46 illustrates how a flag may be utilized when performing conditional execution, in accordance with an embodiment.

As discussed above, flags may be used when performing conditional execution on vector elements by the vector compute units 80 and memory units (e.g., memory that includes the vector register file 81). For vector computation, the flag can be used to gate the write-enable signal so that the result produced by a lane 82 is not committed to the register file when the flag is a particular value (e.g., zero). FIG. 46 illustrates this scenario. As illustrated, the lane 82 still performs the vector computation, but result is not written back because the flag value is zero.

Figure 47:
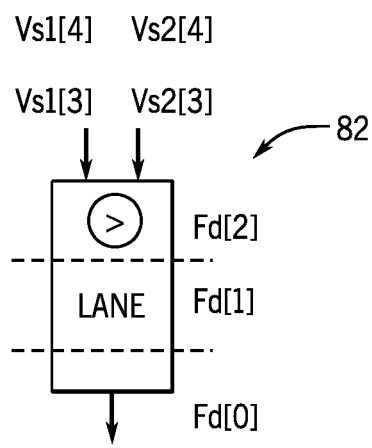
FIG. 47 illustrates an example of when flags are generated by a lane or a vector processing system, in accordance with an embodiment.

FIG. 47 illustrates an example of a flag generated by a lane 82. In this example, a vector-vector conditional instruction reads two vector element operand inputs into the lane 82, and the lane 82 performs a greater-than comparison among two operands (e.g., Vs1 and Vs2) and produce a flag when Vs1 is greater than Vs2.

Figure 48:
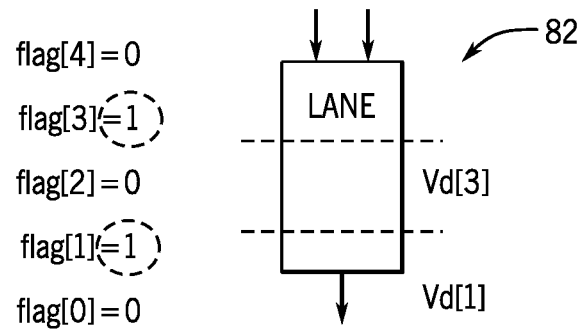
FIG. 48 illustrates using flags when performing conditional execution, in accordance with an embodiment.

As discussed above, vector processing units 66 may perform vector computations before a corresponding flag is checked to see whether an output should be written. However, the vector processing system may also utilize a more efficient approach for conditional vector computation (e.g., when there are relatively few flags) to avoid performing computations for which an output will not be stored. This approach may be referred to as "density time." FIG. 48 illustrates an example implementation of density time in which several vector elements (e.g., elements [0] to [4]) are processed, but only elements [1] and [3] with asserted flags are scheduled and computed on the lane 82.

To implement density time, the vector processing system 26 may disable a lane 82 when a flag register has a non-flag value (e.g., a zero). For example, a drive line enable signal may be sent when there is a flag (e.g., a flag register with a value of one), so when a lane 82 reads vector elements with a corresponding zero flag (i.e., vector element without a corresponding flag), the lane 82 may simply become disabled. Conversely, when a flag is present, the lane 82 may be activated (or remain active) and perform vector computations. Implementing density time in this manner may reduce lane activities and power consumed by the vector processing system 26.

Density time may also be implemented by scanning flags in advance and issuing only elements with asserted flags. For example, the vector processing system 26 may read multiple flags ahead of time, scan the flags, and only issue vector elements with asserted flags. Such an implementation may reduce the number of compute cycles, thereby improving runtime. For instance, in one embodiment, the separate flag register file 270 is organized to pack flags of subsequent vector elements together to be readable by lanes 82 (e.g., by control logic 83). Moreover, there may be an individual read port per lane 82 (e.g., a banked register file with each bank supplying data to a lane 82), so that each lane 82 can skip computation independent of other lanes 82. In this example, lanes 82 may be out of sync with one another because some lanes 82 may process elements with more asserted flags than others. As such, control logic (e.g., control logic 83 or other control logic utilized to control the vector processing units 66) may oversee the progress of each lane 82 and sync the lanes 82 at the end of each vector instruction before dispatching the next instruction. Furthermore, as discussed above, it is also possible to start executing the next instruction without fully waiting for all the lanes 82 to finish the current instruction.

Figure 49:
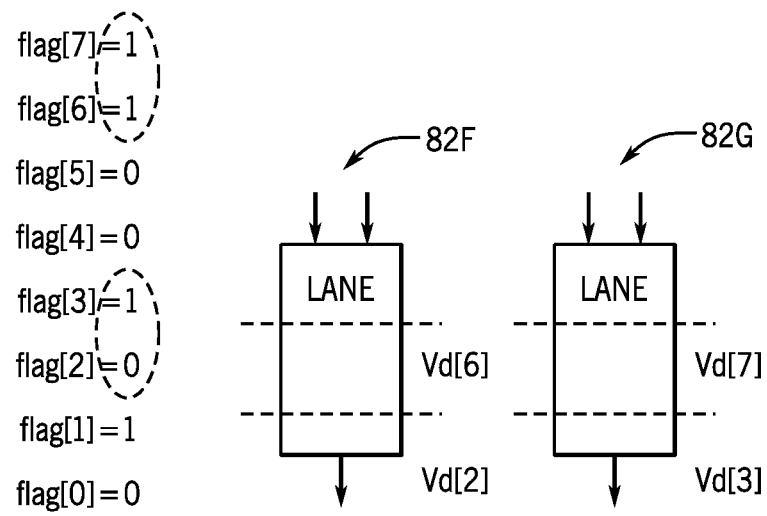
FIG. 49 illustrates another example of using flags when performing conditional execution, in accordance with an embodiment.

As another example of density time, the vector processing system 26 may skip a block of elements with corresponding zero flags (i.e., elements that do not have corresponding flags). In other words, the vector processing system 26 may skip only a group of vector elements with zero flags while performing an instruction on the vector elements that have flags. As an example, FIG. 49 illustrates lanes 82F, 82G that may share a single register file bank (e.g., as shown in FIG. 23). Lane 82F may perform computations for even vector elements, while lane 82G may perform computations for odd vector elements. The lanes 82F, 82G may share a read port, such as when reading in four INT8 values together from a 32-bit read port of the single physical register file bank. In this case, if the four flags associated with the four INT8 elements are zero, the vector elements may not be read, and the corresponding vector computations can be skipped completely. Conversely, when a flag is present for one or more vector elements, the vector elements may be read, and the corresponding vector computations may be performed.

Density time may also be implemented when utilizing virtual lanes. For example, as described above, if the number of lanes 82 is fewer than the number of elements read per cycle, it is possible to virtualize the lanes 82 by processing the group of read vector elements into multiple cycles. To implement density time when utilizing virtual lanes, the larger number of elements read per cycle enables flags to be scanned ahead of time (as discussed above), and each virtual lane may only receive those elements with asserted flags. In other words, the virtual lanes may only receive vector elements when the condition set by a conditional instruction is present.

Before continuing to discuss tensor operations available using the vector processing system 26, it should be noted that flags can also be manipulated using the scalar unit 87. In particular, ISA for the scalar unit 87 includes the ability to manipulate bits. To facilitate this, flag move instructions may be used move data from a flag register (e.g., flag register 272) to a scalar register (e.g., scalar register 62). From there, the vector processing system 26 may utilize scalar instructions to perform flag manipulations, and the results can be moved back to the flag register 272. Alternatively, the flag register 272 can also be implemented in the scalar unit 87 (or in a scalar register file), and the ISA for the scalar unit 87 may enable scalar-flag compute instructions to be performed. In such an example, instead of moving data between flag registers 272 and scalar registers 62, scalar instructions can directly accept values from flag registers as input operands, perform any necessary flag computations, and write back the results to the flag registers 272 of the flag register file 270. Furthermore, the conditional operations discussed above are examples of conditional operations the vector processing system 26 may perform, and the vector processing system 26 is not limited to performing the conditional operations based solely on the conditions described above. For example, the vector processing may perform conditional execution involving any suitable condition (e.g., great than, less than, greater than or equal to, less than or equal to, equal to, or Boolean conditions (e.g., AND, OR, XOR).

Tensor Operations

As mentioned above, the vector processing system 26 may support tensor operations involving two operands in which one operand (e.g., an operand stored in register 90 of a vector processing unit 66) is used to perform multiple operations. Tensor operations may include any vector operations discussed herein as well as matrix tensor operations such as general matrix multiplication (GEMM) operations and general matrix-vector multiplication (GEMV). To perform tensor operations, tensor blocks may be implemented using hard logic of the integrated circuit device 12 (e.g., on DSP blocks included in the integrated circuit device 12). As discussed in more detail below, tensor blocks are composable to perform various matrix operation, and the tensor blocks may be integrated into the vector processing system 26.

Figure 50:
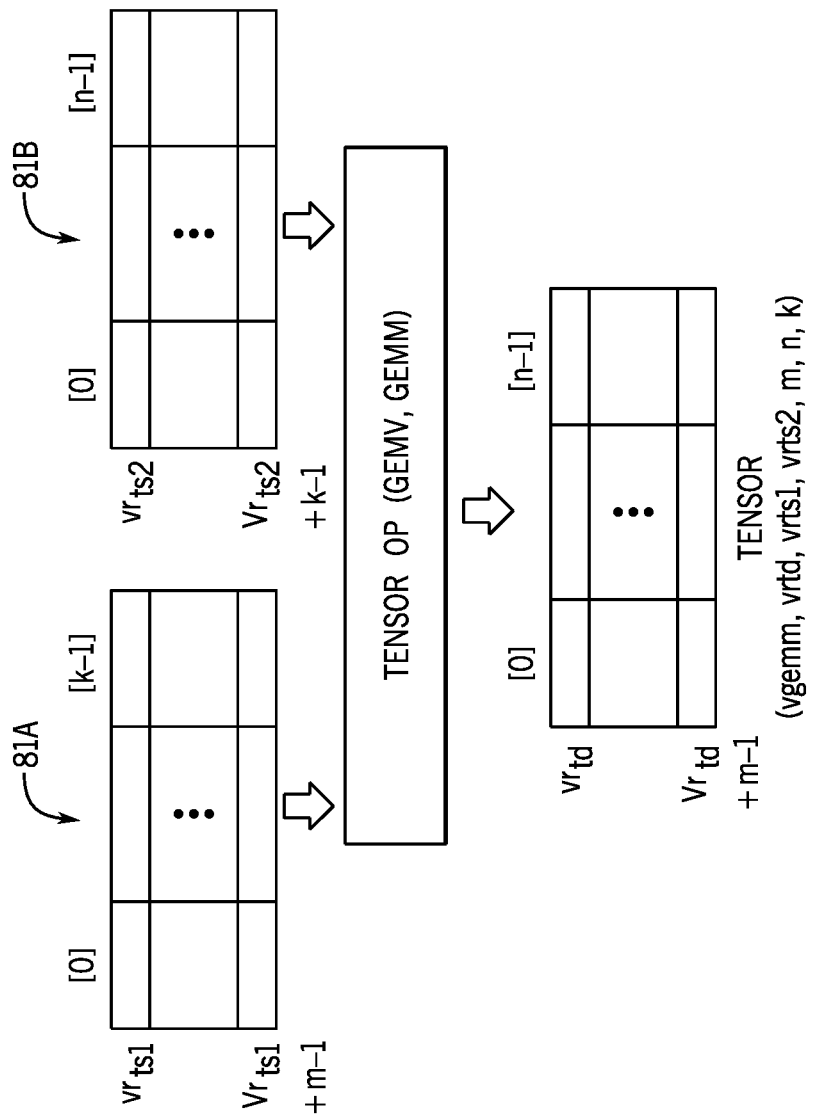
FIG. 50 illustrates performance of a tensor operation, in accordance with an embodiment.

However, before discussing a hardware implementation, the ISA, which includes a tensor instruction type, will be discussed. In particular, FIG. 50 illustrates a tensor instruction (e.g., GEMV, GEMM) that operates on two input matrices (e.g., ts1 stored in vector register file 81A and ts2 stored in vector register file 81B) and produces an output matrix (e.g., matrix td). More specifically, as illustrated, the matrices may be stored in a contiguous set of vector registers of the vector register files 81 (which may also be referred to as matrix registers). The instruction (e.g., a GEMM or GEMV instruction) specifies the base vector registers (e.g., $vr_{ts1}$, $vr_{ts2}$, $vr_{td}$) for the two inputs and an output matrix, along with m, n, and k matrix dimensions that indicate the range of the registers from where the matrices are stored. In some cases, the maximum number of matrix columns may not exceed the maximum width of vector register ($v1_{max}$).

As illustrated, the instruction can be used to describe different tensor operations, such as matrix-matrix multiplication and matrix-vector multiplication. Additionally, tensor operations involving a scalar input are also supported. For example, when performing a scaling operation on a matrix (e.g., when performing AI operations), an instruction may specify a matrix and scalar to be multiplied. Furthermore, it should be noted that while tensor instructions could also be implemented as sequence of vector instructions, doing so may incur more instruction overheads (e.g., a higher instruction count, which may lead to fetch/decode overheads). Moreover, tensor-level instruction is more amenable to coarse-level hardware tensor compute micro-architectures that operate on matrices, which are more efficient than compute micro-architecture that operates on finer-level vectors.

Figure 51:
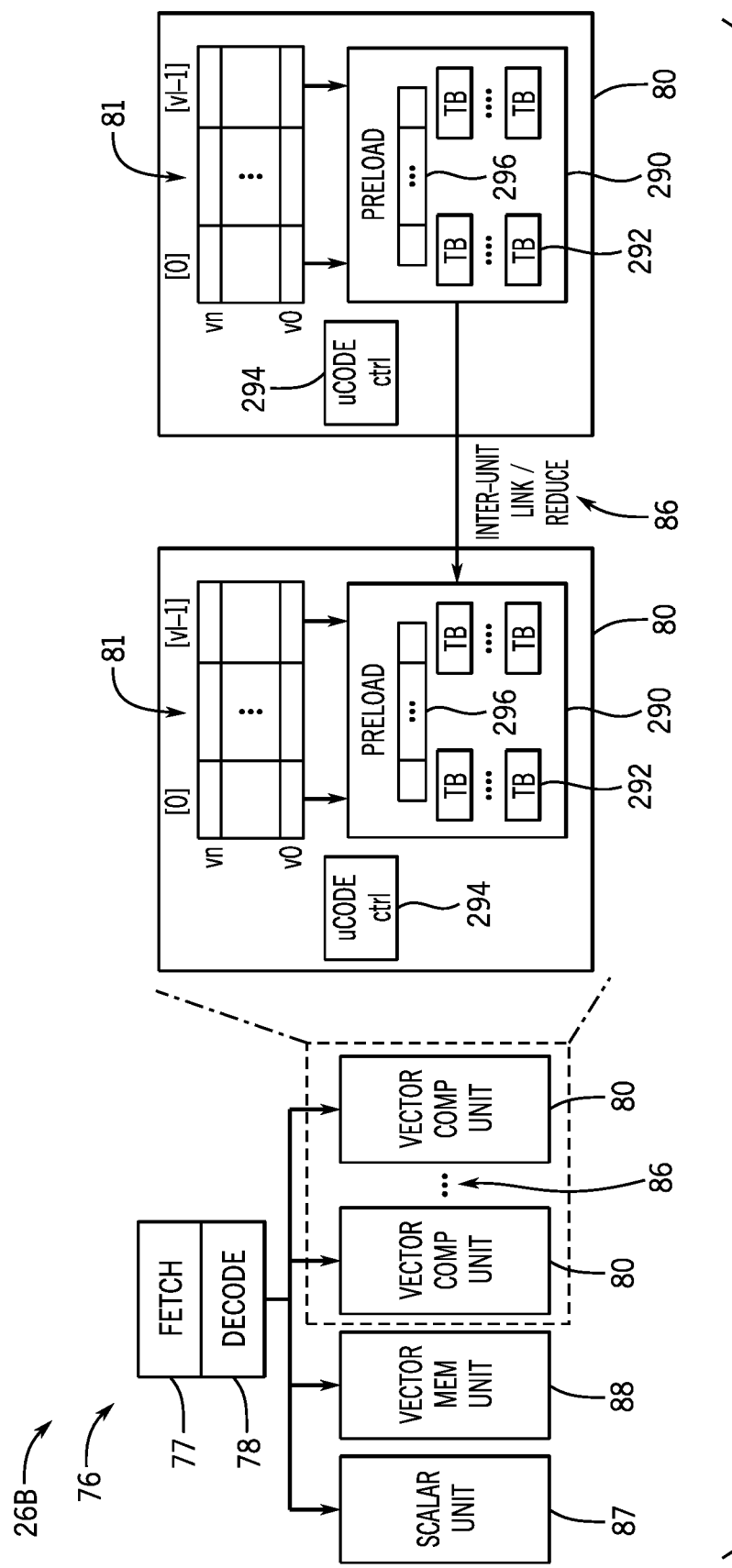
FIG. 51 is a block diagram of a vector processing system that includes tensor units, in accordance with an embodiment.

Turning now to FIG. 51, to provide support for tensor operations, each vector compute unit 80 may include tensor blocks included on the integrated circuit device 12 (e.g., AI Tensor Block on the Intel® Stratix® 10 NX FPGA). For example, as illustrated, the vector compute units 80 of the vector processing system 26 (e.g., vector processing system 26G) may include vector register files 81 that include vector registers, tensor units 290 that include tensor blocks 292 that perform tensor operations, and control circuitry 294 (e.g., a micro-coded controller). In operation, the tensor units 290 may preload data from the vector register files 81 (e.g., vector elements or data for a column or row of a matrix to be involved in a multiplication operation) into registers or buffers (e.g., register 296). Furthermore, the tensor blocks 79 may include registers or buffers (e.g., preload/ping-pong buffers) that are also used to store preloaded data. Thus, the registers or buffers 296 may be included in the tensor blocks 292. The tensor blocks 292 may stream in data (e.g., operands) and perform operations (e.g., multiplication or addition) on the operands that involve the operands and a preloaded value. In other words, one operand may be read from a register and used in several consecutive operations, whereas the other operand involved in each of the operations changes between operations. As the tensor blocks 292 of the tensor units 290 generate and output data, the outputted data may be written to a vector register file as discussed above.

As an example of how the vector compute units 80 may perform a tensor operation, the vector register file 81 supplies an input matrix row in a ready cycle. A tensor instruction triggers specific sequences of vector register reads to pre-load and supply input matrix rows appropriately into the tensor unit(s) 290. Similarly, outputs produced are sequenced to be written back to the register file 81. Such sequencing is facilitated by the control circuitry 294, which may be a micro-coded controller that drives the controls of the vector register file 81 and tensor units 290. The control circuitry 294 is programmable to allow different tensor compute modes. The modes can be exposed via a control register in the instruction set to allow tensor computation mode to be chosen by instructions dynamically. Using a single tensor unit 290 of a vector compute unit 80, it is possible to perform any matrix computation into smaller blocks that fit within the register file 81 and tensor blocks 292, thereby enabling the tensor instruction to be executed. Thus, the vector compute units 80 may operate independently to perform independent matrix operations. Vector compute units 80 may also operate in parallel to perform independent matrix operations.

Figure 52B:
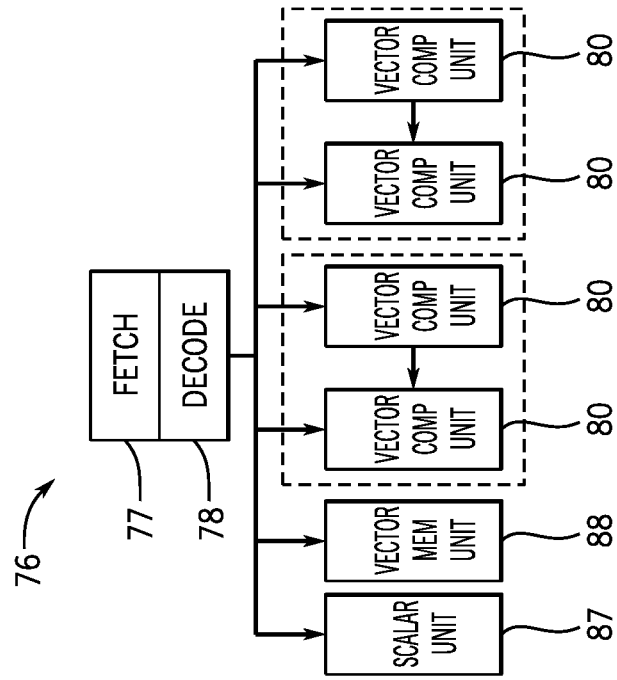
FIG. 52B is a block diagram of pairs of vector compute units that are connected to one another, in accordance with an embodiment.
Figure 52A:
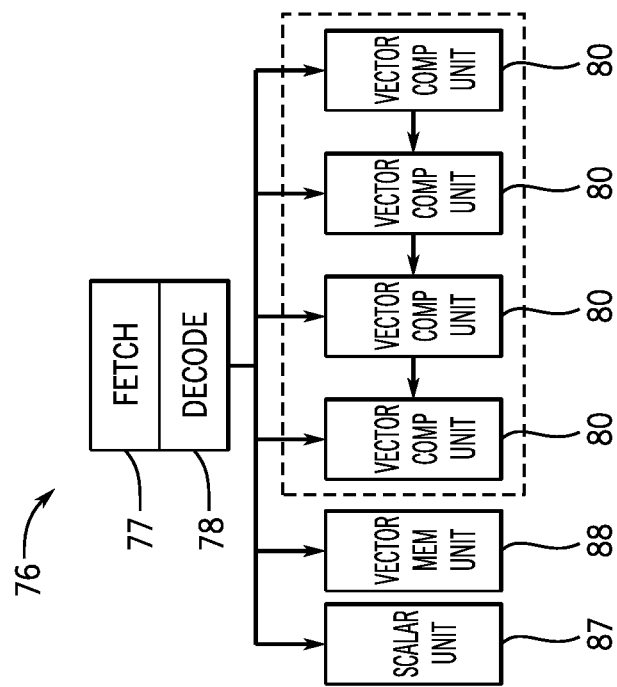
FIG. 52A is a block diagram of tensor units across four vector compute units of a vector processing system being connected, in accordance with an embodiment.

Furthermore, inter-unit interaction is supported via inter-unit links 86, thereby enabling the tensor units 290 to be scalable to perform operations using multiple tensor units 290. That is, the inter-unit link 86 can also be used to connect adjacent vector compute units 80 to enable operations involving larger matrices to be performed more efficiently. The inter-unit link 86 is configurable. As such, it is possible to scale the degree of tensor parallelism accordingly. Examples of scaling are shown in FIG. 52A and FIG. 52B. In FIG. 52A, tensor units across four vector compute units 80 are connected, for instance, to perform the computations for a large GEMM operation. In FIG. 52B, a two pairs of tensor units in two pairs of vector compute units 80 are connected, allowing for parallel independent processing of two operations (e.g., GEMM operations).

Software-Directed Architecture

As discussed above, the vectors processing systems 26 of the present disclosure can be implemented on the integrated circuit device 12, which may be a programmable logic device such as an FPGA. Bearing this in mind, this section addresses various considerations that may be taken into account and several techniques that may be utilized when designing vector processing systems 26 (or portions thereof) on FPGAs. Furthermore, this section also discussed how design software may generate designs for various portions of the vector processing systems 26 (e.g., vector compute units 80 or portions thereof, such as lanes 82). With that said, different types of implementations of vector register files (e.g., vector register files 81) will first be discussed.

Vector register files 81 may be implemented on a variety of memory technologies that may be included on the integrated circuit device 12 (e.g., as memory banks 252). For example, M20K memory banks present, by default, an array of 512 storage words, with each word includes thirty-two bits. An M20K memory bank also has a configurable latency of two or three clock cycles, with the three-cycle mode offering a higher operating speed. Another type of memory bank is a memory logic array board (MLAB), which may be more abundant on the integrated circuit device 12. MLABs provide an array of thirty-two storage words, with each word having twenty bits. It has a configurable latency of one or two clock cycles. It is also possible to form memories out of logic cells of the integrated circuit device 12 directly, which may be suitable for relatively small memories such as a one-bit wide flag indicating whether or not to include a vector element in a subsequent computation (e.g., when performing conditional instructions).

Figure 53:
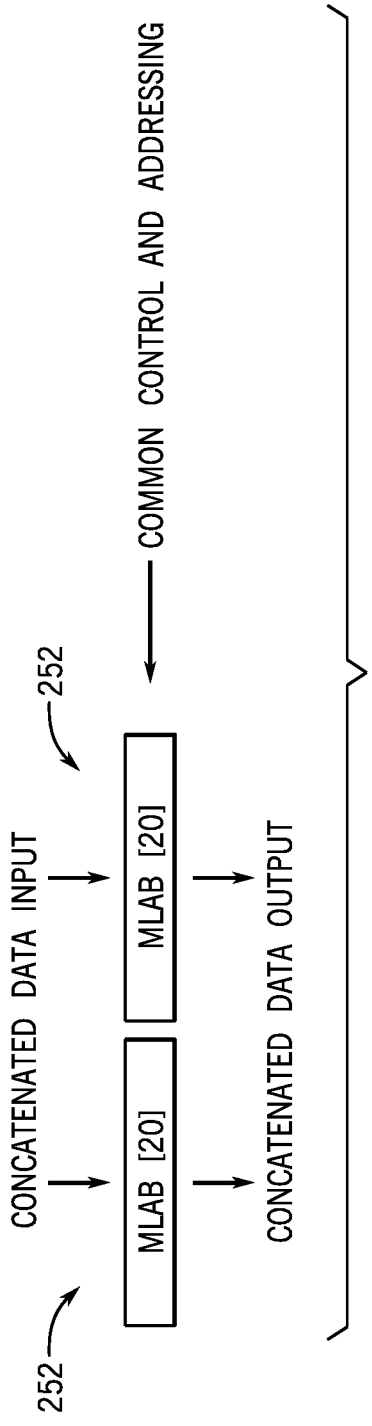
FIG. 53 illustrates width stitching of memory banks, in accordance with an embodiment.
Figure 54:
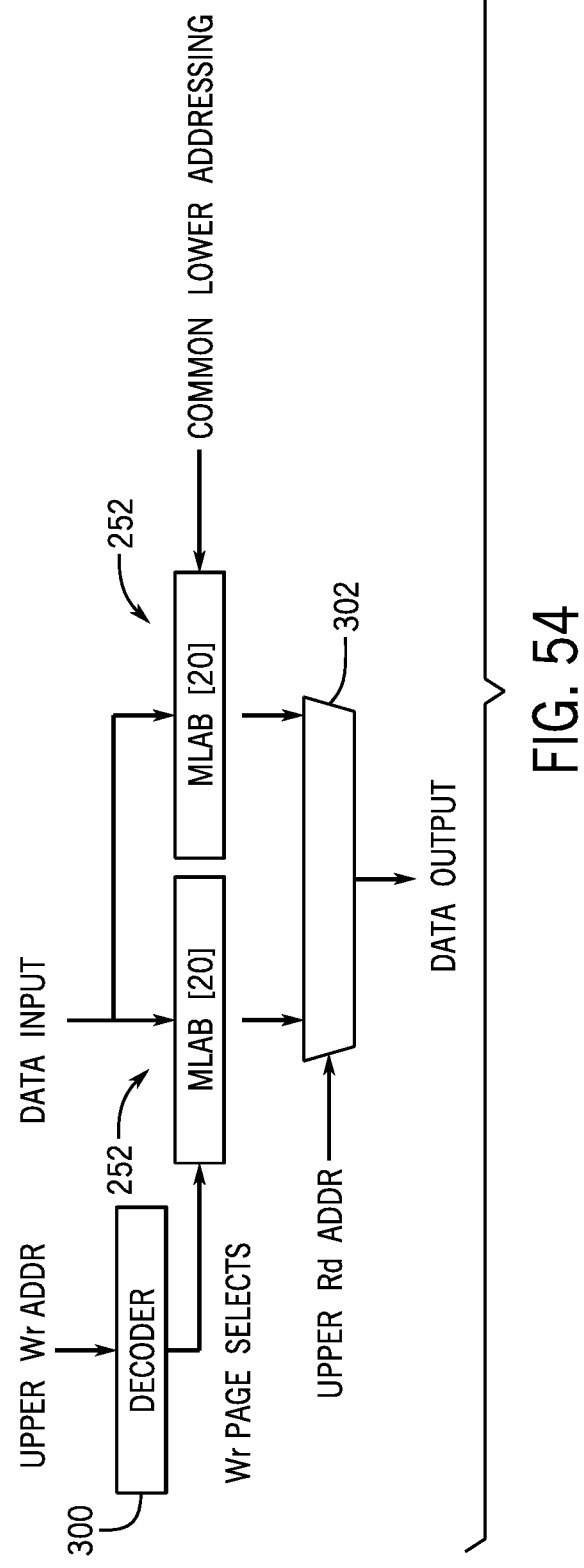
FIG. 54 illustrates depth stitching of memory banks, in accordance with an embodiment.

Memory elements (e.g., memory banks 252) can be freely combined for various purposes. For example, memory elements increase the word width with no impact on speed or latency when utilizing "width stitching," which is illustrated in FIG. 53. In width stitching, memory banks 252 are controlled by a common controller and share addressing. Accordingly, memory banks 252 may receive concatenated data and output concatenated data. Another example of combining memory elements is called "depth stitching," which is illustrated in FIG. 54. In depth stitching, memory elements, such as the memory banks 252 may be combined with decoders (e.g., decoder 300) and multiplexers (e.g., multiplexer 302) to increase storage depth. It should be noted that any number of components can be depth stitched with suitable adjustment of the write side decoder 300 and read side multiplexer 302. Furthermore, to compensate for additional delay that may be added due to performing multiplexing, another stage of register latency may be added.

Depth and width stitching can be freely combined to build FPGA memory components of any suitable size. Some wastage may occur due to quantization. For example, an MLAB has twenty bits per storage word. If only sixteen bits are desired, the remaining four may simply be abandoned. Furthermore, while the examples of width stitching and depth stitching respectively illustrated in FIG. 53 and FIG. 54 include two memory banks 252, it should be noted that depth stitching and width stitching may be utilized for any suitable number of memory banks 252.

Utilizing programmable logic devices such as FPGAs may also enable many different data formats to be used. For any given application, the vector processor system 26 may expect to work on elements in multiple number formats (e.g., bfloat16, single-precision floating-point (also known as FP32), int8, block floating point (BFP), or other data formats, including non-standardized data formats) as well as vectors of different lengths. When implementing the vector processing systems 26 on FPGAs, register file storage may be tailored directly to the software being run. In other words, register files 81 may be stored in memory blocks 252 that are specifically tailored to applications or algorithms executed by the integrated circuit device 12.

Figure 55:
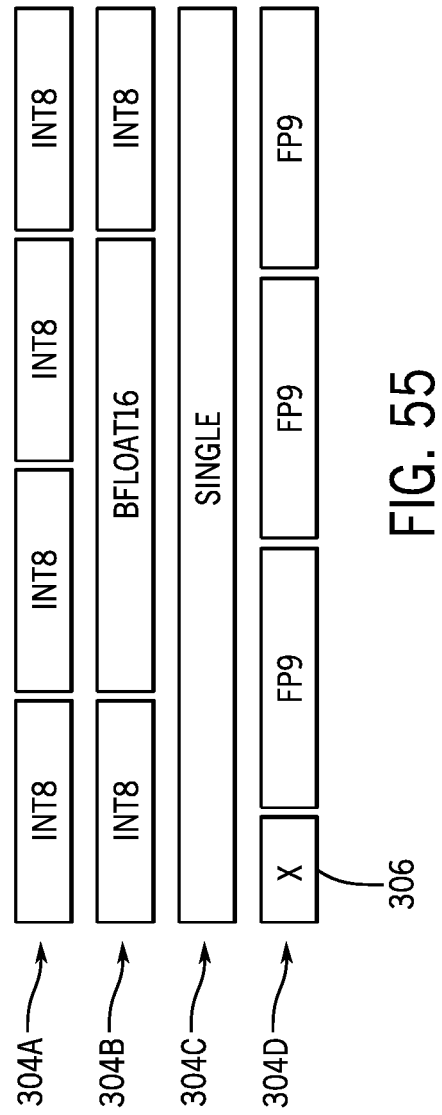
FIG. 55 illustrates 32-bit words that include values having several different data formats, in accordance with an embodiment.

The various number formats each have an associated storage width in bits. Numbers which are used together in a computation may be combined freely into any memory word of sufficient size. For example, as illustrated in FIG. 55, words 304 (e.g., words 304A-304D) are thirty-two bits and may include values of various data formats. For instance, word 304A includes four int8 values, word 304B includes two int8 values and a bfloat16 value, word 304C includes one FP32 value, and word 304D includes three floating point values that each include nine bits. Because only twenty-seven bits of the word 304D are used to store values, five bits (represented by box 306) may not be utilized.

As another example, software executing a multiplication of a bfloat16 value with an FP32 value uses sixteen bits of storage bits for the bfloat16 value and thirty-two bits of storage for the FP32 value. While there are two values, both of the values may be read in a single read operation. For example, an FPGA utilized to perform the multiplication of the bfloat16 value and FP32 value can be adjusted to have a native 48-bit memory format by width stitching two M20K memories to generate 64-bit wide words. As such, the data may be recovered in a single read transaction rather than two, thereby saving access time.

Figure 56:
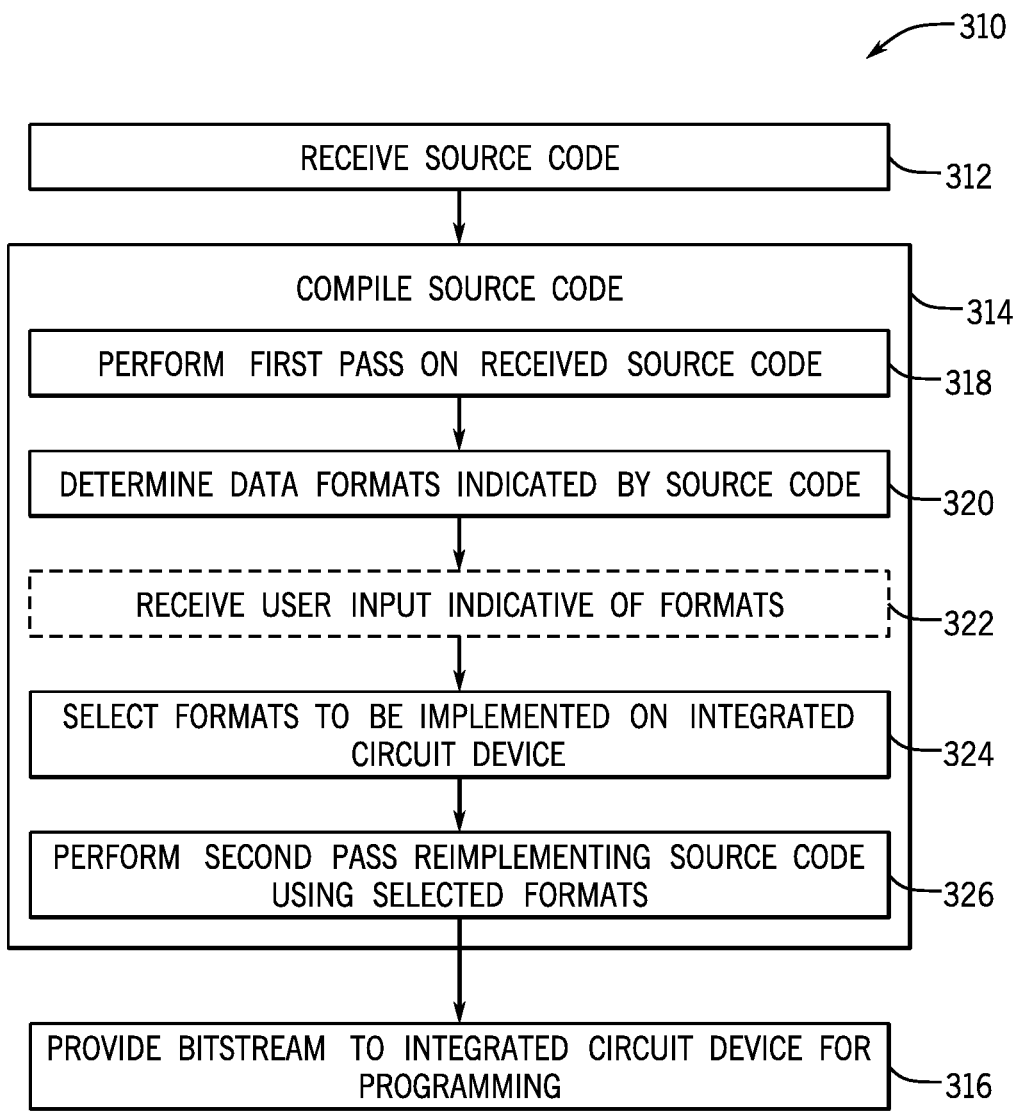
FIG. 56 is a flow diagram of a process for generating a program design that may be implemented on the integrated circuit device of FIG. 1, in accordance with an embodiment.

Accordingly, register storage may be specifically tailored for a particular application or algorithm to be executed by an FPGA. Keeping this in mind, compilation (e.g., via compiler 16) will now be discussed with respect to FIG. 56. In particular, FIG. 56 is a flow diagram of a process 310 for generating a program design (e.g., of a vector processing system 26) that may be implemented on the integrated circuit device 12. The process 310 may be performed by the compiler 16 or the compiler 16 in conjunction with the design software 14. Accordingly, while operations of the process 310 are generally described below as being performed by the compiler 16, these operations may be performed by the compiler 16 and the design software 14 (as well as processing circuitry that executes that compiler 16 and the design software 14). The process 310 generally includes receiving source code (process block 312), compiling the source code (process block 314), and providing a bitstream to an integrated circuit device (e.g., integrated circuit device 12) for programming (process block 316).

At process block 312, the compiler 16 may receive source code. The source code may be a high-level program made by a designer. The source code may include code for an algorithm or function to be performed by the integrated circuit device 12.

At process block 314, the compiler 16 compiles the received code. To compile the source code, the compiler 16 may perform several operations (e.g., operations indicated by subprocess blocks 314-326). For instance, at subprocess block 318, the compiler 16 may perform a first pass (e.g., a first round of computations) on the received source code to generate an initial implementation (or portion thereof) to enable the integrated circuit device 12 to be programmed in accordance with the source code. For example, during the first pass, the compiler 16 may determine how memory banks should be arranged in order to fulfill the requirements of the received code. In one embodiment, the compiler 16 may perform the first pass operating under that assumption that all number formats supported by the integrated circuit device 12 are available to be utilized.

Compilation of an initial design of a hardware implementation of the source code may be refined, for instance, by reducing the number of potential data formats that a subsequent version of the design supports. This may enable register files (e.g., vector register files 81) to be implemented in a more efficient manner because the register files may be designed to enable specific data formats to be used. Bearing this in mind, at subprocess block 320, the compiler 16 may determine data formats indicated by the source code. For example, the source code may indicate various operations (e.g., read operations, write operations, arithmetic operations) that involve one or more specific data formats. Additionally, at subprocess block 322, the compiler 16 may receive a user input (e.g., based on a prompt received or a graphical user option provided while the designer uses the design software 14) that indicates one or more data formats that should be supported, one or more data formats that should not be supported, or both. At subprocess block 324, the compiler 16 selects which data formats should be available in the hardware implementation that the compiler 16 will generate based on the determination associated with subprocess block 320 and the selection made at subprocess block 322. For instance, while the first pass (e.g., subprocess block 318) may be performed operating under the assumption that all data formats are available, the compiler 16 may remove one or more data formats from being when performing subsequent passes (e.g., to better enable register files to be tailored to the specifications of the source code). It should be noted that, in some embodiments, subprocess block 322 may not be performed. In such embodiments, at subprocess block 324, the compiler may select which data formats should be available based on the determination made at subprocess block 320. In any case, the compiler 16 may also use costing techniques when performing subprocess block 324 to determine which data format(s) should be selected.

For example, some numeric formats are effectively supersets of others. As an example, an FP32 value is suitable as a replacement for implementing a bfloat16 computation due to the nature of the bfloat16 data format, which is a similar to the FP32 data format but with a reduced precision. Executing a computation intended for bfloat16 using FP32 numbers will produce a similar result. In other cases, different formats may be less compatible. For example, int8 and 8-bit minifloat value (FP8) computations, despite operating on numbers of the same bit size, may not be generally interchangeable without substantially changing the results.

Accordingly, if the determination at subprocess block 320 were to indicate that FP32 values would primarily be used along with some isolated use of bfloat16 values, the compiler 16 may "promote" the bfloat16 math to FP32 math. This may slightly alter the numeric results of the computation, but it may also make the FPGA vector processor datapath uniformly single precision format, thereby reducing the number of data formats the compiler 16 should consider when performing the second pass at subprocess block 324. With that said, it should be noted that numbers need not necessarily be promoted to a larger format for this general technique to be applicable. That is, it is possible to arrange multiple smaller format numbers to approximate the behavior of a larger format. For instance, to approximate the behavior of an FP32 value, two bfloat16 values can be assigned to act as the coarse and fine portions of the range.

Accordingly, a costing function or algorithm that the compiler 16 may utilize when performing subprocess block 324 may be tailored to make several considerations. For example, the costing function may consider the end user's tolerance of computational error (e.g., ranging from very casual to having a strict need to have computations performed using a particular data type). When there is a higher desire to use a particular data type (e.g., because the end user desires more accurate results), the compiler 16 may be less likely to promote a data format in the manner discussed above. Another example of a consideration the compiler 16 may make is the desire to reduce computation time (e.g., a vector compute unit 80 can run more int8 format computations concurrently than computations involving larger data types (e.g., half-precision floating-point values (FP16 values) or bfloat16 values, both of which are smaller than FP32 values). Reducing precision would lead to fewer cycles of work, thereby enabling the integrated circuit device 12 to produce results more quickly. As yet another example of a consideration the compiler 16 may make, the compiler 16 may consider the cost of memory storage. For example, switching from a 32-bit to a 16-bit numeric format could reduce the amount of storage utilized by half. Furthermore, it should be noted that the compiler 16 may operate with a user-defined cost function that takes weighing options to produce a higher score outcome over the search space. For example, a default cost function may be modified based on user inputs made to indicate the designer's preferences.

Continuing with the discussion of the process 310, at subprocess block 326, the compiler 16 may perform a second pass in which the source code is reimplemented using the data format(s) selected at subprocess block 324. In other words, the compiler 316 may modify an initial design for a hardware implementation (e.g., of the vector processing system 26 or a portion thereof such as memory blocks utilized to store register files) to generate a subsequent design that supports the data format(s) selected at subprocess block 324. Additionally, it should be noted that while subprocess block 326 is described as including a second pass, subprocess block 326 may include multiple passes in other embodiments.

At process block 316, the compiler 16 may finalize a design for a hardware implementation of the source code (e.g., in a low-level programming language) and provide a bitstream to the integrated circuit device 12 to cause the design to be implemented onto the integrated circuit device 12.

Figure 57:
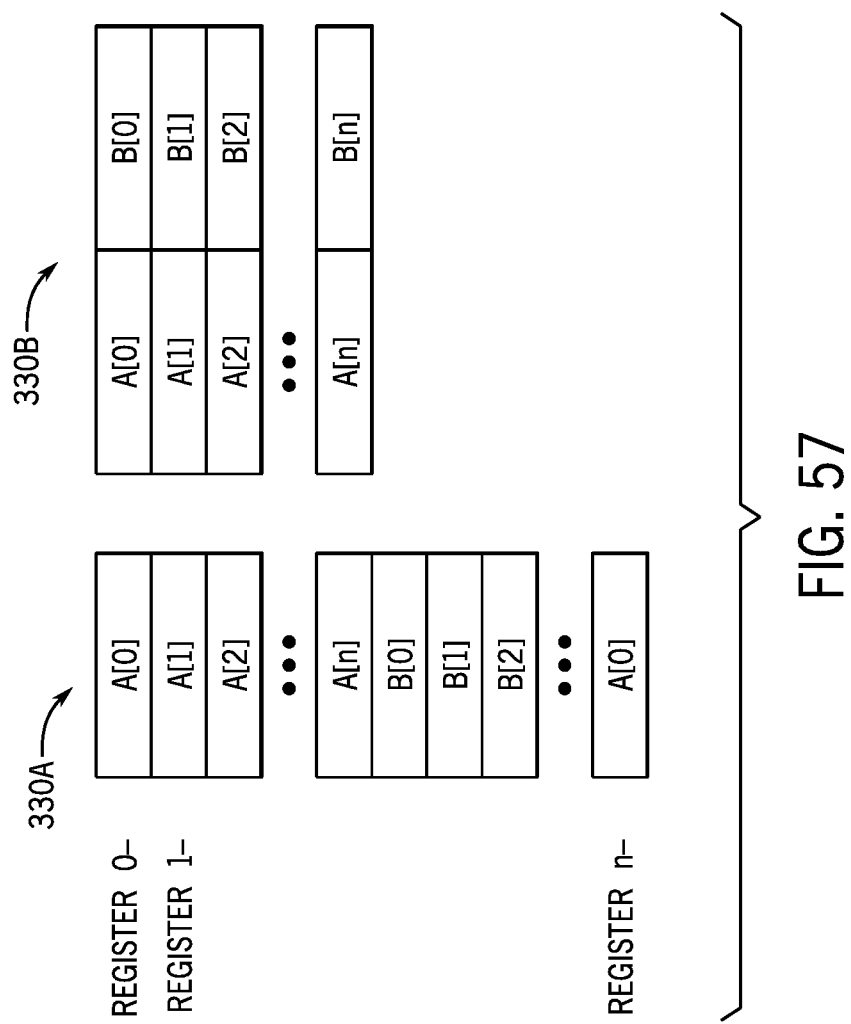
FIG. 57 illustrates groupings of vector registers, in accordance with an embodiment.

Keeping the discussion of the process 310 in mind, other considerations and optimizations associated with compiling (e.g., related to register files) will now be discussed. First, the grouping of registers will be discussed. If the compiler 16 detects that two or more variables are often accessed concurrently, the two or more variables can be rearranged to be together in main storage or even in the vector register file 81 itself. For example, consider the situation where the program wishes to compute a vector C=A*B (where c[0]=a[0]*b[0], c[1]=a[1]*b[1], etc.) along with FIG. 57. In FIG. 57, a first grouping 330A has a layout of the register file for two vectors A and B of length N words. Grouping 330B, which may be implemented using width stitching, is another arrangement of the vector elements of the first grouping 330A combined into a wider register file with the corresponding elements stored together. By storing the elements together, these elements are now available to be read in a single clock cycle for the components of vectors A and B in comparison to the two clock cycles it would take when utilizing the first grouping 330A. With that said, when utilizing the grouping 330B, the values of the register containing A[0] and B[0] may have to be written together.

The compiler 16 may take such considerations into account when performing compiling to potentially allow for increased efficiency. For example, the compiler 16 may modify how variables are stored in primary memory to match the grouped storage (e.g., grouping 330B) in a register file and gain further efficiency. The width of the elements may correspond with the width of a RAM physical storage element (e.g., when the RAM is width stitched). If this is the case, a simple change to separate the common write controls is indicated. Accordingly, rather than always writing to both halves of the width-stitched RAM, the "write to register" portion of the opcode can be expressed as a bitfield indicating to write to the upper and lower portions together or individually.

Figure 58:
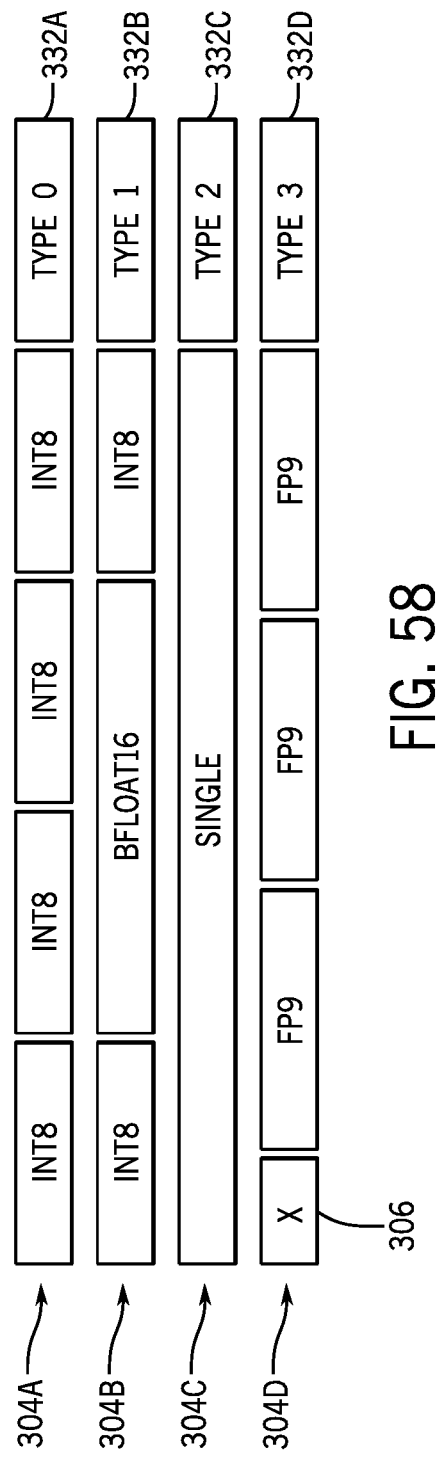
FIG. 58 illustrates words that have been marked to indicate a format of data included in the words, in accordance with an embodiment.

How the compiler 16 may handle the presence of variables in multiple numeric formats in the register file will now be discussed. As shown in FIG. 58, words 304 can be marked (e.g., using tags 332) indicating the type (i.e., format) or types of data included in a given word 304. Types can be either statically computed, including all possible groupings supported by the compiler 16, or dynamically assigned by the compiler 16 to the formats used in the program(s) that the integrated circuit device 12 is expected to handle. By assigning data types dynamically, a smaller subset of potential groupings is more likely to occur (compared to static computing). The tags 332 may be appended to each word 304 in a register file, for instance, by slightly increasing the storage width of memory used to store the words 304.

Figure 59:
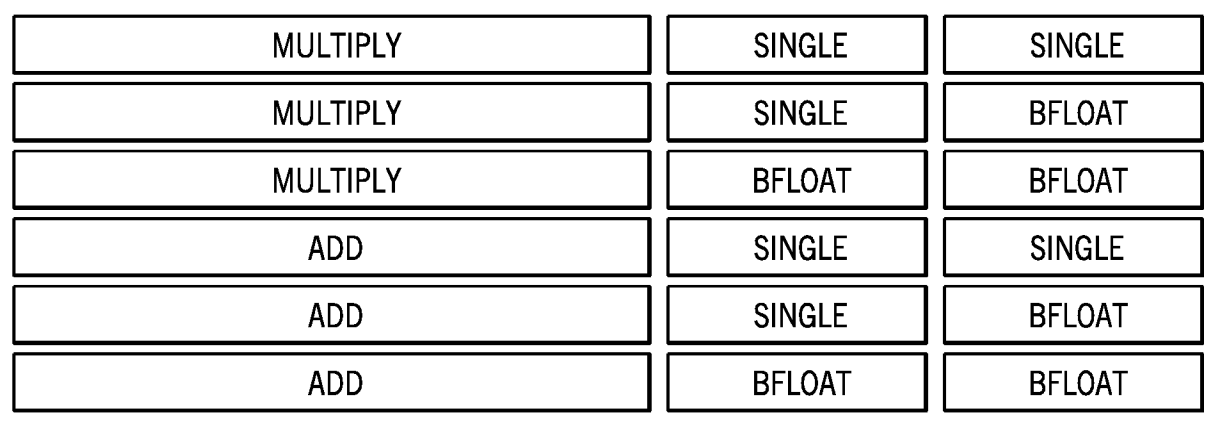
Figure 60:
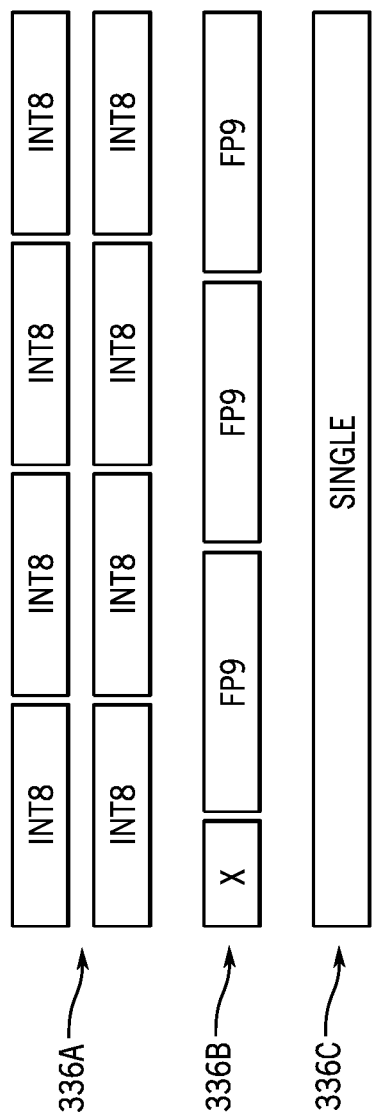
FIG. 60 is a block diagram of three groups of registers, in accordance with an embodiment.

As an alternative, the format of data can be indicated as additional fields within the instruction word (e.g., opcode) to processing circuitry, which is generally illustrated by FIG. 59. As yet another alternative, the type of a register can be implied by which register is selected. For example, with reference to FIG. 60, registers of a first group 336A of registers may store int8 values, registers of a second group 336B of registers may store nine-bit floating point values, and registers of a third group 336C of registers may store FP32 values. Also, it should be noted that in some implementations, such as those that operate using a single format, tracking number formats may not be performed.

Accordingly, when compiling (e.g., performing process block 314 of the process 310), the compiler 16 may implement support for software and associated FPGA vector hardware generation for all data formats and then select a particular data format or formats. Referring briefly back to FIG. 56, the compiler 16 may select a particular data format or formats by eliminating formats as requested by user input (e.g., input received at subprocess block 322), implement the remaining data formats for inspection (e.g., at subprocess block 324), determine a cost (e.g., based on the amount of soft logic to be used), and select the lowest cost data format to use (e.g., while performing subprocess block 326).

Furthermore, if compiling a new instruction stream for an existing FPGA vector processor architecture, the compiler 16 may follow the existing numeric type format. If there are any numeric formats used in the new software which are not present in the existing hardware, the compiler 16 may be able to eliminate one or more of the new numeric formats by converting a more "expensive" (i.e., higher cost) format existing in hardware, implementing a requested higher-level operation by software emulation using a more complex sequence of available statements to replace a single unavailable one (e.g., compose an unavailable int16 multiplication operation from four int8 multiplies and additions), tolerating potentially additional error in the computation result (e.g., using a FP16 result to implement a FP32 computation), or a combination thereof. As discussed above, each of these considerations may be taken into account (e.g., via a costing algorithm) by the compiler 16.

Figure 61:
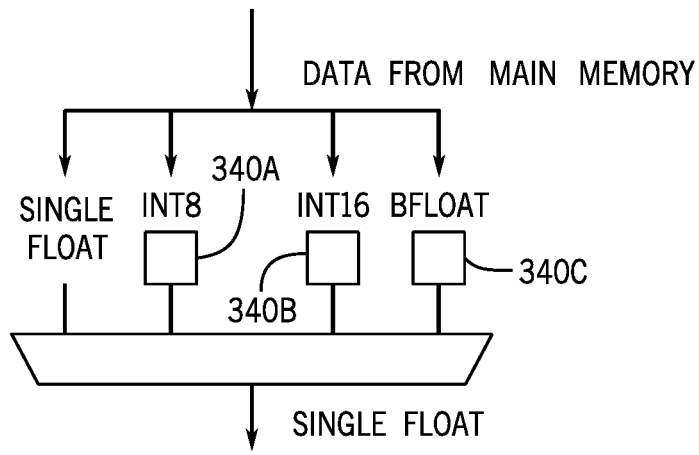
FIG. 61 is a block diagram of circuitry that may be used to perform casting, in accordance with an embodiment.

If a requested piece of software (e.g., source code provided by a designer) operates primarily in one numeric format, it may be advantageous to generate hardware to automatically convert numbers out of less commonly used formats to the more commonly used format. Dynamically changing the type of a data element may be referred to as "casting." Turning to FIG. 61, as an example of how casting may be performed, the single-precision floating-point format (i.e., FP32) can be used represent numbers in several smaller formats (e.g., int8, int16, bfloat16). Accordingly, conversion circuitry 340 (e.g., conversion circuitry 340A, 340B, 340C) dynamically converts data of other formats (e.g., int8, int16, bfloat16) and converts the data to another format (e.g., FP32). If the compiler 16 determines that it is advantageous to introduce format conversion circuitry (e.g., conversion circuitry 340), the conversion circuitry 340 may be included upstream of the vector register file 81, thereby enabling elements to be rapidly converted to another format before being stored for subsequent computation.

As discussed above, there may be multiple copies of data (e.g., multiple copies of vector registers 60, as shown in FIG. 3). Bearing this in mind and continuing to FIG. 62, multiple memory blocks 252 may be utilized to enable concurrent reads of data to be performed. For example, when a DSP block 334 (which may be employed as vector processing unit 66), is to multiply together two registers, if a duplicate of the vector register file 81 is made so that each memory block 252 includes a copy of the vector register file 81, vector elements to be used in the multiplication may be provided to the DSP block 334 in a single read operation. The read addresses of the two memory blocks 252 are independent while the write controls are identical. This technique illustrated in FIG. 62 may be expanded to enable any suitable number of read ports to be provided to a register file (e.g., vector register file 81) by simply adding another copy of the register file.

Figure 62:
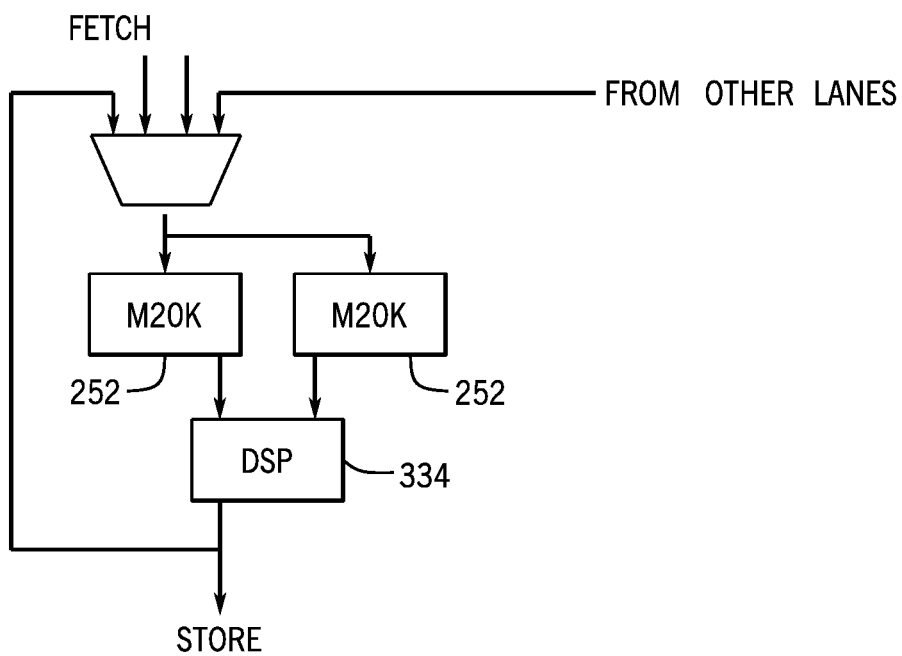
FIG. 62 illustrates circuitry that may be included within a lane of a vector processing system, in accordance with an embodiment.
Figure 63:
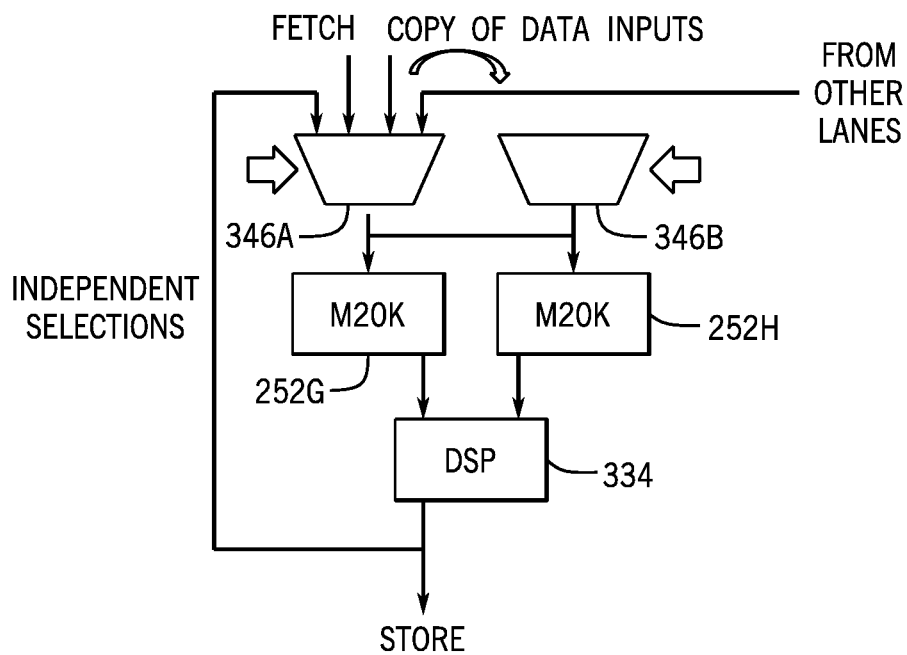
FIG. 63 illustrates independent control of write control signals for memory blocks, in accordance with an embodiment.

Keeping the discussion of FIG. 62 in mind while continuing to FIG. 63, circuitry may be added to enable write controls to the memory blocks 252 to be performed independently. For instance, as illustrated in FIG. 63, multiplexer 346A may control which data is written to memory block 252G, while multiplexer 346B may controls which data is written to memory block 252I. In an FPGA, the hardware cost for adding multiplexers is relatively small. For example, a 4:1 multiplexer may be implementing using a single Arithmetic Logic Unit (ALU) included in an FPGA, while smaller multiplexers (e.g., a 2:1 multiplexer) may be implemented using half of an ALU.

As noted above, to perform operations, vector processing units 66 may receive inputs from two registers, execute some function (e.g., multiplication, addition) on the inputs, and write the result back to a register, which could be one of the two input registers. New values come in over the "fetch" path from external storage, and finished computation results are dispensed out the bottom along the "store" path. The ratio between these operations is algorithm-specific (e.g., specific for a particular algorithm coded by the source code) and may be analyzed by the compiler 16 to determine whether to enable independent write operations, and, if so, the degree to which independent write operations will be enabled (e.g., independent write operations for all memory blocks 252, a portion of the memory blocks 252, or none of the memory blocks 252).

For example, consider a program with the following access pattern, which could be used for several applications such as AI applications:
1. Fetch weight values from memory, store into some register(s) W;
2. Repeat:
   2A. Fetch sample values from memory, store into temporary register(s) S;
   2B. Multiply the corresponding elements of S and W, store the results into register(s) M;
   2C. Sum the values of M register(s);
   2D. Store the sum so that it is available in the next stage of computations;

In this example, it may be inconvenient that a value to be written to a register comes from either the external memory or the computed result. If modified to add a second write path, as shown in FIG. 63, the vector processing system 26 would have the ability to simultaneously write the computed result M and fetch the next sample S. This same principle may be application to any commutative operations, such as multiplication, addition, or Boolean operations (e.g., AND, OR, XOR operations). Thus, providing the ability to perform independent write operations may effectively double the number of available registers (e.g., compared to following the approach shown in FIG. 62).

Figure 64:
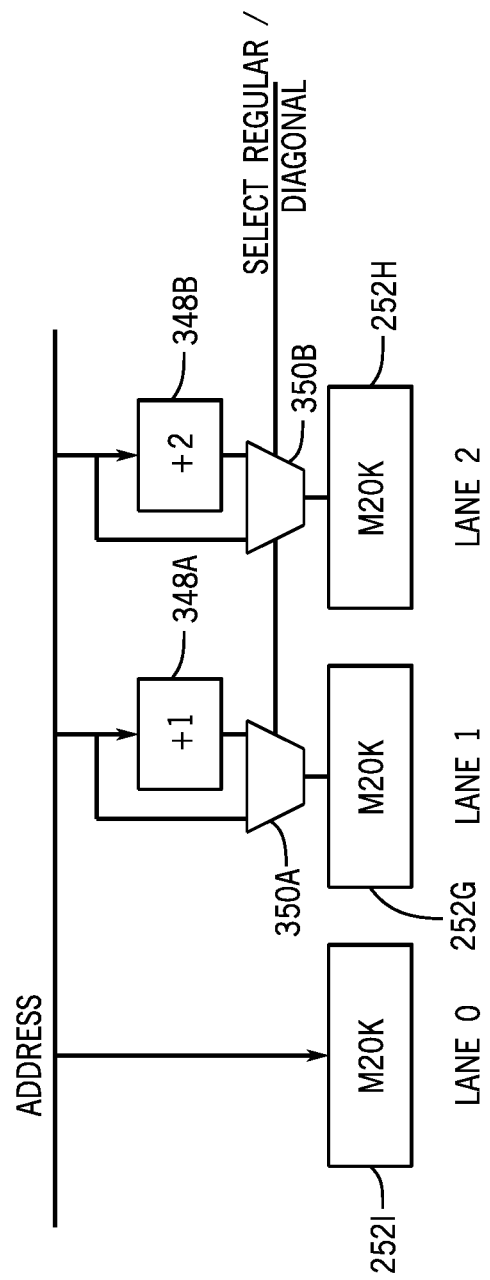
FIG. 64 illustrates circuitry that may be utilized to implement regular write patterns and diagonal write patterns, in accordance with an embodiment.
Figure 65:
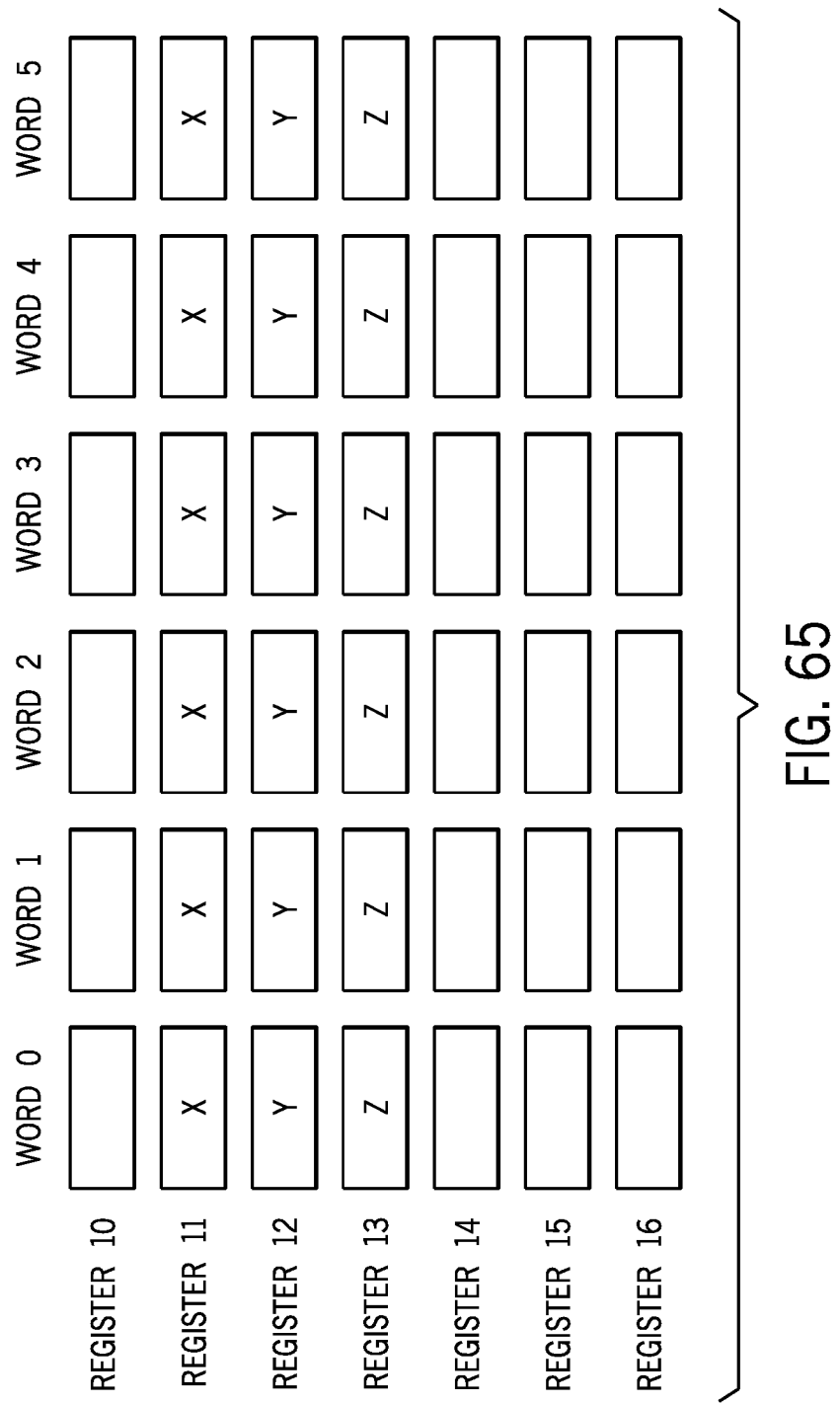
FIG. 65 illustrates a regular write pattern, in accordance with an embodiment.
Figure 66:
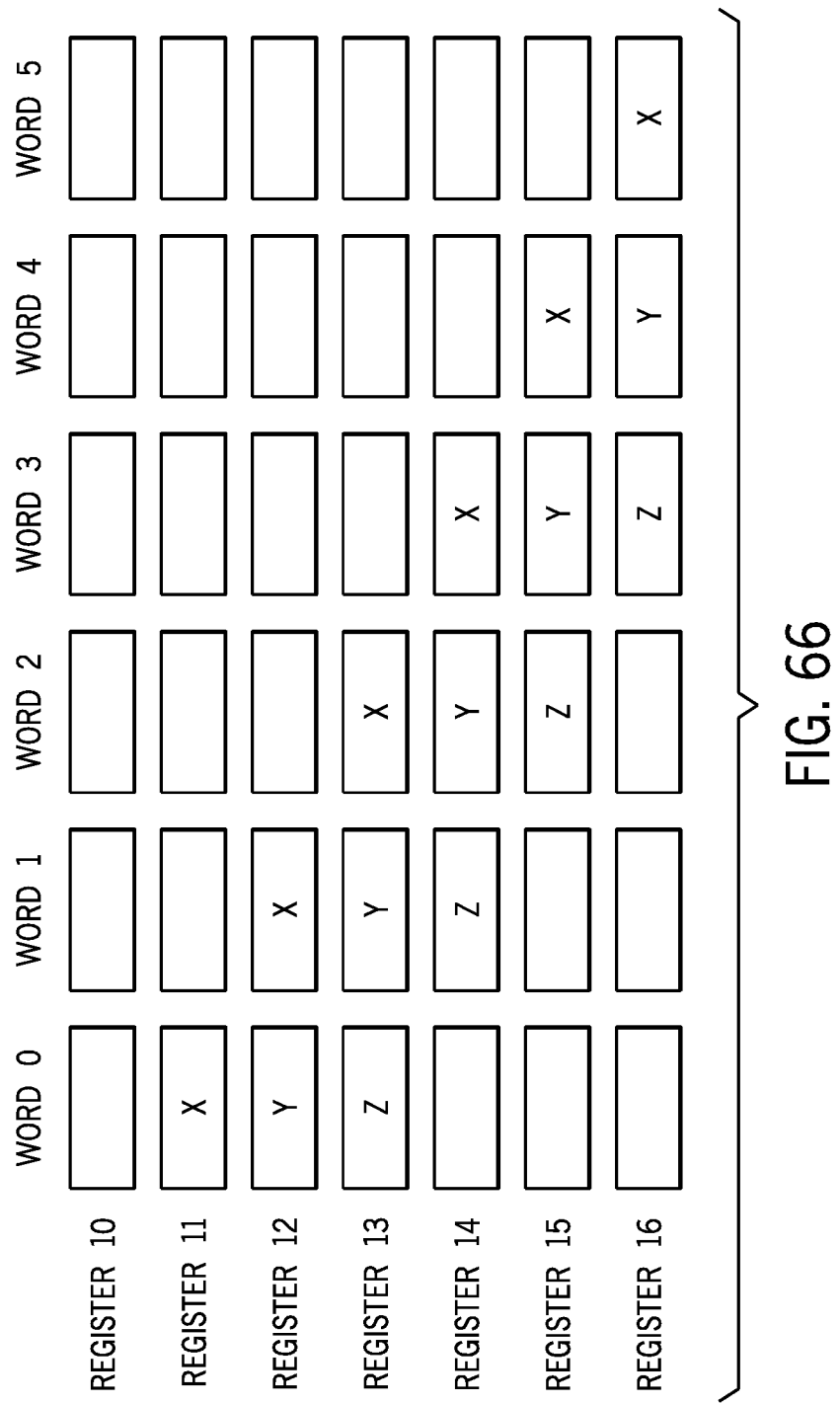
FIG. 66 illustrates a diagonal write pattern, in accordance with an embodiment.

Furthermore, in cases in which memory banks 252 may be written to independently of one another, different write patterns may be utilized. For example, as shown in FIG. 64, addressing logic 348 (e.g., addressing logic 348A, 348B) may be utilized in conjunction with multiplexers 350 (e.g., multiplexers 350A, 350B) to produce different access patterns. In particular, the multiplexers 350 may receive an address signal, a signal from addressing logic 348, and a control signal (e.g., to select regular or diagonal write patterns). The regular and diagonal write patterns are respectively illustrated in FIG. 65 and FIG. 66. In FIG. 65 and FIG. 66, vector X, vector Y, and vector Z are written to data registers. As shown in FIG. 65, when following a regular write pattern, the elements of each vector are written to the same register. FIG. 66, which shows a diagonal write pattern that may be implemented by performing addressing using a signal provided from addressing logic 348.

It should be noted that the patterns illustrated in FIG. 65 and FIG. 66 are two examples of many patterns that may be utilized. For example, other patterns involving manipulating the storage address on a lane by lane basis can be achieved by utilizing the addressing logic 348 and multiplexers 350. Patterns involving swapping of elements (e.g., horizontal exchanges rather than vertical exchanges shown in FIG. 65 and FIG. 66) are also achievable.

Figure 67:
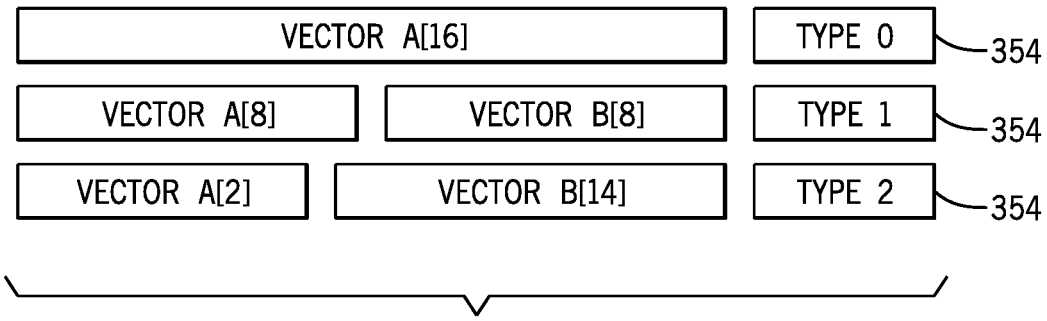
FIG. 67 illustrates vector data that has been tagged to indicate on roe more data types included in the vector data, in accordance with an embodiment.

In many cases, the length of vectors being operated on may be a multiple of the number of lanes 82 provided so that a computation occurs across all lanes (e.g., in order to enable the vector processing system 26 to operate more efficiently). However, this may not be practical for certain applications. Accordingly, in such instances, hardware included in the vector processing system 26 (e.g., memory blocks utilized, lanes 82) and the compiler 16 may represent smaller vector types. One technique to do this is illustrated in FIG. 67, which includes vector data (e.g., vector A and vector B) and other data (e.g., metadata or tags 354) that indicates one or more data types. Each tag 354 may be stored in a memory unit that is not directly associated with any particular lane 82 and used to carry type information regarding an entire cross lane word. As with individual lane numeric formats, this information could also be carried in the opcode, with different lanes electing to handle the data differently based on the full vector type. For example, a tag 354 may imply adding the elements in the vector A position and multiplying the elements in vector B. In any case, when a design (e.g., as indicated by source code provided from a designer) calls for utilizing vectors with lengths fewer in number than the number of lanes 82 used, the compiler 16 compiler may recover computing bandwidth by performing operations involving the vectors concurrently because performing the operations sequentially may leave idle lanes 82.

The compiler 16 may determine whether a bit (e.g., flag or tag) should be used to indicate a property of a data format. For example, if an algorithm to be performed on the integrated circuit device 12 (e.g., as indicated by source code made by a designer) makes frequent use of patterns involving the selection of a subset of the vector elements, it may be appropriate to add a bit indicating such property. Indeed, as noted above, the nature of the FPGA memories and the use of width stitching may create the opportunity to add an additional bit to a stored word without a commensurate increase in hardware cost. Another example of when an extra bit may be used with a word is when performing a rectified linear activation (RELU) operation which keeps all non-negative numbers, particularly when the words are of a data format that does not include a sign bit.

Having discussed various memory considerations the compiler 16 may make, the discussion will now turn to intra-lane connectivity patterns and how the compiler 16 may select which patterns will be used in a hardware implementation of a vector processing system 26. For instance, many applications may involve steps in which results are aggregated across lanes 82 of the vector processing system 26. One example from AI applications may include summing together all of the individual lane results (e.g., performing an additive reduction or accumulation) and then selecting the maximum value across the lanes. Another example is combining elements with a bitwise operation (e.g., XOR to compute a summation in a Galois field) or selectively combining elements (e.g., performing a conditional operation to determine a sum if a corresponding flag is present).

One determination the compiler 16 may make when compiling source code is determining which data sources are available to the vector register file 81 for a lane 82. While there is no particular upper limit to the number of sources, the more data sources available to a vector register file 81 (or scalar register file), the more routing circuitry (e.g., wires, multiplexers) that will be utilized. Accordingly, the compiler 16 may utilize a costing function or algorithm that takes into account (e.g., by assigning a cost) circuitry that would be present in different potential implementations as well as speed considerations (e.g., whether the vector processing system 26 will be able to perform operations more quickly in one hardware implementation compared to another implementation). In one embodiment a vector register file 81 having a single data source is considered to have the lowest cost, and the cost for using two or three inputs may be considered to be low (e.g., equal to or slightly greater than the cost associated with using one data source). Adding a fourth input may cause more circuit area to be used for routing while maintaining processing speeds experienced when one, two, or three data sources are used. Furthermore, it should be noted that more than four data sources may be available vector register files 81. For instance, in one embodiment, a vector register file 81 may be communicatively coupled to n data sources, where n is an integer between one and thirty-six, inclusive.

Figure 68:
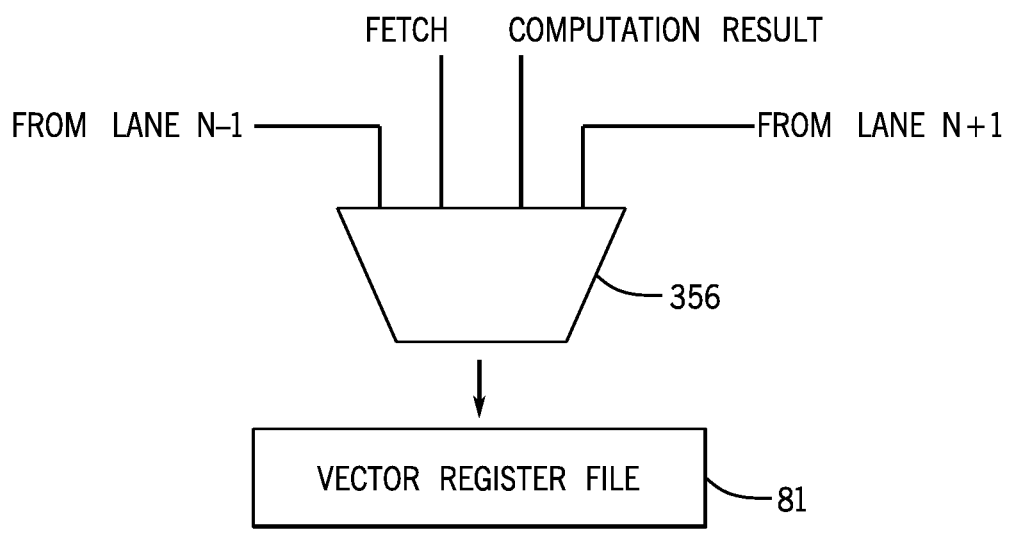
FIG. 68 illustrates routing from four data sources to a vector register file, in accordance with an embodiment.

Continuing with the drawings, FIG. 68 illustrates routing from four data sources to vector register file 81. In particular, a 4:1 multiplexer 456 may receive four inputs and selectively writes one of the inputs to the vector register file 81. In this example, the four inputs include data from two lanes 82 adjacent to the lane 82 that utilizes the vector register file 81, fetched data (indicated by "fetch"), and a computation result (e.g., an output from a vector processing unit 66 included in the lane 82). Accordingly, in this example, data may be fetched, computation results may be stored, and the vector register file 81 is available to two other data sources (e.g., two lanes 82 adjacent to the lane 82 that utilizes the vector register file 81). In other embodiments, the additional input sources could come from one or more lanes 82, a scalar source (e.g., scalar register 62), a secondary fetch source, or a constant.

The compiler 16 may provide connectivity to other lanes 81 in many cases. One potential exception to this may be when a computation is completely independent. In one potential implementation, the compiler 16 may implement a ring pattern in which each lane 82 is communicatively coupled to, and receives an input from, a preceding lane 82, and the last lane 82 is communicatively coupled to the first lane 82. Accordingly, given time, requested data can travel around the ring to any destination. Ring structures and modifications that may be made to ring structures are described in more detail below.

In any case, the compiler 16 may study the flow of data elements as called for in a program (e.g., source code provided by a designer). The compiler 16 may also restructure the program into a mathematically equivalent expression exploiting the various associative and communitive relationships between elements used when executing the program. Additionally, the compiler 16 may default to a ring structure as a base structure to use when determining a hardware implementation for a program and consider other lane structure to determine which arrangement of lanes (and interconnectivities between lanes) should be used in the hardware implementation. For example, instead of forming a full ring pattern, the compiler 16 may use two half rings and add one additional write path (with multiplexing circuitry) to combine the ring results.

As another example, a program may call for a vector to be fetched, one or eight permutations to be applied to the elements of the vector, and to write back the permutated vector to a vector register. For such a program, the compiler 16 may determine to increase the number of write sources (e.g., from four to eight) such that an element be moved as quickly as possible to the desired permutation destination. The compiler 16 may determine a potential increase in latency causing by using eight write sources (relative to using four write sources) and determine the number of data sources to which the vector register file 81 would be available.

Figure 69:
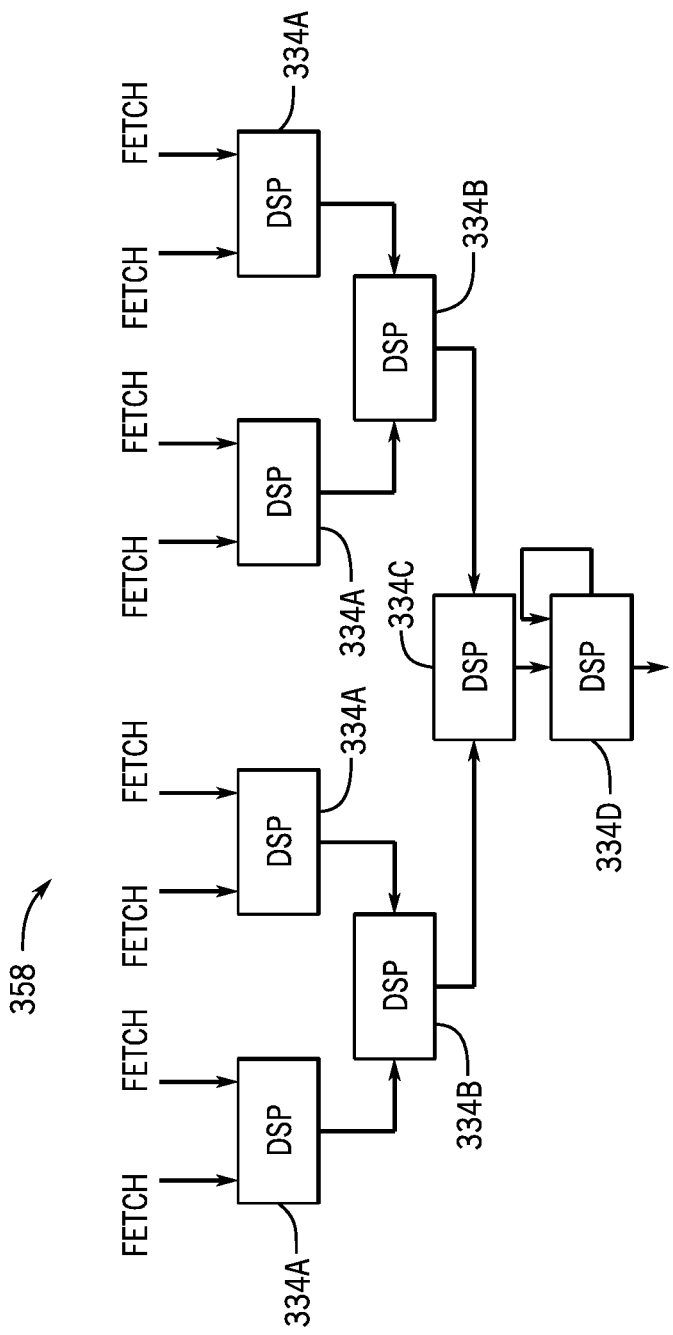
FIG. 69 is a block diagram of a tree structure, in accordance with an embodiment.

As yet another example, the compiler 16 may determine a structure other than a loop should be used. For instance, vector compute units 66 across one or more lanes 82 may be linked to form a tree structure, such as tree structure 358 of FIG. 69. The tree structure 358 may be used in a program that fetches a vector from memory, sums the elements of the vectors, and adds the result to a previous sum. In such a case, DSP blocks 334A may determine sums of vector elements, DSP blocks 334B may perform intermediate addition involved sums determined by the DSP blocks 334A, DSP block 334C may add the sums generated by the DSP blocks 334B, and DSP block 334D may add the sum generated by the DSP block 334C to a previously determined sum.

Furthermore, the compiler 16 may determine that a computation should not be performed by a vector processing unit 66. For example, the tree structure 358 may be implemented outside of lanes 82 and perform summations on outputs from lanes. In such a case, the addition operations that the tree structure 358 performs may be completed more quickly compared to performing similar summations using vector processing units 66 in lanes 82.

Figures 70A, 70B:
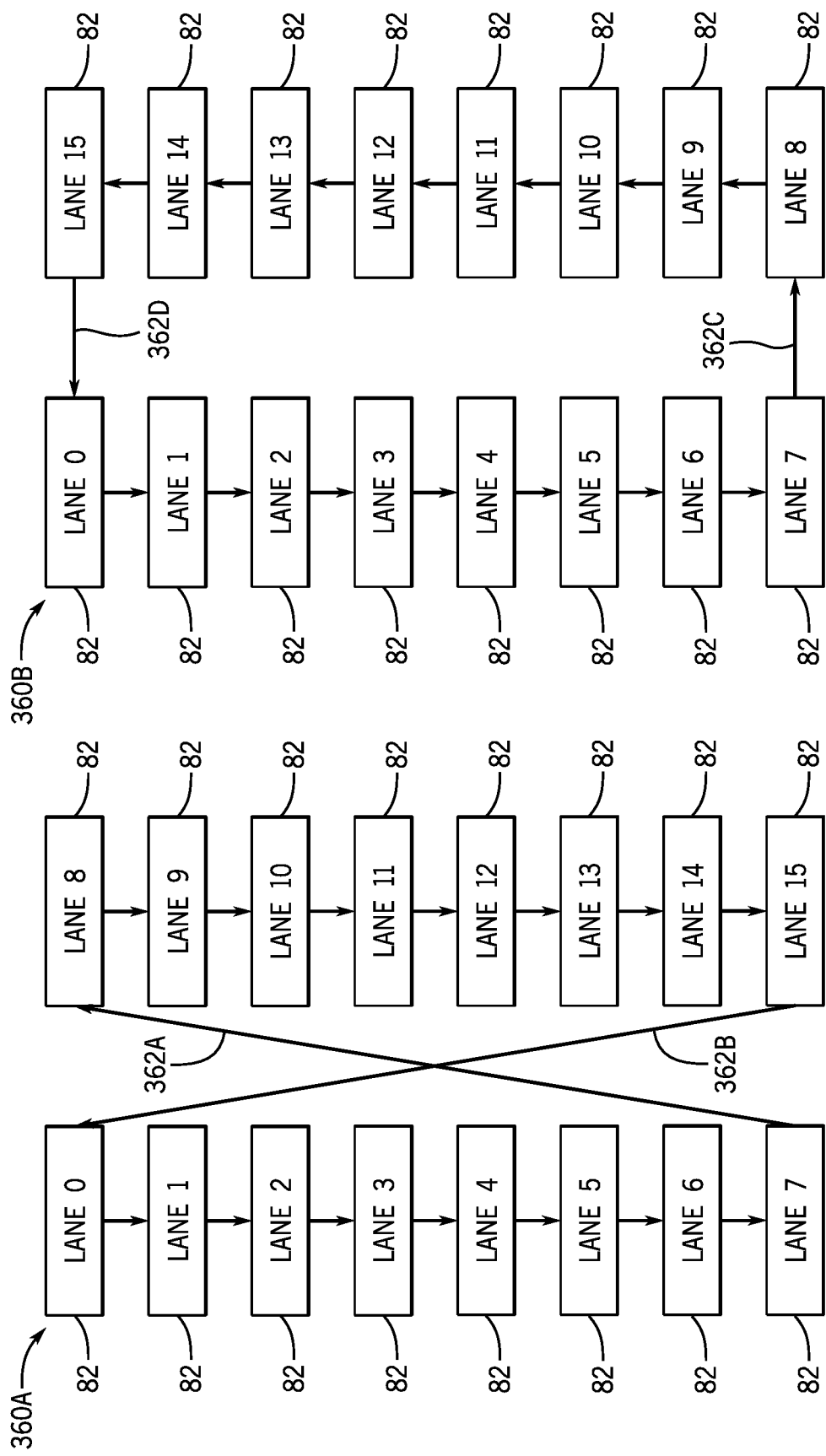
FIG. 70A, is a block diagram of a first ring structure, in accordance with an embodiment.
FIG. 70B is a block diagram of a second ring structure, in accordance with an embodiment.

When determining the layout of lanes 82, the compiler 16 may consider variables such as, but not limited to, the availability of memory, computing resources of DSP blocks 334 included on the integrated circuit device 12, and latency. As noted above, the compiler 16 may generate ring structures. Different layouts for a 16-lane ring structure 360 (e.g., ring structures 360A, 360B) are illustrated in FIG. 70A and FIG. 70B. As illustrated, lines 362A, 362B of ring structure 360A are longer than lines 360C, 360D of ring structure 360B, the ring structure 360A will have higher latency than ring structure 360B. Accordingly, the compiler 16 may opt to utilize ring structure 360B rather than ring structure 360A when generating a 16-lane ring structure.

Figure 71:
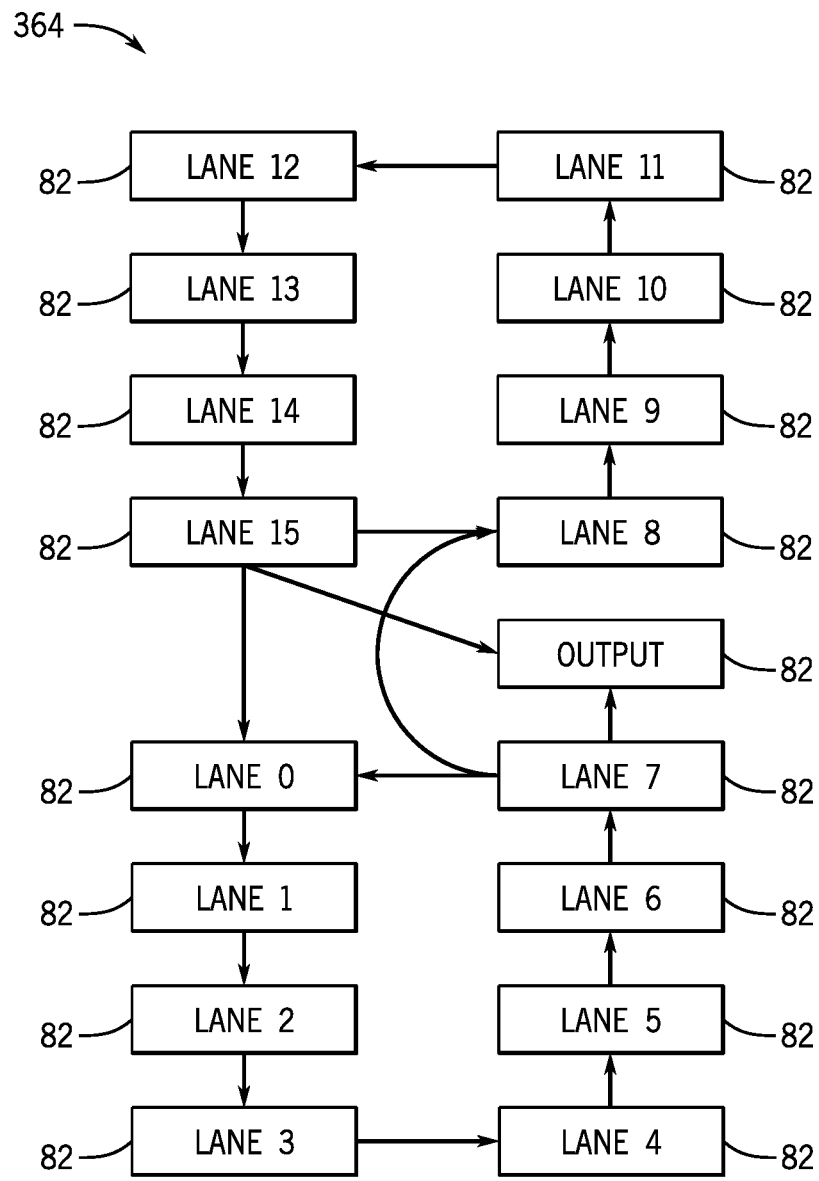
FIG. 71 is a block diagram of third ring structure, in accordance with an embodiment.

In cases in which the communication pattern between lanes 82 is more complicated or the vector processor system 26 includes output side combination logic, the compiler 16 may determine a layout for the lanes 82 accommodate additional adjacencies. An example of such a layout is illustrated in FIG. 71. In particular, FIG. 71 includes a layout 364 with a ring connecting lanes 0-15, two sub-rings connecting lanes 0-7 and lanes 8-15, and an output side adder gathering results from lanes 7 and 15. Accordingly, the compiler 16 is aware of the selected connectivity between lanes 82 and output side logic, if any. Furthermore, after having selected a lane and output logic connectivity pattern for a program (e.g., source code made by a designer), the compiler 16 can run a simulated annealing search to minimize the physical distance between elements and record that placement solution (e.g., to be used in a vector processing system 26 to be implemented on the integrated circuit device 12).

Figure 72:
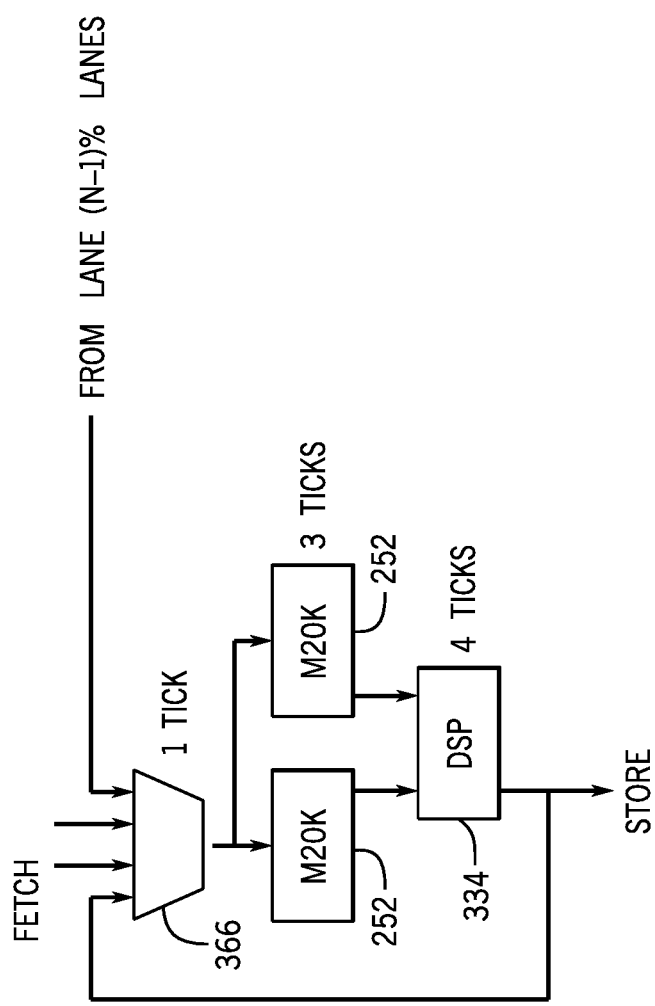
FIG. 72 illustrates latencies associated with various types of circuitry that may be included in a lane, in accordance with an embodiment.

The compiler 16 may also take latencies associated with circuitry included in or associated with a lane 82. For example, with reference to FIG. 72, when performing an instruction to add values stored in from registers on the memory blocks 252 and write the result back to one of the memory blocks 252, it make take nine clock cycles: three clock cycles for the values to be read from propagate through the memory blocks 252, four clock cycles for addition to occur in and propagate through the DSP block 334, one clock cycle for the output of the result to propagate to multiplexer 366, and one clock cycle to write the result to one of the memory blocks 252. Accordingly, as different operations are performed when executing the instruction, various circuitry may be idle for several clock cycles. To decrease idle time, the compiler 16 may inject multiple instructions, for example, so that registers of the memory blocks 252 are being read for one instruction while the DSP block 334 is operating on previously read values associated with another instruction.

However, as discussed above, when multiple instructions are to be executed, hazards (e.g., read-after-write, write-after-read, and write-after-write hazards) may occur. The compiler 16 may determine the presence of hazards when compiling source code and cause the hazards to be resolved. For example, the compiler 16 may generate a design the executes a pipeline stall, reorder instructions so that vector elements not associated with the hazard may be operated on during the time a hazard exists, or a combination of both techniques. For example, the compiler 16 may identify operations to be performed that will fill some of the time a hazard is present and delay for the remainder of the time (e.g., until the condition causing the hazard no longer exists). Furthermore, as noted above, control logic (e.g., control logic 83) may be utilized to introduce delays to handle hazards.

Figure 73:
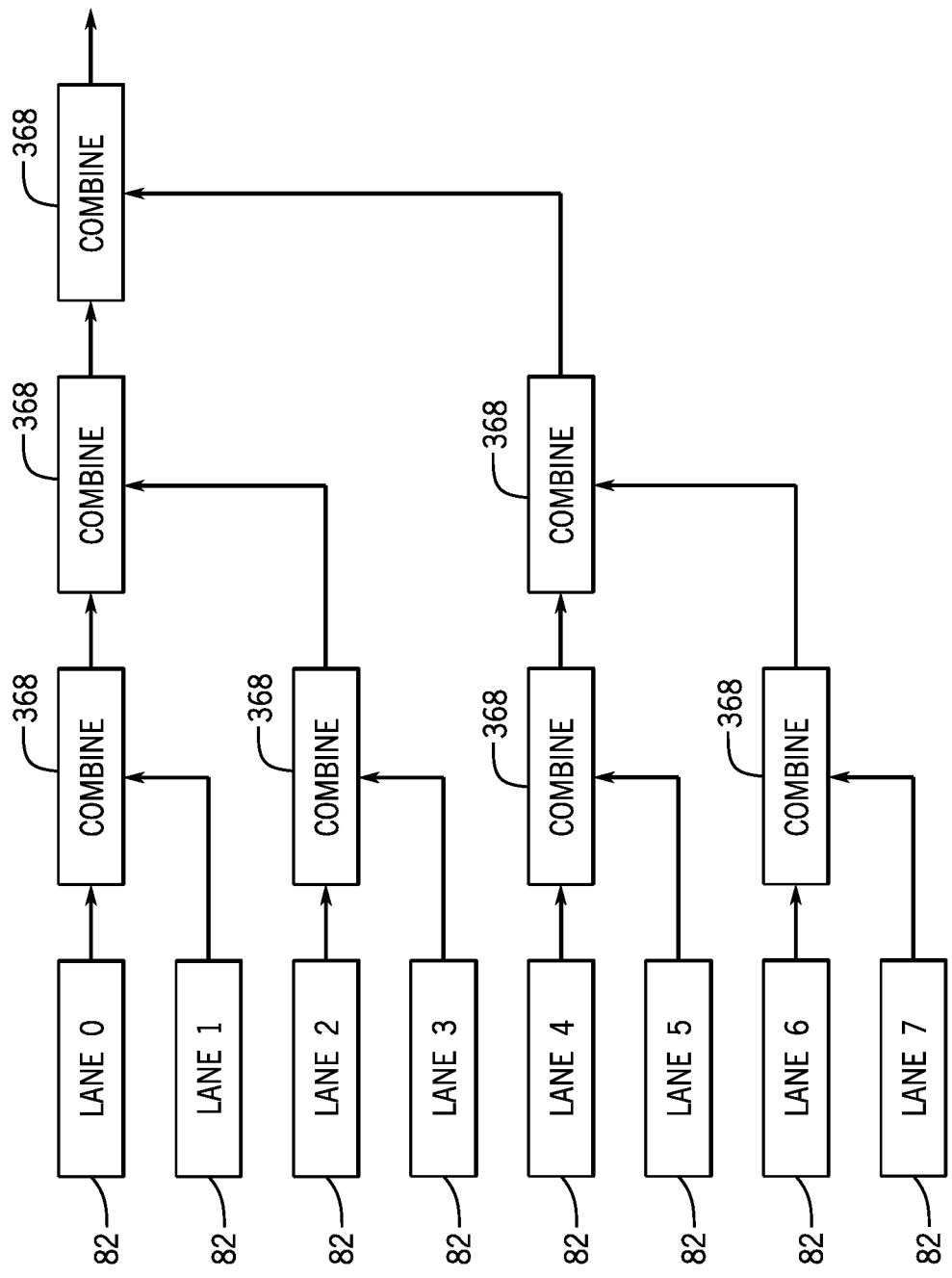
FIG. 73 is a block diagram of eight lanes and combining circuitry that may be utilized to combine the outputs of the eight lanes, in accordance with an embodiment.

The compiler 16 may also consider the timing of intra-lane operations to reduce the amount of circuitry in the vector processing system 26 that is idle, thereby providing hardware implementations with reduced latencies. Referring to FIG. 73, eight lanes 82 may output results (e.g., products, sums, or other values determined by vector processing units 66) through combining circuitry 368 (e.g., adder circuitry or Boolean logic circuitry) to generate a final output. As the outputs of the lanes 82 propagate through the combining circuitry 368, the lanes 82 are free to advance to the next operation immediately. For example, the lanes 82 could produce an array of eight multiplication results every clock cycle. Thus, the lanes 82 may constantly be execute instructions.

As another example, if lanes 82 are arranged in a ring structure (e.g., as shown in FIG. 70B), a reduction operation presents relatively more scheduling difficulty than the example discussed above with respect to FIG. 73. For instance, while each lane 82 delivers its vector elements at the same time for the reduction, it will take some time for the result from a first lane 82 to propagate through the chain through register files and DSP blocks 334 to reach the final lane where the full result is available. However, once a lane 82 delivers a result, that result is in the pipeline, and the lane 82 is free to perform some other activity (e.g., an operation associated with another instruction).

Building on this example, the timing of the execution of an instruction may be staggered across lanes 82 so that lanes 82 are processing data with relatively small amounts of idle time. As shown below in Table 7, three lanes (lane 0, lane 1, lane 2) may begin to perform operations (e.g., as part of executing an instruction) at staggered times (e.g., ten clock cycles apart from one another). While there is some idle time (e.g., in lanes 1 and 2), once a lane has begun operating, there may be no idle time.

TABLE 7

| Time | Lane 0 | Lane 1 | Lane 2 |
| --- | --- | --- | --- |
| 0 | fetch r[1] mem[16] | | |
| 1 | fetch r[2] mem[17] | | |
| 2 | fetch r[3] mem[18] | | |
| 3 | fetch r[4] mem[19] | | |
| 4 | fetch r[5] mem[20] | | |
| 5 | fetch r[6] mem[21] | | |
| 6 | fetch r[7] mem[22] | | |
| 7 | fetch r[8] mem[23] | | |
| 8 | fetch r[9] mem[24] | | |
| 9 | fetch r[10] mem[25] | | |
| 10 | fetch r[11] mem[26] | fetch r[1] mem[16] | |
| 11 | fetch r[12] mem[27] | fetch r[2] mem[17] | |
| 12 | fetch r[13] mem[28] | fetch r[3] mem[18] | |
| 13 | fetch r[14] mem[29] | fetch r[4] mem[19] | |
| 14 | fetch r[15] mem[30] | fetch r[5] mem[20] | |
| 15 | fetch r[16] mem[31] | fetch r[6] mem[21] | |
| 16 | fetch r[17] mem[48] | fetch r[7] mem[22] | |
| 17 | fetch r[18] mem[49] | fetch r[8] mem[23] | |

TABLE 7-continued

| Time | Lane 0 | Lane 1 | Lane 2 |
|------|--------|--------|--------|
| 18 | fetch r[19] mem[50] | fetch r[9] mem[24] | |
| 19 | fetch r[20] mem[51] | fetch r[10] mem[25] | |
| 20 | fetch r[21] mem[52] | fetch r[11] mem[26] | fetch r[1] mem[16] |
| 21 | fetch r[22] mem[53] | fetch r[12] mem[27] | fetch r[2] mem[17] |
| 22 | fetch r[23] mem[54] | fetch r[13] mem[28] | fetch r[3] mem[18] |
| 23 | fetch r[24] mem[55] | fetch r[14] mem[29] | fetch r[4] mem[19] |
| 24 | fetch r[25] mem[56] | fetch r[15] mem[30] | fetch r[5] mem[20] |

Somewhat similarly, Table 8 shows activity on lanes 0, 1, and 2 surrounding reduction operations. In particular, lane 0 is finishing a series of floating-point multiplication operations, writing back the results, performing two reduction operations, and then a series of floating-point addition operations. Some activities are concurrent, using different portions of the data path. For example, at time 0 (shown in Table 7), lane 0 is starting a floating-point addition of registers [16] and [48], ultimately writing to register [90] and writing a reduction result to register [80]. The associated write of register [90] occurs several cycles later at time 85 when the addition has completed. The next lane, lane 1, is still completing the prior multiply when lane 0 starts the first reduction (e.g., at time 71). When lane 1 starts performing a reduction at time 81, the partial reduction results from lane 0 are immediately available because the results were written to register [80] at time 79.

TABLE 8

| Time | Lane 0 | Lane 1 | Lane 2 |
|------|--------|--------|--------|
| 62 | fmul rd[74] ra[15] rb[31] wr[68] | fmul rd[64] ra[5] rb[21] wr[54] | fadd [50] ra[11] rb[27] wr[44] |
| 63 | fmul rd[75] ra[16] rb[32] wr[69] | fmul rd[65] ra[6] rb[22] wr[55] | fadd [51] ra[12] rb[28] wr[45] |
| 64 | wr[70] | fmul rd[66] ra[7] rb[23] wr[60] | fadd [52] ra[13] rb[29] wr[46] |
| 65 | wr[71] | fmul rd[67] ra[8] rb[24] wr[61] | fadd [53] ra[14] rb[30] wr[47] |
| 66 | wr[72] | fmul rd[68] ra[9] rb[25] wr[62] | fadd [54] ra[15] rb[31] wr[48] |
| 67 | wr[73] | fmul rd[69] ra[10] rb[26] wr[63] | fadd [55] ra[16] rb[32] wr[49] |
| 68 | wr[74] | fmul rd[70] ra[11] rb[27] wr[64] | fmul rd[60] ra[1] rb[17] wr[50] |
| 69 | wr[75] | fmul rd[71] ra[12] rb[28] wr[65] | fmul rd[61] ra[2] rb[18] wr[51] |
| 70 | | fmul rd[72] ra[13] rb[29] wr[66] | fmul rd[62] ra[3] rb[19] wr[52] |
| 71 | reduce rd[80] ra[1] | fmul rd[73] ra[14] rb[30] wr[67] | fmul rd[63] ra[4] rb[20] wr[53] |
| 72 | | fmul rd[74] ra[15] rb[31] wr[68] | fmul rd[64] ra[5] rb[21] wr[54] |
| 73 | | fmul rd[75] ra[16] rb[32] wr[69] | fmul rd[65] ra[6] rb[22] wr[55] |
| 74 | | wr[70] | fmul rd[66] ra[7] rb[23] wr[60] |
| 75 | reduce rd[81] ra[2] | wr[71] | fmul rd[67] ra[8] rb[24] wr[61] |
| 76 | | wr[72] | fmul rd[68] ra[9] rb[25] wr[62] |
| 77 | | wr[73] | fmul rd[69] ra[10] rb[26] wr[63] |
| 78 | | wr[74] | fmul rd[70] ra[11] rb[27] wr[64] |
| 79 | fadd rd[90] ra[40] rb [17] wr[80] | wr[75] | fmul rd[71] ra[12] rb[28] wr[65] |
| 80 | fadd rd[91] ra[41] rb [18] | | fmul rd[72] ra[13] rb[29] wr[66] |
| 81 | fadd rd[90] ra[42] rb [19] | reduce rd[80] ra[1] | fmul rd[73] ra[14] rb[30] wr[67] |
| 82 | fadd rd[90] ra[43] rb [20] | | fmul rd[74] ra[15] rb[31] wr[68] |
| 83 | fadd rd[90] ra[44] rb [21] wr[81] | | fmul rd[75] ra[16] rb[32] wr[69] |
| 84 | fadd rd[90] ra[45] rb [22] | | wr[70] |
| 85 | fadd rd[96] ra[46] rb [23] wr[90] | reduce rd[81] ra[2] | wr[71] |
| 86 | fadd rd[97] ra[47] rb [24] wr[91] | | wr[72] |
| 87 | fadd rd[98] ra[48] rb [25] wr[92] | | wr[73] |

Keeping the foregoing discussion regarding the compiler 16 in mind, the discussion now turns to the compiler 16 generated customized vector processor systems 26. For example, the compiler 16 may generate a hardware description for a program (e.g., source code provided by a designer) that includes a vector processing system 26 (or portions thereof) that may be provided to the integrated circuit device 12 to cause the integrated circuit device 12 to physically implement the vector processing system 26 as described (e.g., in a low-level programming language) by the compiler 16.

Given the flexibility of FPGAs, there are many potential designs of vector processing systems 26 that may be able to perform operations described in a program written by a designed. The compiler 16 may select from a menu of processor targets (which is not necessarily the same as the processor running the compiler 16). When implementing a vector processor (e.g., vector processing system 26) on an FPGA, the target may be known (e.g., compiling a new program for an existing soft processor) or open to definition for a new program or set of programs.

The design of vector processor systems 26 may either be dictated by the user (e.g., based on a desired circuitry cost versus capability tradeoff) or one or more factors selected by the compiler 16. In the latter case, the user provides the desired program (e.g., source code), and the compiler 16 generates vector processors (e.g., several designs of vector processing systems 26) with a variety of computational elements. Each design would have a known circuitry cost. Furthermore, the user may also provide information (e.g., via design software 14) regarding any requirements that the user would like to be met (e.g., a minimum processing speed, a maximum physical area of the integrated circuit device 12 that the vector processing system 26 may occupy when implemented on the integrated circuit device 12). The user may also provide guidance based on sensitivity to circuit area versus performance. After simulating the available options, the compiler 16 outputs an implementation of the vector processing system 26 (or a portion thereof, such as lanes 82) that is closest to satisfying the user request and an instruction code implementing the program for the target compute node.

The compiler 16 may enable hardware for intrinsic operations to be implemented (e.g., using soft logic) on an FPGA. Generally speaking, an intrinsic operation is more complex than more routine operations such as addition, multiplication, and comparison operations. Using the design software 14, a user (e.g., designer) may add to a soft processing element having a specific intrinsic capability. A program (e.g., source code) may call for the intrinsic operation to be performed, and the compiler 16 may utilize the soft processing element in a design of a hardware implementation for performing the program. More specifically, the compiler 16 may retain a detailed awareness of the target hardware used to implement the intrinsic operation. Additionally, the compiler 16 may retain which capabilities are natively available versus requiring implementation via a longer sequence of more primitive operations. For instance, the compiler 16 may utilize a built-in database of intrinsic options (e.g., built-in to the design software 14). The compiler 16 may also determine which intrinsic operations are unused, or not used frequently enough to satisfy a cost function, and corresponding hardware implementations for such intrinsic operations may not be included in the design generated by the compiler 16.

Figure 74:
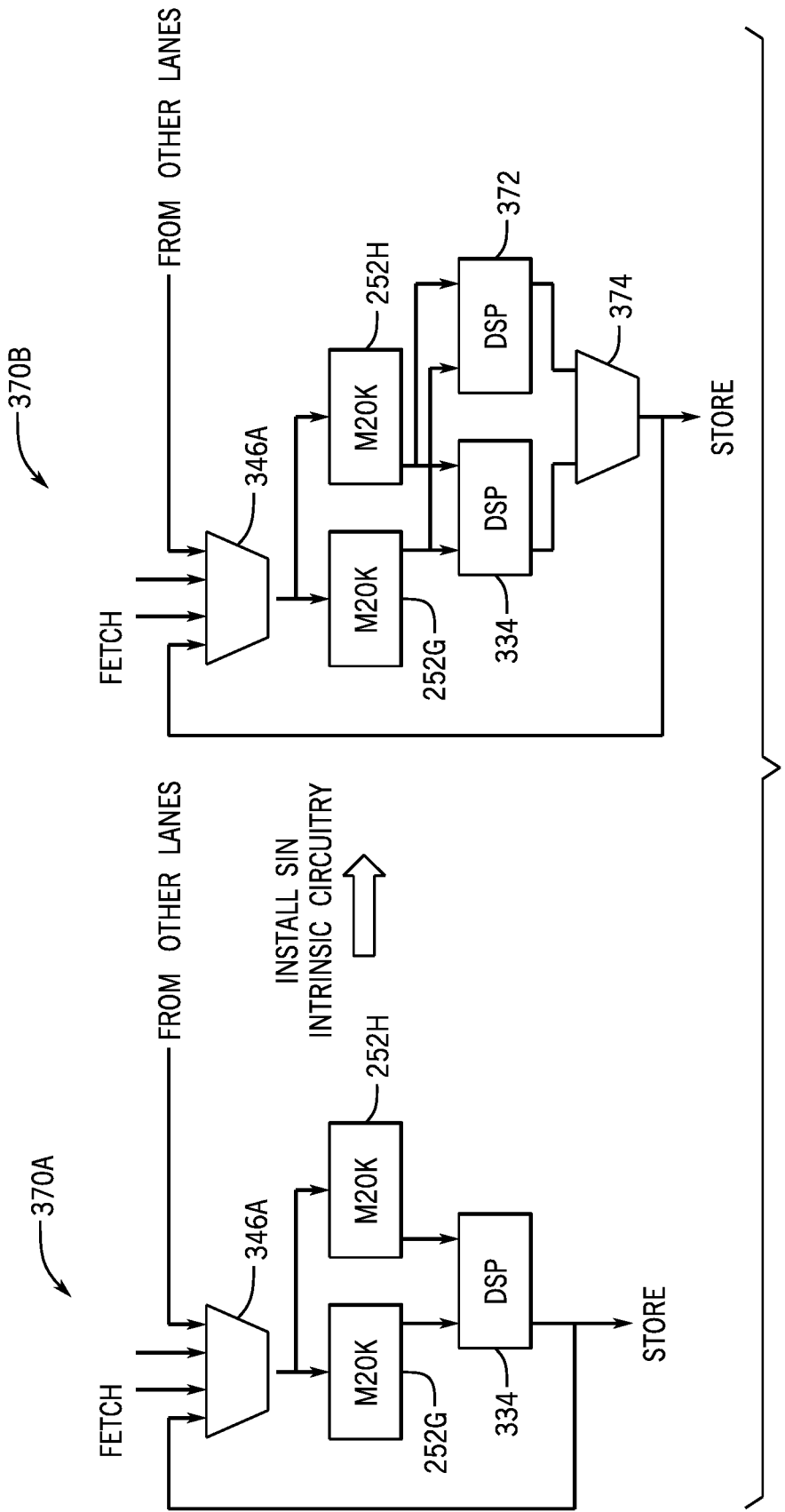
FIG. 74 is a block diagram implementations of lanes of a vector processing system, in accordance with an embodiment.

As an example, an intrinsic function may be sin(x) that operates on different numeric formats. When the compiler 16 reads the software program (e.g., source code), the compiler 16 may tabulate the calls to the sin(x) operation. If the compiler 16 determines (e.g., based on a cost function) there is a relatively small number of calls to the sin(x) operation, the compiler 16 may elect to use an equivalent multi-step software operation to provide circuitry to perform the sin(x) operation. However, if the compiler 16 determines that hardware specifically tailored to perform the sin(x) function would useful (e.g., based on the cost function), the compiler 16 may refer to the circuit implementation stored in the database and install the circuit implementation in the Verilog RTL of one or more lanes 82 of the vector processing system 26 to be implemented on the integrated circuit device 12. Accordingly, even if the source code calls for specific hardware to be utilized (e.g., to perform an intrinsic operation), the compiler 16 may determine (e.g., using costing) whether to include the hardware in the design of one or more lanes 82 or to use other circuitry (e.g., DSP blocks 334) to perform the operation. For example, as shown in FIG. 74, a first implementation 370A of a lane 82 does not include hardware specific to an intrinsic operation (e.g., sin(x)), whereas a second implementation of the lane 82 includes sine circuitry 372 that can be used to perform sin(x) intrinsic operations. The second implementation 370B also includes a multiplexer 374 that is used to select whether the output from the lane 82 will be a value generated by the DSP block 334 or a value generated by the sine circuitry 372.

Figures 75A, 75B:
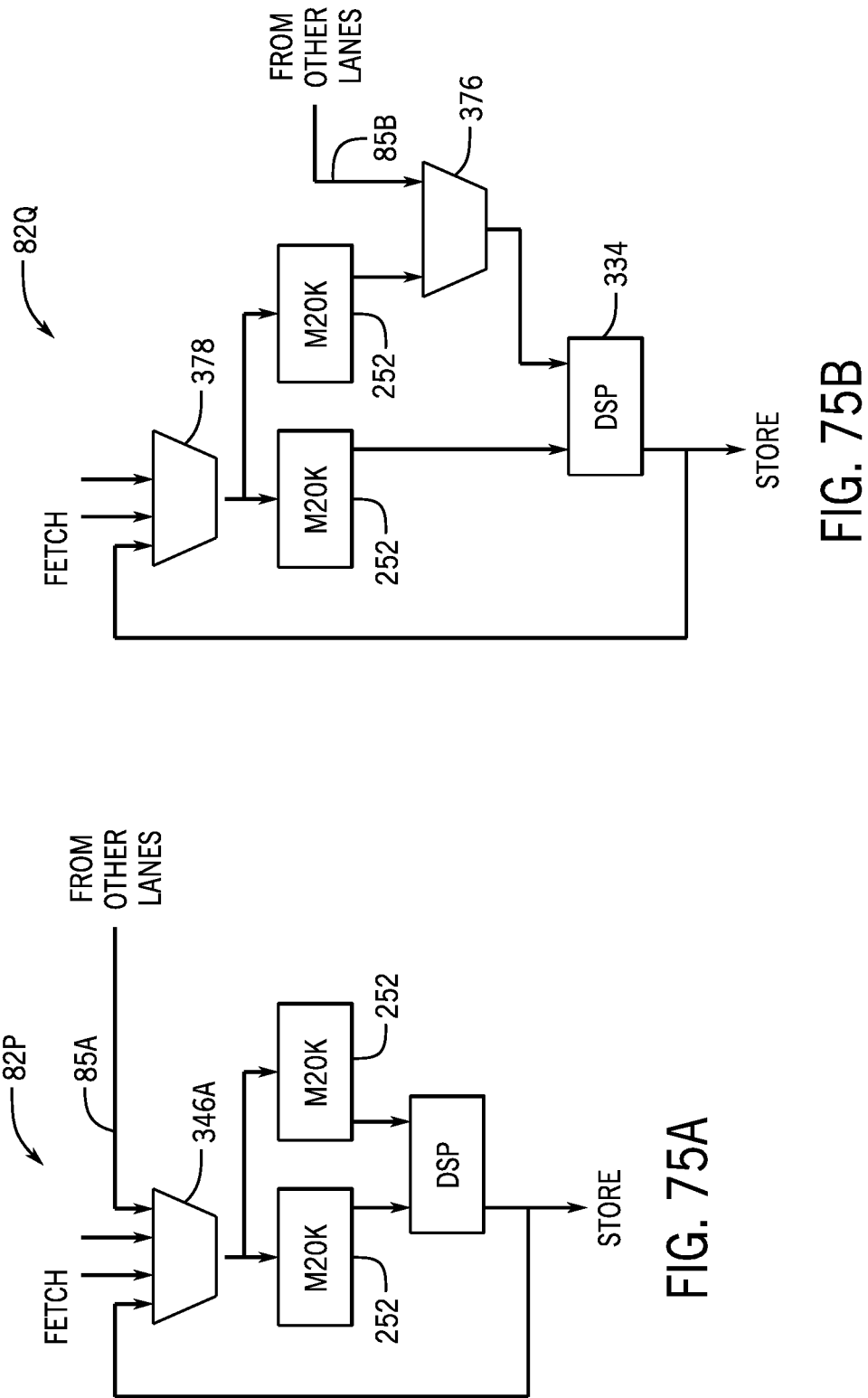
FIG. 75A is a block diagram of a lane that may be included in a vector processing unit, in accordance with an embodiment.
FIG. 75B is a block diagram of a lane that include hardware specific to an intrinsic operation, in accordance with an embodiment.

Additionally, the compiler 16 may also optimize lane data pathing. In particular, there may be multiple ways to arrange the interconnection of elements within a lane 82. For example, it may be functionally important that a lane 82 can collect a value from the neighboring lane 82, but there may be several entry points that are sufficient. For example, in FIG. 75A, an inter-lane link 85A between lane 82P and another lane is coupled to a 4:1 multiplexer 346A. Data received from another lane 82 may enter a register file maintained on one or more memory blocks 252, and the data is generally available from the memory blocks 252 for use by the DSP block 334. In FIG. 75B, lane 82Q inter-lane link 85B communicatively coupled another lane 82 to a 2:1 multiplexer 376 included in the lane 82Q, which may enable the DSP block 334 to receive data from the other lane 82 more quickly (relative to lane 82P). After the DSP block 334 receives a value from another lane 82 via the multiplexer 376, the value may be consumed in a computation, or, if desired multiplied by one and returned to a register file maintained on one of the memory blocks 252, thereby making the value generally available for future use. For example, after being multiplied by one, the value may be provided to, a 3:1 multiplexer 378, which may provide the value to the memory blocks 252.

The compiler 16 may determine which of the lanes 82P, 82Q is superior depending on the program being executed. That is, while either pattern (e.g., lane 82P and lane 82Q) is sufficient to implement many programs, lane 82P or lane 82Q will have a superior execution time for a given program. The compiler 16 may simulate the different options for arranging a dataflow between lanes 82 and select one that best meets cost functions or user-provided constraints for any circuit size versus performance tradeoff.

Keeping the foregoing in mind, the discussion will now turn to how the compiler 16 may select lane elements (e.g., multiplexers, routing circuitry, DSP blocks, memory blocks) when compiling. In many cases, lane elements may be identical to each other, thereby signifying that one lane 82 has been designed, the design for the lane may be used for other lanes 82. By performing compiling in this manner, the compiler 16 may more efficiently compile source code and generate instructions for hardware implementations of vector processing system 26.

Figure 76:
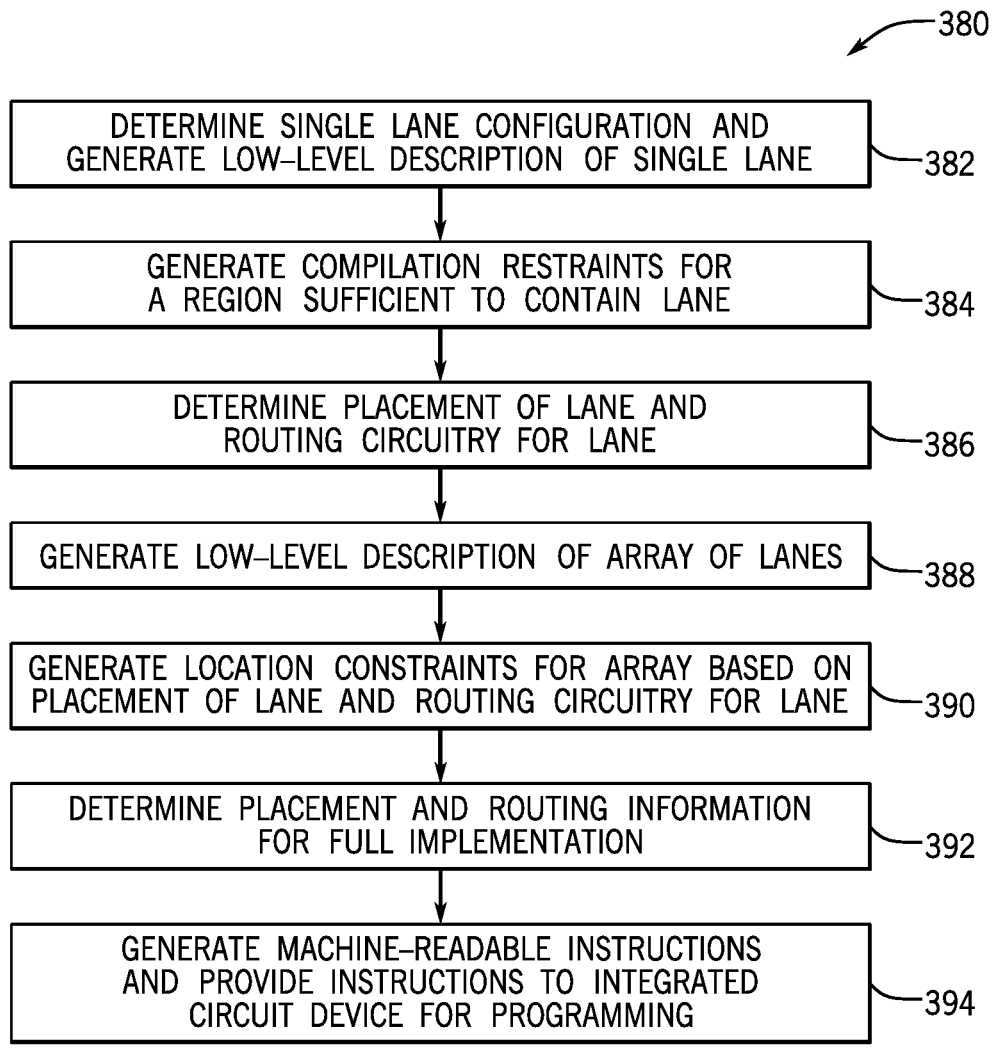
FIG. 76 76 is a flow diagram of a process for compiling source code, in accordance with an embodiment.

FIG. 76 is a flow diagram of a process 380 for compiling source code. In particular, the process 380 describes how the compiler 16 (alone or in conjunction with the design software 14) may design and place lanes when determining a design for implementing hardware onto the integrated circuit device 12 to execute a program or algorithm that the source code describes. Furthermore, it should be noted that the compiler 16 may perform the process 380 (or portions thereof) when performing the process 310 discussed above.

At process block 382, the compiler 16 determines a configuration for a single lane 82 and generates a low-level hardware description (e.g., in Verilog) of the lane 82. As discussed above, when determining a configuration for a lane 82, the compiler 16 may evaluate possible designs based on a costing program and user-indicated constraints. The compiler 16 may also determine whether to include hardware specific to an intrinsic function in the lane 82.

At process block 384, the compiler 16 generates compilation constraints for a region on the integrated circuit device 12 that is large enough to include the lane 82. If the size is not fully known, the compiler 16 utilize the design software 14 to perform an analysis of the circuitry described by the low-level hardware description. Additionally, the compiler 16 may by increase or decrease the region size based on the analysis.

At process block 386, the compiler 16 determines a placement for the lane 82 as well as routing circuitry for the lane 82. The compiler 16 may perform process block 386 utilizing the design software 14.

At process block 388, the compiler 16 generates a low-level hardware description for an array of lanes 82 (e.g., based on the hardware description generated at process block 382). The array of lanes 82 may also include a description of how the lanes 82 of the array are connected to one another.

At process block 390, the compiler 16 generates location constraints for the array of lanes 82 based on the placement and routing determined at process block 386. More specifically, the compiler 16 may reuse the detailed placement obtained for the single lane, thereby to saving the processing time associated with rederiving this information in each location.

At process block 392, the compiler 16 determines placement and routing information for a full implementation of the array of lanes. In other words, the compiler 16 may determine where each lane 82 in the array of lanes should be placed as well as the routing information for the array of lanes 82. For example, the compiler 16, which may also determine routing information for other portions of the integrated circuit device 12 (e.g., regarding placement of a network-on-chip (NoC)), may determine one or more lanes 82 should be provided more routing circuitry to provide greater access to a NoC (e.g., to enable the lane 82 to more quickly access data). The compiler 16 may perform process block 392 utilizing the design software 14.

At process block 394, the compiler 16 may generate machine-readable instructions (e.g., a bitstream) and provide the machine-readable instructions to the integrated circuit device 12 to cause the hardware implementations determined by the compiler 16 to be implemented on the integrated circuit device 12. In other words, a hardware description of the array of lanes 82 may be provided to the integrated circuit device 12 to cause the array of lanes 82 to be implemented on the integrated circuit device 12.

Support for External I/Os

Integrated circuit devices, including programmable logic devices (e.g., FPGAs) offer I/O circuitry that enables the integrated circuit devices to communicate with other devices to which the integrated circuit devices are communicatively coupled. For example, the integrated circuit device 12 may include, with rich options such as ethernet I/O circuitry, PCIe I/O circuitry, coherent link to host (CXL) I/O circuitry, transceivers, and other I/O circuitry (e.g., radio-frequency circuitry and optics circuitry). These I/Os may be integrated (e.g., as I/Os on the integrated circuit device 12, as in-package chiplets connected to integrated circuit device (e.g., via a 2.5D silicon bridge). Moreover, in the case of FPGAs, the FPGA fine-grained spatial reconfigurability is amenable to interact in a very optimal way with I/Os to optimize what to do in each cycle for each bit. Thus, the integrated circuit device 12 may provide precise bit-level and cycle-level control (e.g., in contrast to a CPU that would operate at instruction level).

Figure 77:
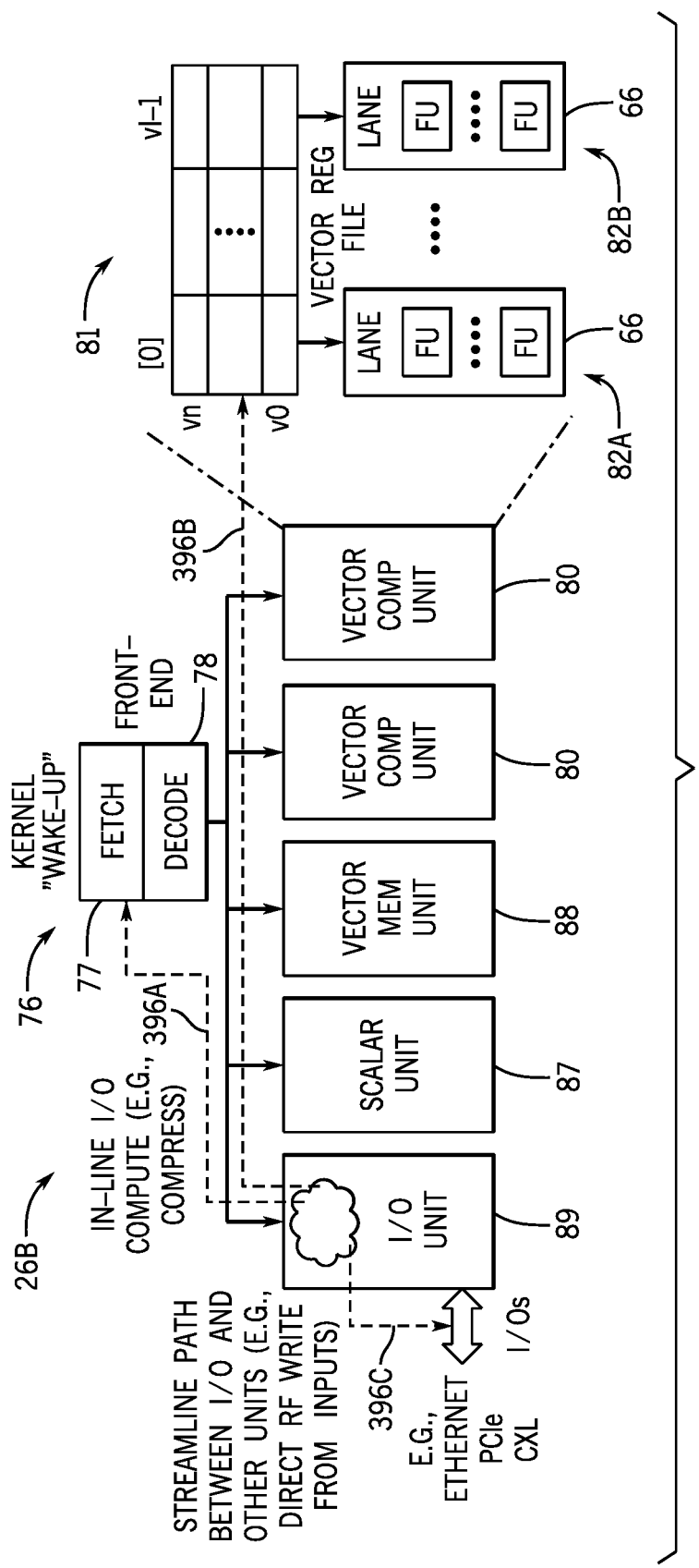
FIG. 77 is block diagram of a vector processing system, in accordance with an embodiment.

Continuing with the drawings, FIG. 77 is a block diagram of the vector processing system 26B that includes data paths 396 (e.g., data paths 396A, 396B, 396C) that may be utilized by the vector processing system 26B. In particular, the vector processor system 26B described herein offers novel supports for optimized interaction and processing of I/Os, which can enable improved I/O performance (e.g., low latency, high bandwidth utilization). For example, the ISA associated with the vector processing systems 26 may support states for I/Os, I/O registers (e.g., to store the states of I/Os), and a set of instructions that can operate on these states. These instructions enable efficient I/O interactions and operations such as, but not limited to, computing directly from I/O registers, moving between I/O registers and other architectural states (e.g., vector registers), and activating a thread based on I/O events (e.g., for threads that wait for input to begin execution). An example of an application in which such features may be beneficial is AI applications. For instance, input vectors received via ethernet input ports may wake up a program thread that performs computations on the input vectors. The input vectors may be provided to one or more vector registers files 81 (indicated by data path 396B), and one or more lanes 82 may perform computations on the input vectors (e.g., using vector processing units 66). After computation, results can be written directly to an I/O buffer to send out via ethernet indicated by data path 396C). Thus, the wake-up and direct I/O data moves reduce "bookkeeping" and data movement overhead, thereby improving latency.

Vector processing systems 26 described herein such as vector processing system 26B may use direct paths from I/Os to and from register files and functional units. For example, the I/O unit 89 may maintain an I/O register file and support for the move instructions mentioned above to move received or outputted values to and from vector register files 81 and scalar register files (which include scalar registers 62). The I/O unit may also bypass storing data in the I/O register file and directly write to vector register file 81. The architecture for the I/O unit 89 may also include data paths (e.g., data path 396A) to other units (e.g., the front-end 76 subsystem) to allow the wake-up events stated above. Furthermore, the direct write-back paths from vector compute units 80 and/or vector memory unit 88 to I/O enables the vector processing system 26 to more efficiently sending data out of the vector processing system (e.g., via ethernet).

Furthermore, the vector processing systems 26 offer support for in-line operations as I/O data moves through the vector processor systems 26. Such in-line operation may reduce latency and enable more efficient utilization of available I/O bandwidth (e.g., by reducing fragmented data through in-line packing operations). For example, to facilitate in-line operation, the ISA supports instructions for inline I/O computations such as in-line compression, encoding, decoding, casting, packing, unpacking, and shuffle or rotate operations on input and output data. The hardware of the vector processing system 26 may include compute logic in the I/O unit 89 to perform the in-line operations. Furthermore, custom in-line operations may be implemented, especially in embodiment in which the vector processing system 26 is implemented on a programmable logic device such as an FPGA. Accordingly, data may be operated on while the data is moving from one portion of the vector processing system 26 to another (e.g., to or from the I/O unit 89). One example scenario in which in-line compute may be useful is distributed AI operations across multiple nodes that relies on an all-reduce computation, which may utilize heavy amounts of communication across multiple nodes. In this case, in-line compression can be performed before sending output data and after receiving input data to reduce the amount of data that is moved.

Accordingly, the presently disclosed techniques enable vector processing to be performed on integrated circuit devices (e.g., programmable logic devices) in a manner that allows the integrated circuit devices to be trained more rapidly to perform machine-learning and AI applications. For example, by including lanes 82 with vector processing units 66 that perform computations on received data, the quantity of operations a vector processing system 26 can perform simultaneously is increased.

Figure 78:
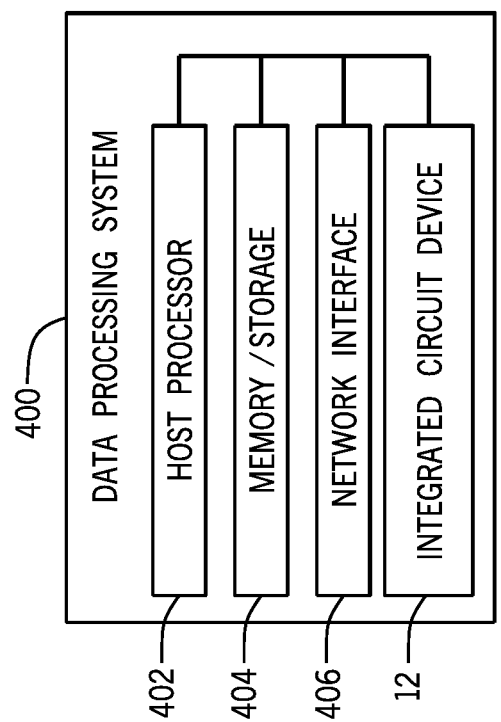
FIG. 78 is a block diagram of a data processing system that includes the integrated circuit device of FIG. 1, in accordance with an embodiment.

Keeping the foregoing in mind, the integrated circuit device 12 may be a part of a data processing system or may be a component of a data processing system that may benefit from use of the techniques discussed herein. For example, the integrated circuit device 12 may be a component of a data processing system 400, shown in FIG. 78. The data processing system 400 includes a host processor 402, memory and/or storage circuitry 404, and a network interface 406. The data processing system 400 may include more or fewer components (e.g., electronic display, user interface structures, application specific integrated circuits (ASICs)).

The host processor 402 may include any suitable processor, such as an INTEL® XEON® processor or a reduced-instruction processor (e.g., a reduced instruction set computer (RISC), an Advanced RISC Machine (ARM) processor) that may manage a data processing request for the data processing system 400 (e.g., to perform machine-learning, video processing, voice recognition, image recognition, data compression, database search ranking, bioinformatics, network security pattern identification, spatial navigation, or the like). The memory and/or storage circuitry 404 may include random access memory (RAM), read-only memory (ROM), one or more hard drives, flash memory, or the like. The memory and/or storage circuitry 404 may be considered external memory to the integrated circuit device 12 and may hold data to be processed by the data processing system 400 and/or may be internal to the integrated circuit device 12. In some cases, the memory and/or storage circuitry 404 may also store configuration programs (e.g., bitstream) for programming a programmable fabric of the integrated circuit device 12. The network interface 406 may permit the data processing system 400 to communicate with other electronic devices. The data processing system 400 may include several different packages or may be contained within a single package on a single package substrate.

In one example, the data processing system 400 may be part of a data center that processes a variety of different requests. For instance, the data processing system 400 may receive a data processing request via the network interface 406 to perform machine-learning, video processing, voice recognition, image recognition, data compression, database search ranking, bioinformatics, network security pattern identification, spatial navigation, or some other specialized task. The host processor 402 may cause a programmable logic fabric of the integrated circuit device 12 to be programmed with a particular accelerator related to requested task. For instance, the host processor 402 may instruct that configuration data (bitstream) be stored on the memory and/or storage circuitry 404 or cached in sector-aligned memory of the integrated circuit device 12 to be programmed into the programmable logic fabric of the integrated circuit device 12. The configuration data (bitstream) may represent a circuit design for a particular accelerator function relevant to the requested task.

The processes and devices of this disclosure may be incorporated into any suitable circuit. For example, the processes and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Furthermore, it should be noted that the term "crossbar" as used above (e.g., when discussing crossbar switches 64A, 64B, crossbar switches 74A, 74B, crossbar switch 190) may refer to routing circuitry other than a crossbar that has full connectivity between each source and each output destination. For example, as used herein, a "crossbar" may be a switching network or utilize different topologies than a "fully-connected crossbar," such as a depopulated crossbar, a Clos network, or an "incomplete" crossbar (e.g., a crossbar switch that is not configured to connect each possible input (e.g., each vector register) to each possible output (e.g., a lane 82)).

Additionally, data formats described herein are provided by way of example when discussing specific features of the present application. The vector processing system 26 may utilize data formats other than those described above, such as, but not limited to, half-precision floating-point numbers and double-precision floating-point numbers.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

Furthermore, the vector processing systems 26 described herein may be implemented on a variety of electronic circuitry, such as, but not limited to, integrated circuit devices, programmable logic devices, and graphics processing units (GPUs) which may employ a variety of execution models such as, but not limited to single instruction, multiple threads (SIMT) and single instruction, multiple data (SIMD).

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments of the Disclosure

The following numbered clauses define certain example embodiments of the present disclosure.

Clause 1.
  An integrated circuit device comprising:
    a plurality of vector registers configurable to store a plurality of vectors;
    switch circuitry communicatively coupled to the plurality of vector registers, wherein the switch circuitry is configurable to route a portion of the plurality of vectors; and
    a plurality of vector processing units communicatively coupled to the switch circuitry and configurable to:
      receive the portion of the plurality of vectors;
      perform one or more operations involving the portion of the plurality of vector inputs; and
      output a second plurality of vectors generated by performing the one or more operations.

Clause 2.
  The integrated circuit device of clause 1, wherein the switch circuitry comprises a crossbar switch.

Clause 3.
  The integrated circuit device of clause 1, wherein the one or more operations comprise a multiplication operation, an addition operation, or a subtraction operation.

Clause 4.
  The integrated circuit device of clause 1, wherein the integrated circuit device comprises a programmable logic device.

Clause 5.
  The integrated circuit device of clause 4, wherein the plurality of vector processing units is implemented in hard logic of the programmable logic device.

Clause 6.
  The integrated circuit device of clause 4, wherein the programmable logic device comprises a field-programmable gate array (FPGA).

Clause 7.
  The integrated circuit device of clause 1, further comprising a digital signal processing (DSP) block, wherein a vector processing unit of the plurality of vector processing units is implemented using the DSP block.

Clause 8.
  The integrated circuit device of clause 1, wherein a first vector processing unit of the plurality of vector processing units comprises:
    a register configurable to store a first value;
    a multiplexer configurable to selectively output the first value from the register or a second value received by the first vector processing unit; and
    a multiplier configurable to:
      receive the first value or the second value from the multiplexer;
      receive a third value; and
      multiply the value received from the multiplexer and the third value to generate a first product.

Clause 9.
  The integrated circuit device of clause 8, wherein the first vector processing unit comprises second switch circuitry configurable to:
    receive the first value, second value, and third value;
    route the first value to the register;
    route the second value to the multiplexer; and
    route the third value to the multiplier.

Clause 10.
  The integrated circuit device of clause 8, wherein the first vector processing unit comprises an adder configurable to:
    receive the first product and a fourth value received by the first vector processing unit; and
    add the first product and fourth value to produce a first sum.

Clause 11.
  The integrated circuit device of clause 8, wherein the first vector processing unit comprises:
    a second register configurable to store the first product; and
    an adder configurable to:
      receive the first product from the second register;
      receive a second product from the multiplier;
      add the first product and second product to generate a first sum; and
      provide the first sum to the second register for storage.

Clause 12.
  A vector processing system comprising:
    a plurality of vector registers configurable to store a plurality of vectors;
    switch circuitry communicatively coupled to the plurality of registers, wherein the switch circuitry is configurable to route a portion of the plurality of vectors; and
    a plurality of vector processing units communicatively coupled to the switch circuitry and configurable to:
      receive the portion of the plurality of vectors;
      perform one or more operations involving the portion of the plurality of vector inputs; and
      output a second plurality of vectors generated by performing the one or more operations.

Clause 13.
  The vector processing system of clause 12, wherein the vector processing system is implemented completely within a single integrated circuit device.

Clause 14.
  The vector processing system of clause 13, wherein the integrated circuit device comprises a programmable logic device.

Clause 15.
  The vector processing system of clause 14, wherein the programmable logic device comprises a field programmable gate array (FPGA).

Clause 16.
  The vector processing system of clause 12, wherein the vector processing system is implemented using two integrated circuit devices that are disposed on a single substrate.

Clause 17.
  The vector processing system of clause 16, wherein the two integrated circuit devices comprise a processor and a programmable logic device.

Clause 18.
  The vector processing system of clause 17, wherein the programmable logic device comprises a field programmable gate array (FPGA).

Clause 19.
   The vector processing system of clause 12, wherein:
      the plurality of vector processing units comprises a first vector processing unit that includes first interconnect circuitry; and
      the plurality of vector processing units comprises a second vector processing unit that includes second interconnect circuitry.

Clause 20.
   The vector processing system of clause 19, wherein the first vector processing unit and second vector processing unit are communicatively coupled to one another via the first interconnect circuitry and the second interconnect circuitry.

Clause 21.
   The vector processing system of clause 20, wherein the second vector processing unit is configurable to:
      receive an output from the first vector processing unit; and
      perform an operation involving the output and a value from the portion of the plurality of vectors.

Clause 22.
   The vector processing system of clause 21, wherein the operation comprises addition or multiplication.

Clause 23.
   The vector processing system of clause 12, comprising one or more scalar processing units configurable to perform one or more operations that include a scalar or a portion of the scalar as an input.

Clause 24.
   The vector processing system of clause 23, comprising one or more scalar registers communicatively coupled to the one or more scalar processing units and configurable to store the scalar.

Clause 25.
   The vector processing system of clause 24, wherein:
      the one or more scalar processing units are implemented on a first integrated circuit device; and
      the plurality of vector processing units is implemented on a second integrated circuit device.

Clause 26.
   The vector processing system of clause 25, wherein the first integrated circuit device is a different type of integrated circuit device than the second integrated circuit device.

Clause 27.
   The vector processing system of clause 26, wherein the first integrated circuit device comprises a processor, and the second integrated circuit device comprises a programmable logic device.

Clause 28.
   The vector processing system of clause 27, wherein the plurality of vector processing units is implemented using one or more digital signal processing (DSP) blocks of the programmable logic device.

Clause 29.
   The vector processing system of clause 24, wherein the one or more scalar processing units and the plurality of vector processing units are implemented on a single integrated circuit device.

Clause 30.
   The vector processing system of clause 12, comprising second switch circuitry configurable to:
      receive one or more outputs from the plurality of vector processing units; and
      route each of the one or more outputs to a corresponding vector register of the plurality of vector registers.

Clause 31.
   The vector processing system of clause 12, wherein the plurality of vector registers is configurable to store multiple instances of the plurality of vectors.

Clause 32.
   A programmable logic device, comprising:
      a plurality of vector registers configurable to store a plurality of vectors;
      a switch circuitry communicatively coupled to the plurality of registers, wherein the switch circuitry is configurable to route a portion of the plurality of vectors; and
      a plurality of vector processing units implemented on one or more digital signal processing (DSP) blocks of the programmable logic device, wherein the plurality of vector processing units is communicatively coupled to the switch circuitry and configurable to:
         receive the portion of the plurality of vectors;
         perform one or more operations involving the portion of the plurality of vector inputs; and
         output a second plurality of vectors generated by performing the one or more operations.

Clause 33.
   The programmable logic device of clause 32, comprising one or more memory banks that store the plurality of vectors.

Clause 34.
   The programmable logic device of clause 33, comprising control circuitry configurable to:
      receive an instruction to perform an operation involving the portion of the plurality of vectors;
      cause the portion of the plurality of vectors to be routed from the plurality of vector registers to a first vector processing unit of the plurality of vector processing units; and
      cause an output from the first vector processing unit to be written to the plurality of vector registers.

Clause 35.
   The programmable logic device of clause 34, wherein the operation comprises a vector-vector multiplication operation.

Clause 36.
   The programmable logic device of clause 34, wherein the operation comprises a vector addition operation.

Clause 37.
   The programmable logic device of clause 34, wherein the operation is a conditional operation.

Clause 38.
   The programmable logic device of clause 37, wherein the conditional operation comprises a greater than, less than, or equal to condition.

Clause 39.
   The programmable logic device of clause 34, comprising a plurality of flag registers, wherein the programmable logic device is configurable to determine whether a condition of the conditional operation is present and, in response to determining the condition is present, generate a flag in the plurality of flag registers.

Clause 40.
   The programmable logic device of clause 39, wherein the programmable logic device is configurable to perform the operation, determine whether a flag corresponding to the operation is present in the plurality of flag registers, and refrain from writing a result of the operation to be written to the plurality of vector registers when the flag corresponding to the operation is present.

Clause 41.
The programmable logic device of clause 39, wherein the programmable logic device is configurable to determine whether the flag is present prior to performing the operation.

Clause 42.
The programmable logic device of clause 33, wherein:
the plurality of vector processing units comprises a first vector processing unit and a second vector processing unit;
the programmable logic device is configurable to perform a first operation using the first vector processing unit; and
the programmable logic device is configurable to perform a second operation using the second vector processing unit.

Clause 43.
The programmable logic device of clause 42, wherein the second operation is dependent upon the first operation.

Clause 44.
The programmable logic device of clause 43, wherein the second operation includes a vector determined by executing the first operation.

Clause 45.
The programmable logic device of clause 44, wherein the second vector processing unit is configurable to begin performing the second operation prior to the first vector processing unit finishing the first operation.

Clause 46.
The programmable logic device of clause 45, wherein the second vector processing unit is configurable to begin performing the second operation prior to the first vector processing unit finish the first operation using chaining.

Clause 47.
The programmable logic device of clause 33, wherein the programmable logic device comprises hazard detection circuitry configurable to determine whether a hazard condition is present.

Clause 48.
The programmable logic device of clause 47, wherein the hazard detection circuitry is configurable to detect read-after-write hazards, write-after-read hazards, and write-after-write hazards.

Clause 49.
The programmable logic device of clause 48, wherein the hazard detection circuitry is configurable to resolve a hazard using chaining.

Clause 50.
The programmable logic device of clause 48, wherein the hazard detection circuitry is configurable to resolve a hazard using tailgating.

Clause 51.
The programmable logic device of clause 32, comprising one or more tensor units configurable to perform matrix-matrix multiplication, matrix-vector multiplication, or both.

Clause 52.
The programmable logic device of clause 51, wherein the one or more tensor units comprise tensor blocks, wherein each tensor block is configurable to store a first value and perform successive multiplication operations involving the first value and plurality of other values.

Clause 53.
The programmable logic device of clause 51, wherein the one or more tensor units comprises:
a first tensor unit configurable to perform a first portion of a plurality of operations associated with an instruction; and
a second tensor unit configurable to perform a second portion of the plurality of operations.

Clause 54.
The programmable logic device of clause 53, wherein the one or more tensor units comprises:
a third tensor unit configurable to perform a first portion of a second plurality of operations associated with a second instruction; and
a fourth tensor unit configurable to perform a second portion of the second plurality of operations.

Clause 55.
The programmable logic device of clause 53, wherein the one or more tensor units comprises:
a third tensor unit configurable to perform a third portion of the plurality of operations; and
a fourth tensor unit configurable to perform a fourth portion of the plurality of operations.

Clause 56.
A compiler configurable to:
receive source code for a program to be performed by a programmable logic device;
compile the source code, wherein compiling the source code comprises determining a design for a vector processing system to be implemented on the programmable logic device; and
providing a bitstream for the design of the vector processing system to the programmable logic device to cause the vector processing system to be implemented on the programmable logic device.

Clause 57.
The compiler of clause 56, wherein determining the design for the vector processing system comprises determining placement of a plurality of lanes of the vector processing system on the programmable logic device.

Clause 58.
The compiler of clause 57, wherein each lane of the plurality of lanes comprises routing circuitry, one or more memory blocks, and at least one digital signal processing (DSP) block.

Clause 59.
The compiler of clause 58, wherein:
after the bitstream is provided to the programmable logic device, the one or more memory blocks are configurable to store a plurality of vectors comprising vectors of one or more numerical formats; and
the compiler is configurable to determine the one or more numerical formats.

Clause 60.
The compiler of clause 59, wherein the compiler is configurable to determine the one or more numerical formats based on a user input indicating a portion of the one or more numerical formats, at least one numerical format that should not be included in the one or more numerical formats, or both.

Clause 61.
The compiler of clause 57, wherein the compiler is configurable to determine routing for one or more inter-lane links that communicatively couple a first lane of the plurality of lanes to at least one other lane of the plurality of lanes.

Clause 62.
The compiler of clause 61, wherein the compiler is configurable to determine whether to include circuitry for an intrinsic operation in the first lane.

Clause 63.
A vector processing system implemented at least partially on an integrated circuit device, wherein the vector processing system comprises:

a plurality of lanes, wherein each lane of the plurality of lanes comprises:
one or more memory blocks configurable to store a plurality of vectors;
at least one digital signal processing (DSP) block communicatively coupled to the one or more memory blocks, wherein the at least one DSP block is configurable to receive at least one of the plurality of vectors and perform a computation using the at least one of the plurality of vectors; and
first routing circuitry configurable to receive additional vectors and selectively provide a portion of the additional vectors to the one or more memory blocks for storage.

Clause 64.
The vector processing system of clause 63, wherein the integrated circuit device comprises a programmable logic device.

Clause 65.
The vector processing system of clause 64, wherein the programmable logic device comprises a field-programmable gate array (FPGA).

Clause 66.
The vector processing system of clause 63, wherein the plurality of lanes comprises a first lane and a second lane, wherein the second lane is configurable to receive a first output of the first lane.

Clause 67.
The vector processing system of clause 66, wherein a DSP block of the second lane is configurable to perform a second computation using the first output and a vector retrieved from a memory block of the second lane.

Clause 68.
The vector processing system of clause 67, wherein the computation comprises vector-vector multiplication or vector-vector addition.

Clause 69.
The vector processing system of clause 67, wherein the DSP block is configurable to perform the third computation based on an instruction, wherein the instruction indicates an operation to be performed and two vectors.

Clause 70.
The vector processing system of clause 63, comprising storage external to the plurality of lanes, wherein the second lane is configurable to retrieve at least one of the two vectors from the storage prior to performing the third computation.

Clause 71.
The vector processing system of clause 63, The vector processing system of clause 63, comprising a scalar unit configurable to perform scalar-vector multiplication.

Clause 72.
The vector processing system of clause 71, The vector processing system of clause 69, wherein the scalar unit is at least partially implemented on a second integrated circuit device communicatively coupled to the integrated circuit device.

Clause 73.
The vector processing system of clause 72, wherein the integrated circuit device is a field-programmable gate array, and the second integrated circuit device is a processor.

Clause 74.
The vector processing system of clause 63, wherein the plurality of vectors comprises vectors of a plurality of numerical formats.

Clause 75.
The vector processing system of clause 63, wherein the plurality of numerical formats comprises single-precision floating-point (FP32), bfloat16, int8, or a combination thereof.

Clause 76.
A programmable logic device, comprising:
one or more memory blocks configurable to store a plurality of vectors;
routing circuitry communicatively coupled to the one or more memory blocks, wherein the routing circuitry is configurable to route a portion of the plurality of vectors to be used to execute a first instruction; and
a vector compute unit communicatively coupled to the routing circuitry, wherein the vector compute unit comprises one or more vector processing units configurable to execute the instruction by:
receiving the portion of the plurality of vectors;
performing one or more operations involving the portion of the plurality of vectors; and
outputting a one or more vectors generated by performing the one or more operations.

Clause 77.
The programmable logic device of clause 76, comprising a second vector compute unit that includes one or more tensor units configurable to perform matrix-matrix multiplication, matrix-vector multiplication, or both.

Clause 78.
The programmable logic device of clause 76, comprising one or more scalar processing units configurable to perform a scalar operation that includes a scalar or a portion of the scalar as an input.

Clause 79.
The programmable logic device of clause 78, wherein:
the scalar operation comprises scalar-vector multiplication; and
the one or more memory blocks comprise one or more scalar registers configurable to store the scalar.

Clause 80.
An integrated circuit device comprising:
a plurality of vector registers configurable to store a plurality of vectors; and
a plurality of vector processing units configurable to:
receive a portion of the plurality of vectors;
perform one or more operations involving the portion of the plurality of vector inputs; and
output a second plurality of vectors generated by performing the one or more operations.

Clause 81.
The integrated circuit device of clause 80, comprising a plurality of digital signal processing (DSP) blocks, wherein the plurality of DSP blocks comprises at least a portion of the plurality of vector registers.

Clause 82.
The integrated circuit device of clause 81, comprising switch circuitry communicatively coupled to the plurality of vector registers, wherein the switch circuitry is configurable to flexibly couple a portion of the plurality of vectors registers and a portion of the plurality of vector processing units.

Clause 83.
The integrated circuit device of clause 82, wherein the plurality of vectors registers is configurable to store one or more matrices.

Clause 84.
The integrated circuit device of clause 83, wherein the switch circuitry comprises a crossbar switch, and the one or more operations comprise a multiplication operation, an addition operation, or a subtraction operation.

What is claimed is:

1. An integrated circuit device comprising:
a plurality of vector registers configurable to store a plurality of vectors;
first switch circuitry communicatively coupled to the plurality of vector registers, wherein the first switch circuitry is configurable to receive the plurality of vectors directly from the plurality of vector registers and route a portion of the plurality of vectors to a plurality of vector processing units, wherein the plurality of vector processing units respectively comprise second switch circuitry configurable to route data within the plurality of vector processing units and are communicatively coupled to the first switch circuitry and configurable to:
receive the portion of the plurality of vectors directly from the first switch circuitry;
perform one or more operations involving the portion of the plurality of vectors; and
output a second plurality of vectors generated by performing the one or more operations; and
third switch circuitry communicatively coupled to the plurality of vector processing units and the plurality of vector registers, wherein the third switch circuitry is configurable to:
receive the second plurality of vectors directly from the plurality of vector processing units; and
route the second plurality of vectors to the plurality of vector registers.

2. The integrated circuit device of claim 1, wherein:
the first switch circuitry comprises a first crossbar switch; and
the third switch circuitry comprises a second crossbar switch.

3. The integrated circuit device of claim 1, wherein the one or more operations comprise a multiplication operation, an addition operation, or a subtraction operation.

4. The integrated circuit device of claim 1, wherein the integrated circuit device comprises a programmable logic device, and wherein the plurality of vector processing units is implemented in hard logic of the programmable logic device.

5. The integrated circuit device of claim 1, further comprising a digital signal processing (DSP) block, wherein a vector processing unit of the plurality of vector processing units is implemented using the DSP block.

6. The integrated circuit device of claim 1, wherein a first vector processing unit of the plurality of vector processing units comprises:
a register configurable to store a first value;
a multiplexer configurable to:
receive the first value from the register and a second value received by the first vector processing unit; and
selectively output the first value or the second value; and
a multiplier configurable to:
receive the first value or the second value from the multiplexer;
receive a third value; and
multiply the value received from the multiplexer and the third value to generate a first product.

7. The integrated circuit device of claim 6, wherein the first vector processing unit comprises fourth switch circuitry configurable to:
receive the first value, the second value, and third value;
route the first value to the register;
route the second value to the multiplexer; and
route the third value to the multiplier.

8. The integrated circuit device of claim 6, wherein the first vector processing unit comprises an adder configurable to:
receive the first product and a fourth value received by the first vector processing unit; and
add the first product and fourth value to produce a first sum.

9. The integrated circuit device of claim 6, wherein the first vector processing unit comprises:
a second register configurable to store the first product; and
an adder configurable to:
receive the first product from the second register;
receive a second product from the multiplier;
add the first product and second product to generate a first sum; and
provide the first sum to the second register for storage.

10. The integrated circuit device of claim 1, wherein the second switch circuitry is configurable to truncate and aggregate fixed-point data, floating point data, or both.

11. The integrated circuit device of claim 10, wherein the second switch circuitry is configurable to truncate a 32-bit floating point value to a 16-bit floating point value.

12. A vector processing system comprising:
a plurality of vector registers configurable to store a plurality of vectors;
first switch circuitry communicatively coupled to the plurality of vector registers, wherein the first switch circuitry is configurable to receive the plurality of vectors directly from the plurality of vector registers and route a portion of the plurality of vectors to a plurality of vector processing units, wherein the plurality of vector processing units respectively comprise second switch circuitry configurable to route data within the plurality of vector processing units and are communicatively coupled to the first switch circuitry and configurable to:
receive the portion of the plurality of vectors directly from the first switch circuitry;
perform one or more operations involving the portion of the plurality of vectors; and
output a second plurality of vectors generated by performing the one or more operations; and
third switch circuitry communicatively coupled to the plurality of vector processing units and the plurality of vector registers, wherein the third switch circuitry is configurable to:
receive the second plurality of vectors directly from the plurality of vector processing units; and
route the second plurality of vectors to the plurality of vector registers.

13. The vector processing system of claim 12, wherein the vector processing system is implemented completely within a single field-programmable gate array (FPGA).

14. The vector processing system of claim 12, wherein the vector processing system is implemented using two integrated circuit devices that are disposed on a single substrate.

15. The vector processing system of claim 14, wherein the two integrated circuit devices comprise a processor and a programmable logic device.

16. The vector processing system of claim 12, wherein:
the plurality of vector processing units comprises a first vector processing unit that includes first interconnect circuitry;

the plurality of vector processing units comprises a second vector processing unit that includes second interconnect circuitry;

the first vector processing unit and second vector processing unit are communicatively coupled to one another via the first interconnect circuitry and the second interconnect circuitry; and the second vector processing unit is configurable to:
receive an output from the first vector processing unit; and perform an operation involving the output and a value from the portion of the plurality of vectors.

17. A programmable logic device, comprising:

one or more memory blocks configurable to store a plurality of vectors;

first routing circuitry communicatively coupled to the one or more memory blocks, wherein the first routing circuitry is configurable to receive the plurality of vectors directly from the one or more memory blocks and route a portion of the plurality of vectors to a vector compute unit to be used to execute an instruction, wherein the vector compute unit is communicatively coupled to the first routing circuitry, and wherein the vector compute unit comprises one or more vector processing units, wherein the one or more vector processing units respectively comprise second routing circuitry to route data within the one or more vector processing units configurable to execute the instruction by:

receiving the portion of the plurality of vectors directly from the first routing circuitry;

perform one or more operations involving the portion of the plurality of vectors; and output one or more vectors generated by performing the one or more operations; and third routing circuitry communicatively coupled to the one or more vector processing units and the one or more memory blocks, wherein the third routing circuitry is configurable to:

receive the one or more vectors directly from the one or more vector processing units; and route the one or more vectors to the one or more memory blocks.

18. The programmable logic device of claim 17, comprising a second vector compute unit that includes one or more tensor units configurable to perform matrix-matrix multiplication, matrix-vector multiplication, or both.

19. The programmable logic device of claim 17, comprising one or more scalar processing units configurable to perform a scalar operation that includes a scalar or a portion of the scalar as an input.

20. The programmable logic device of claim 19, wherein:

the scalar operation comprises scalar-vector multiplication; and the one or more memory blocks comprise one or more scalar registers configurable to store the scalar.

* * * * *